(12) United States Patent
Masuoka et al.

(10) Patent No.: US 10,930,761 B2
(45) Date of Patent: Feb. 23, 2021

(54) PILLAR-SHAPED SEMICONDUCTOR DEVICE AND METHOD FOR PRODUCING THE SAME

(71) Applicant: Unisantis Electronics Singapore Pte. Ltd., Singapore (SG)

(72) Inventors: Fujio Masuoka, Tokyo (JP); Nozomu Harada, Tokyo (JP)

(73) Assignee: UNISANTIS ELECTRONICS SINGAPORE PTE. LTD., Singapore (SG)

( * ) Notice: Subject to any disclaimer, the term of this patent is extended or adjusted under 35 U.S.C. 154(b) by 0 days.

(21) Appl. No.: 16/277,670

(22) Filed: Feb. 15, 2019

(65) Prior Publication Data

US 2019/0181244 A1   Jun. 13, 2019

Related U.S. Application Data

(63) Continuation of application No. PCT/JP2016/074084, filed on Aug. 18, 2016.

(51) Int. Cl.
  *H01L 29/66* (2006.01)
  *H01L 29/78* (2006.01)
  (Continued)

(52) U.S. Cl.
  CPC .. *H01L 29/66666* (2013.01); *H01L 21/28123* (2013.01); *H01L 21/3083* (2013.01);
  (Continued)

(58) Field of Classification Search
  CPC ....... H01L 21/308–3088; H01L 21/027–0338; H01L 21/31662; H01L 21/31675;
  (Continued)

(56) References Cited

U.S. PATENT DOCUMENTS 8,748,938 B2   6/2014   Masuoka et al.

FOREIGN PATENT DOCUMENTS

JP   H02-188966 A   7/1990
JP   2010-258345 A   11/2010
JP       5938529 B1   6/2016

OTHER PUBLICATIONS

Takato et al., "Impact of Surrounding Gate Transistor (SGT) for Ultra-High-Density LSI's", IEEE Transactions on Electron Devices, vol. 38, No. 3, dated Mar. 3, 1991, pp. 573-578 (1991).

(Continued)

*Primary Examiner* — Scott B Geyer
(74) *Attorney, Agent, or Firm* — Brinks Gilson & Lione

(57) ABSTRACT

A Si substrate is etched through a first mask material layer formed on the Si substrate and serving as a mask, to form a Si pillar on a Si substrate. Subsequently, a second mask material layer formed so as to surround the side surface of the Si pillar is used as a mask to form a Si-pillar base part surrounding the Si pillar. Subsequently, the first and second mask material layers are used as masks to form a $SiO_2$ layer so as to occupy the whole section of the Si-pillar base part and connect to the Si substrate positioned in a region around the Si-pillar base part. Recessed portions are formed in the upper and lower regions of the $SiO_2$ layer. Subsequently, on the $SiO_2$ layer, an SGT is formed so as to include a gate insulating $HfO_2$ layer surrounding the Si pillar, a gate conductor TiN layer, $N^+$ layers serving as the source or drain within the Si pillar, and a Si pillar serving as the channel between the $N^+$ layers.

21 Claims, 40 Drawing Sheets

(51) Int. Cl.
| | |
|---|---|
| H01L 29/423 | (2006.01) |
| H01L 29/786 | (2006.01) |
| H01L 21/28 | (2006.01) |
| H01L 21/308 | (2006.01) |
| H01L 21/84 | (2006.01) |
| H01L 27/12 | (2006.01) |
| H01L 29/06 | (2006.01) |
| H01L 21/02 | (2006.01) |
| H01L 21/225 | (2006.01) |
| H01L 21/285 | (2006.01) |
| H01L 21/3065 | (2006.01) |
| H01L 21/762 | (2006.01) |

(52) U.S. Cl.
CPC .......... *H01L 21/84* (2013.01); *H01L 27/1203* (2013.01); *H01L 29/0653* (2013.01); *H01L 29/42392* (2013.01); *H01L 29/78* (2013.01); *H01L 29/7827* (2013.01); *H01L 29/78642* (2013.01); *H01L 21/02164* (2013.01); *H01L 21/02238* (2013.01); *H01L 21/2257* (2013.01); *H01L 21/28088* (2013.01); *H01L 21/28518* (2013.01); *H01L 21/3065* (2013.01); *H01L 21/3081* (2013.01); *H01L 21/3086* (2013.01); *H01L 21/7624* (2013.01); *H01L 29/42376* (2013.01)

(58) Field of Classification Search
CPC . H01L 29/7802–7815; H01L 29/66666; H01L 29/7827–7828; H01L 29/0642–0653; H01L 29/42392
See application file for complete search history.

(56) References Cited

OTHER PUBLICATIONS

Shibata et al., "A New Field Isolation Technology for High Density MOS LSI", Proceedings of the 10th Conference on Solid State Devices, Tokyo, 1978; Japanese Journal of Applied Physics, vol. 18, (1979) Supplement 18-1, pp. 263-267.
International Search Report and Written Opinion for Application No. PCT/JP2016/074084 dated Nov. 15, 2016, 10 pages.
International Preliminary Report on Patentability for Application No. PCT/JP2016/074084 dated Mar. 21, 2017, 16 pages.
English Translation of International Preliminary Report on Patentability for International Application No. PCT/JP2016/074084, dated Feb. 21, 2019, 6 pages.

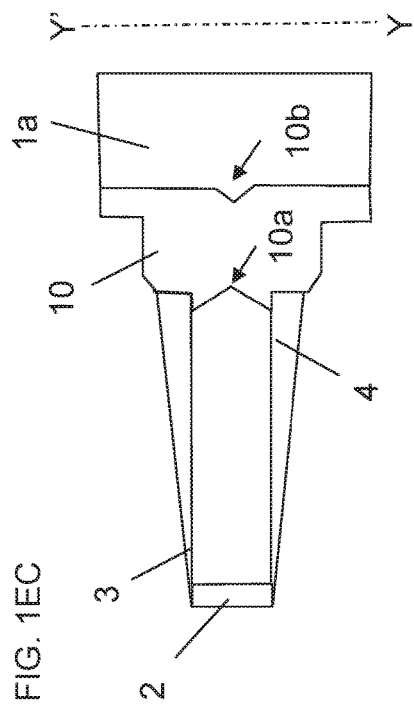
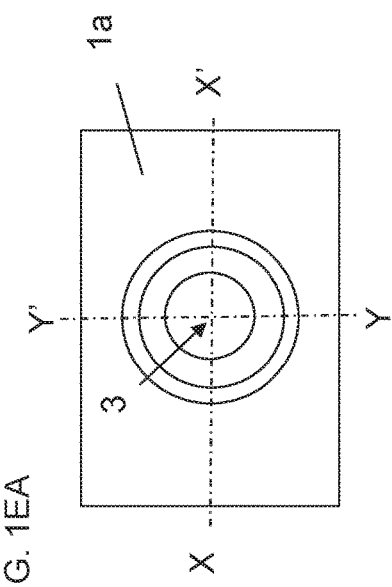
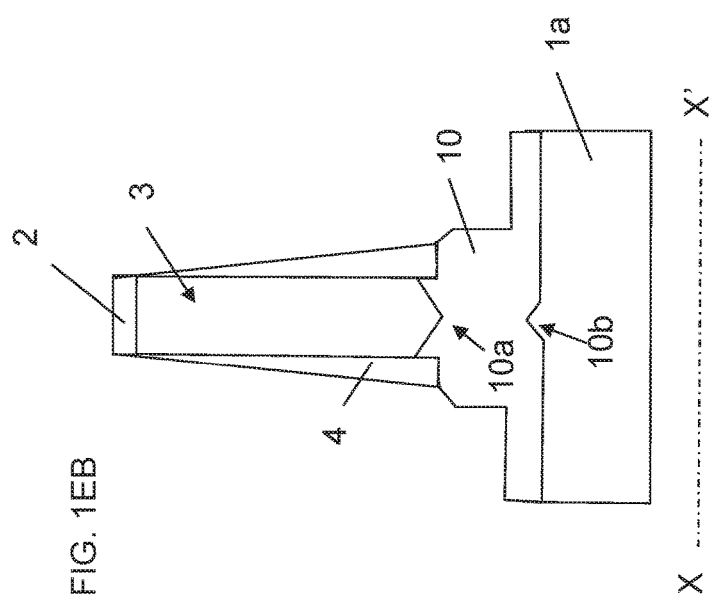

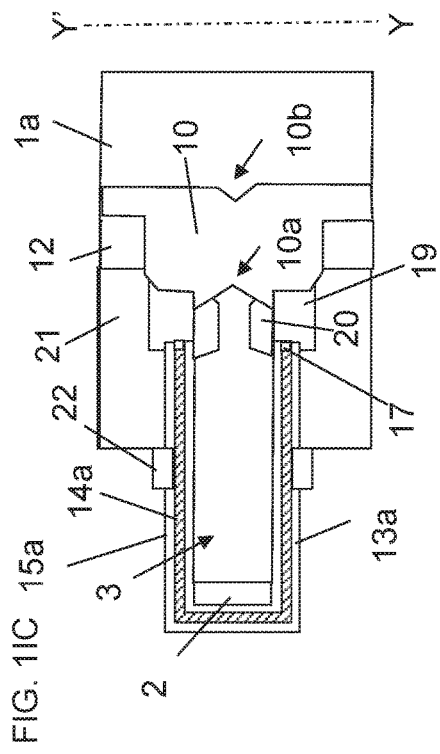
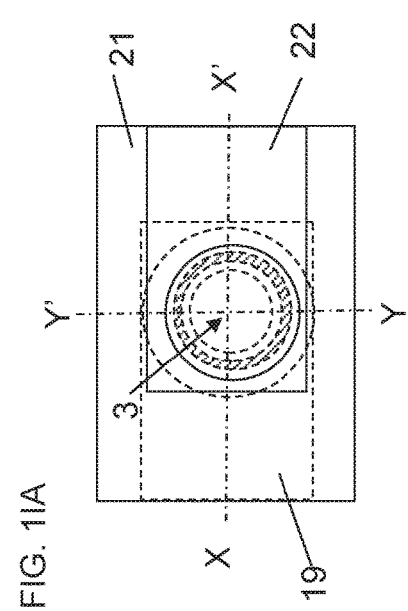
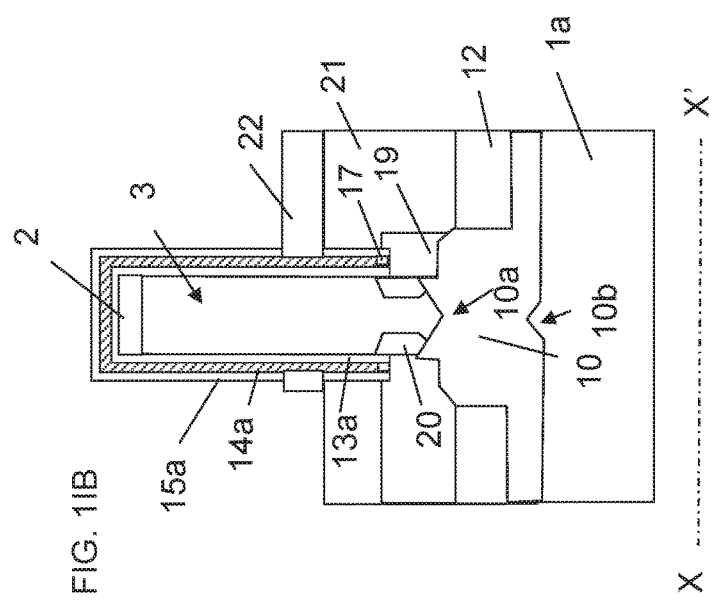

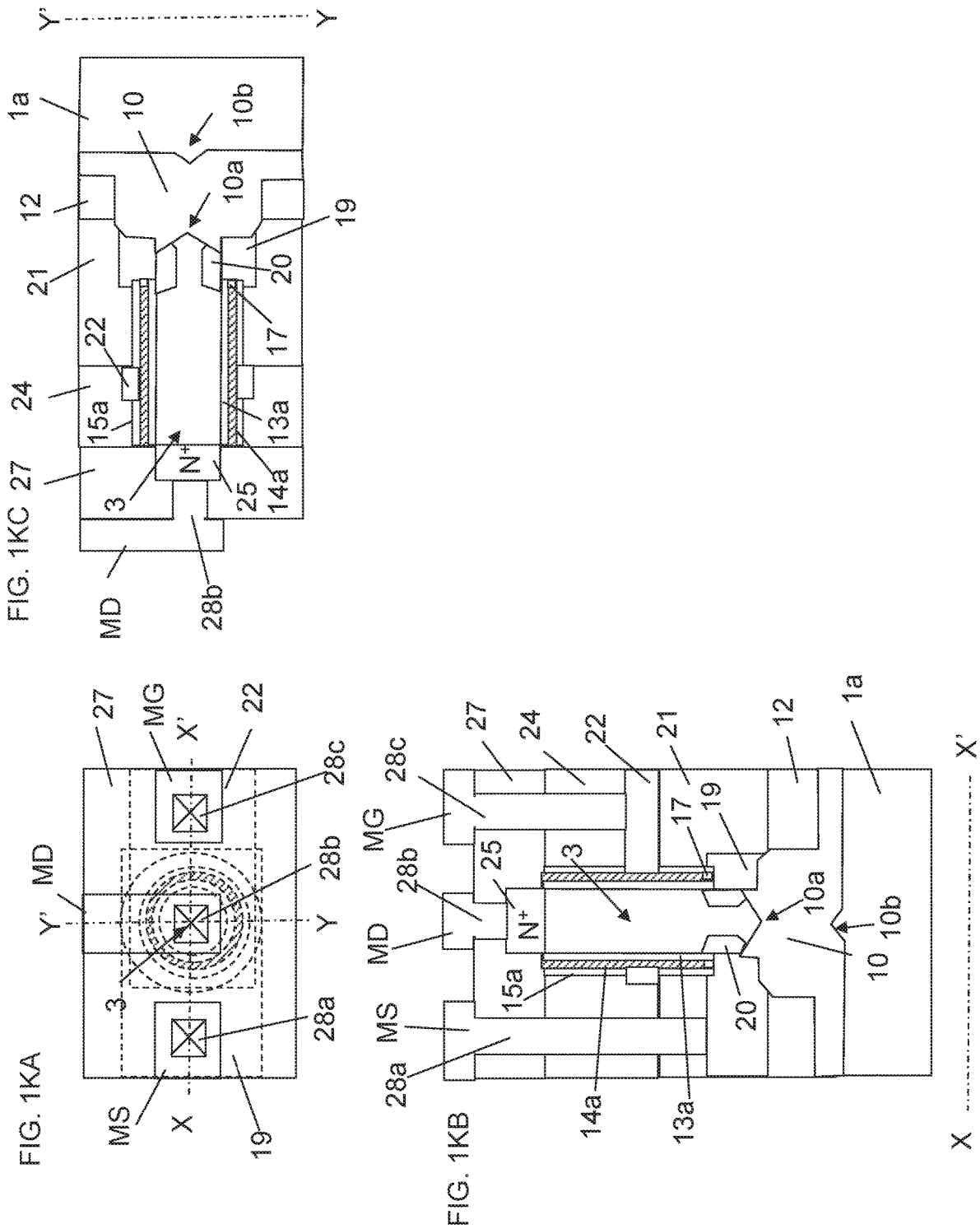

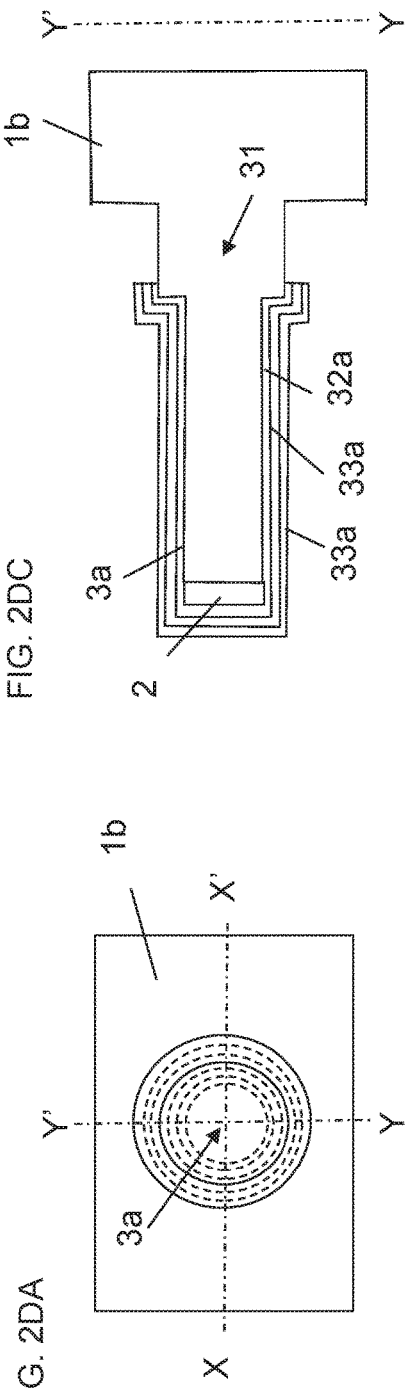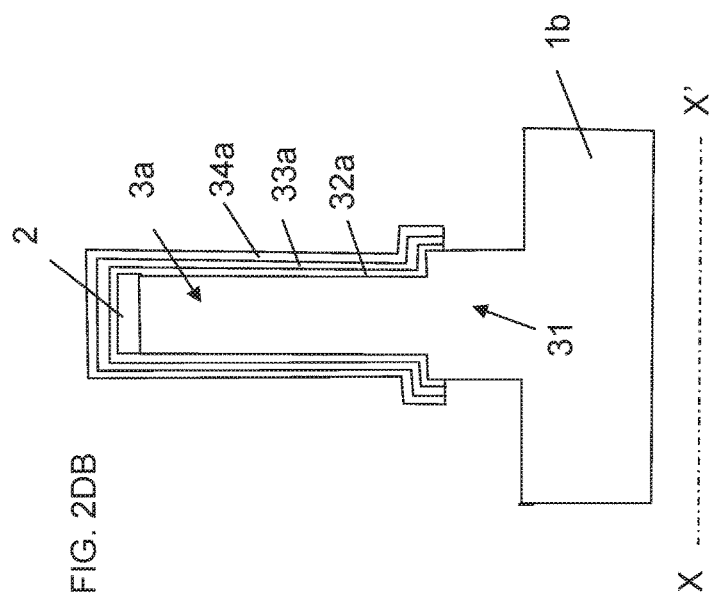

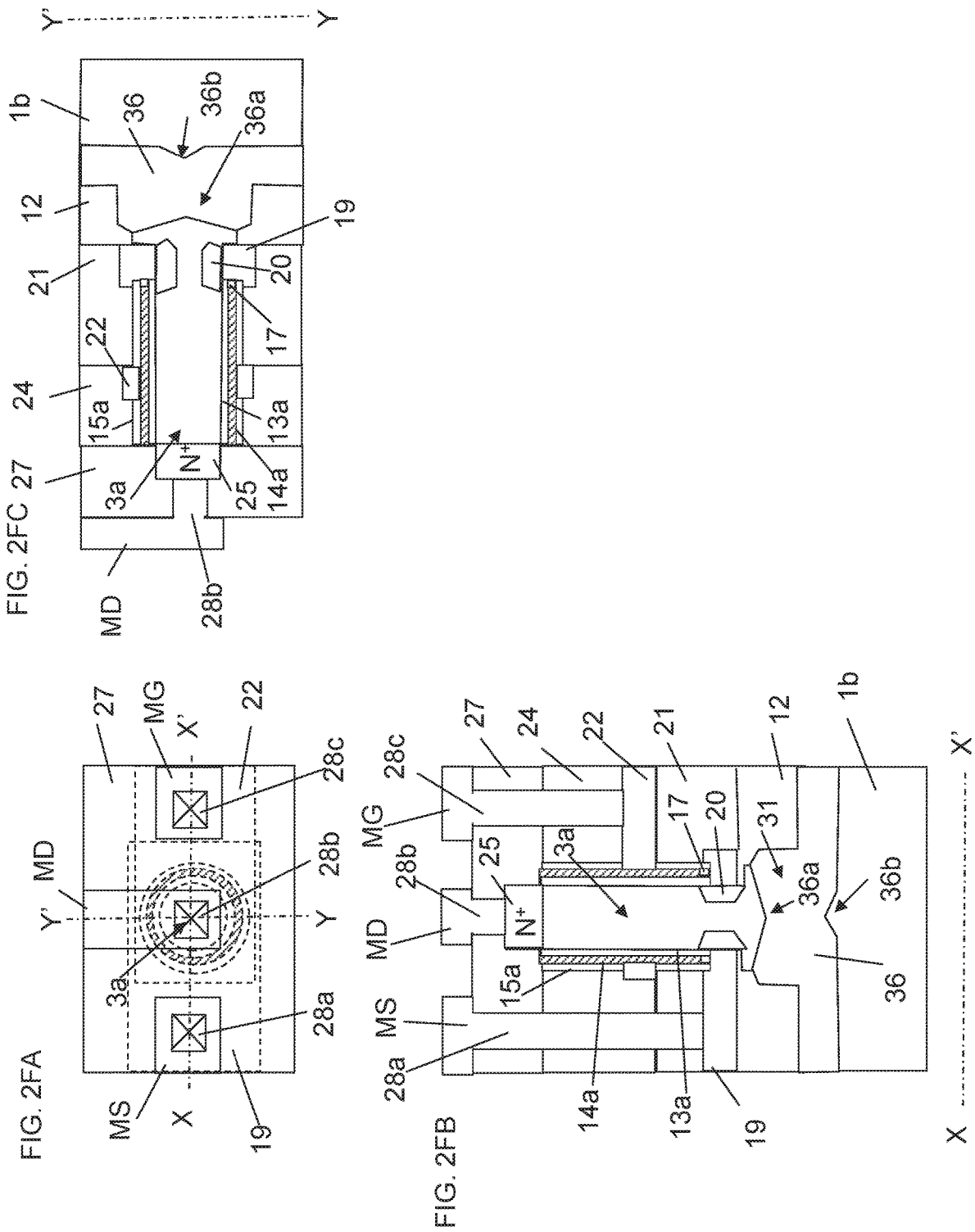

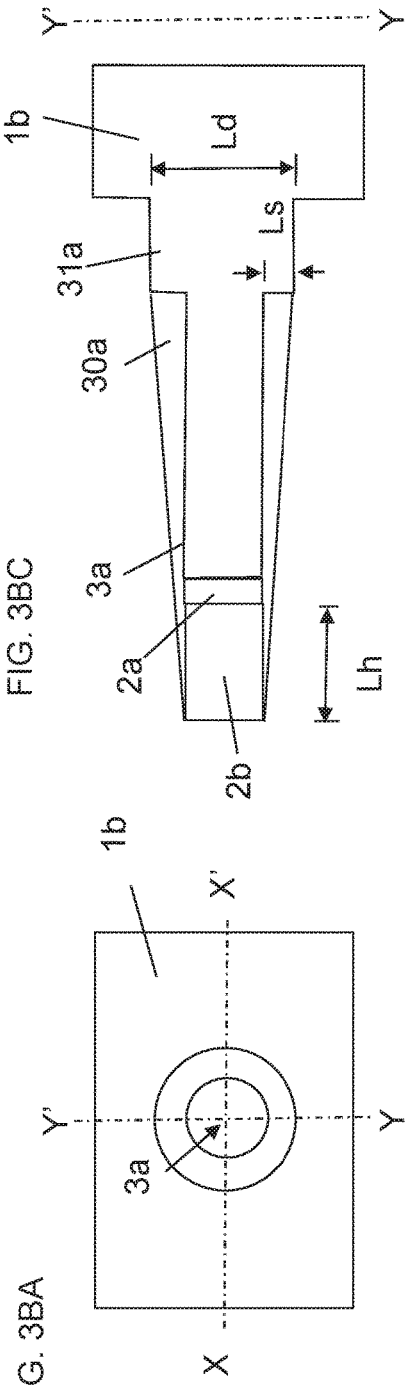
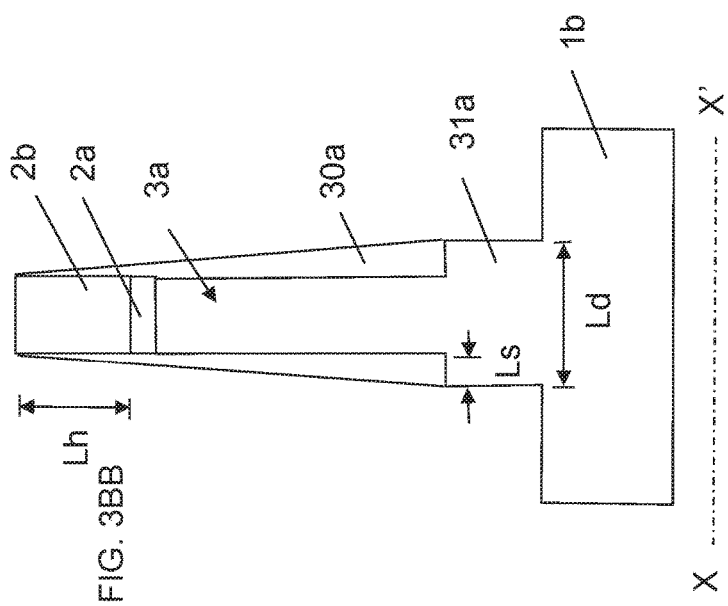
FIG. 3BC
FIG. 3BA
FIG. 3BB

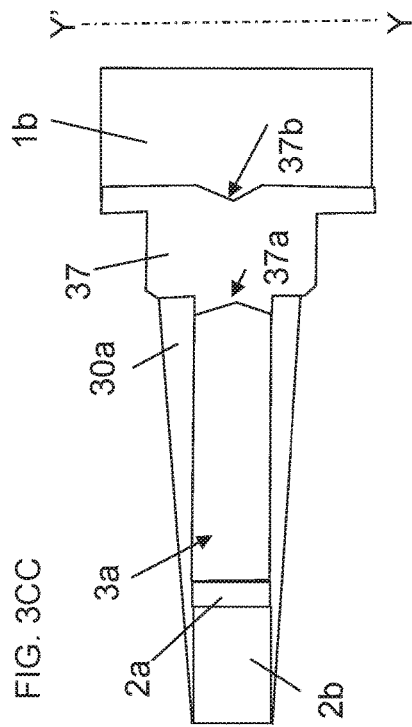
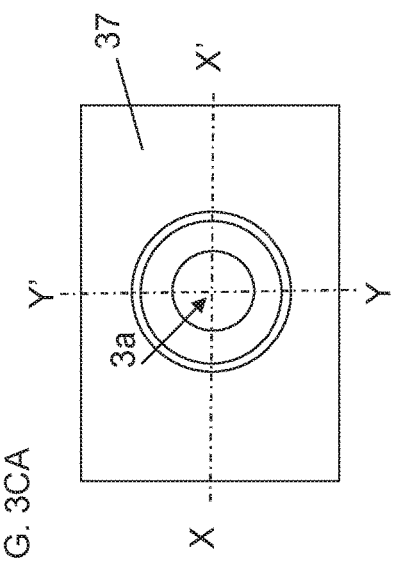
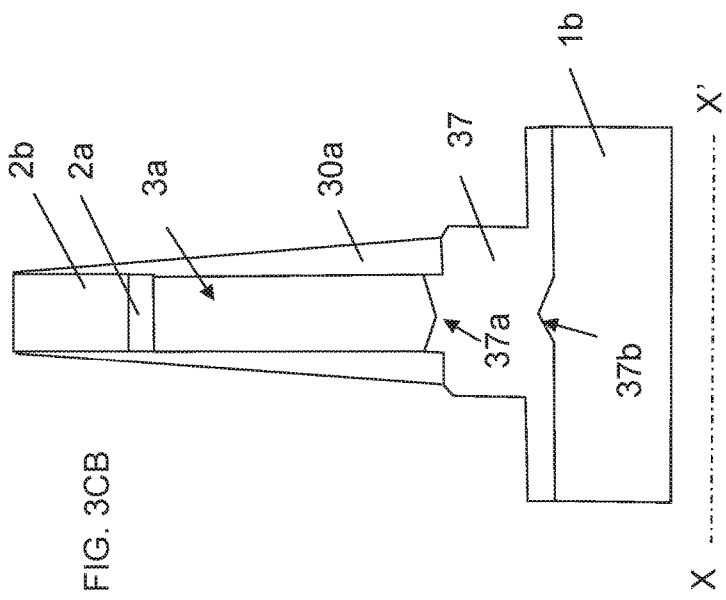

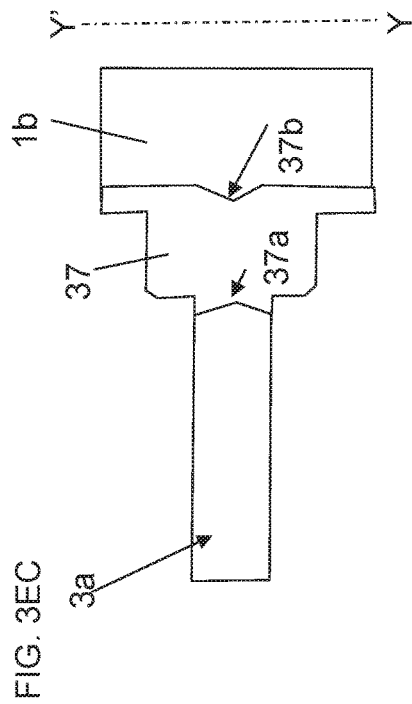
FIG. 3EC
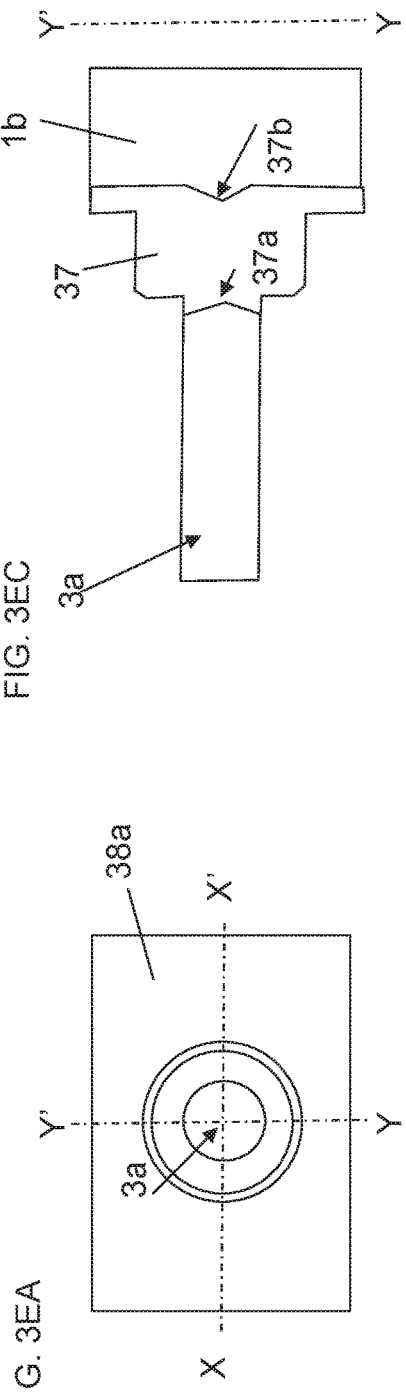
FIG. 3EA
FIG. 3EB

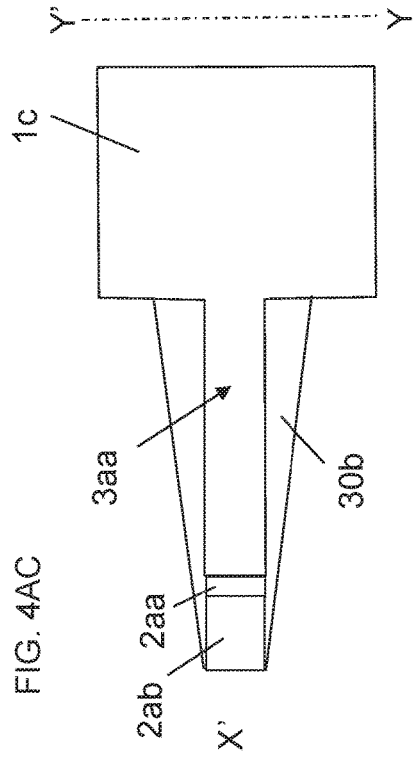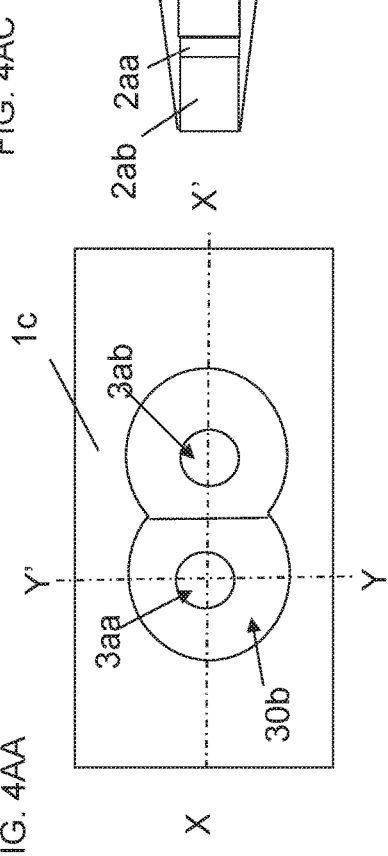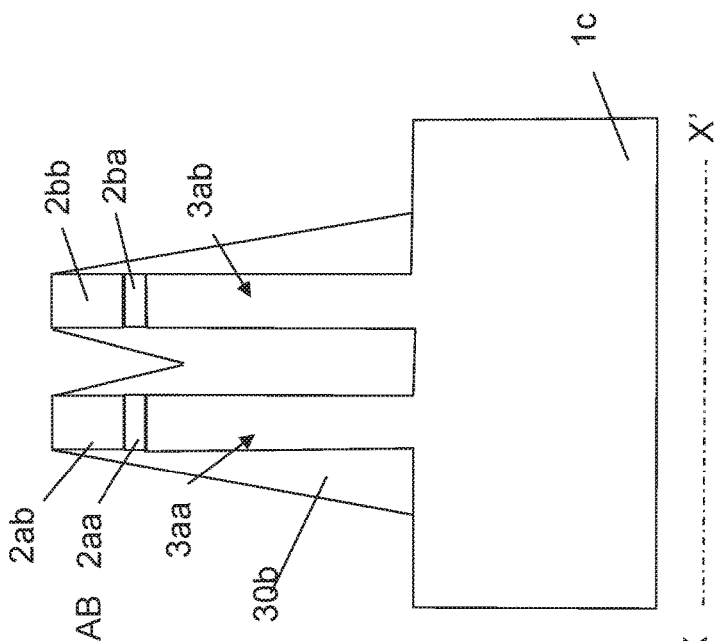

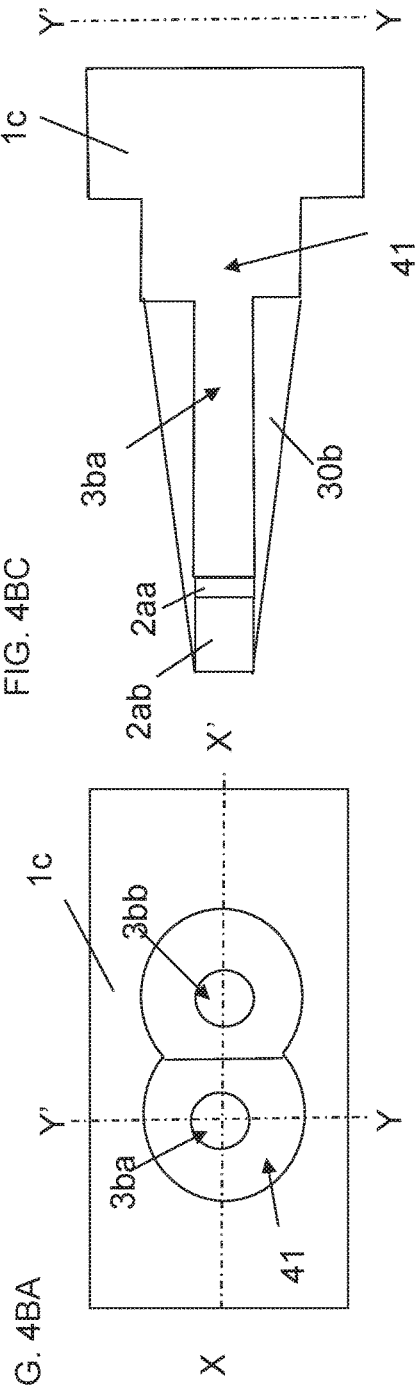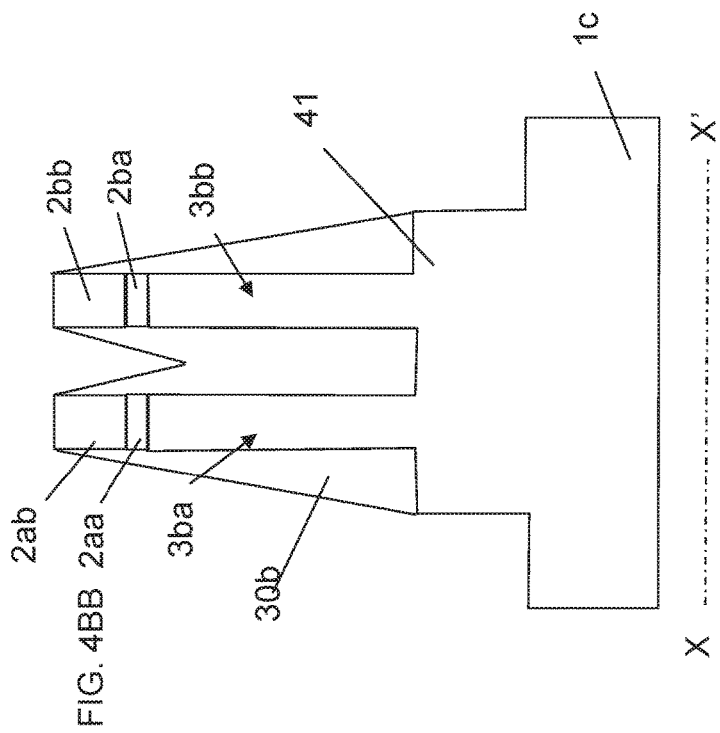

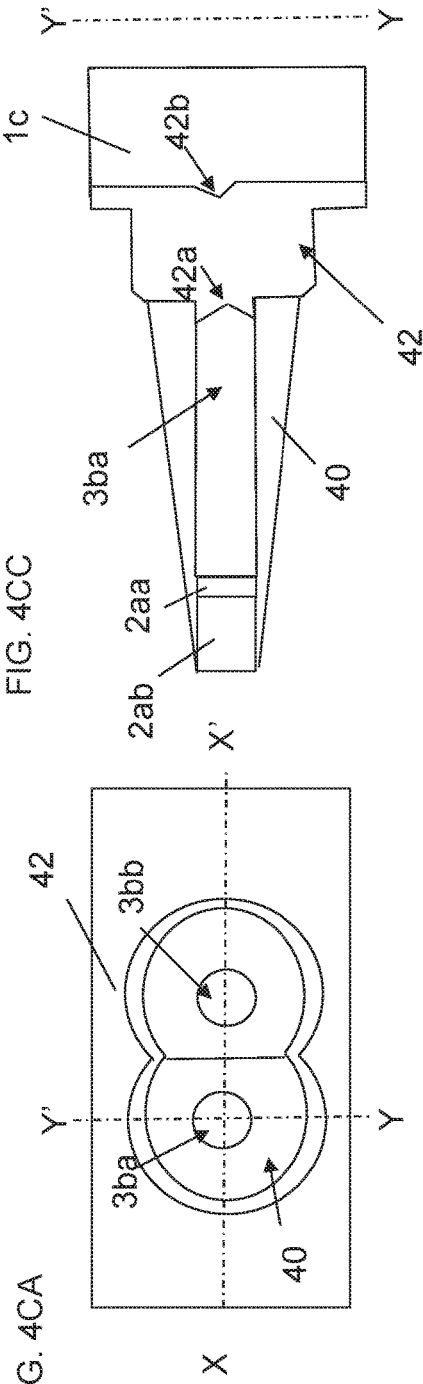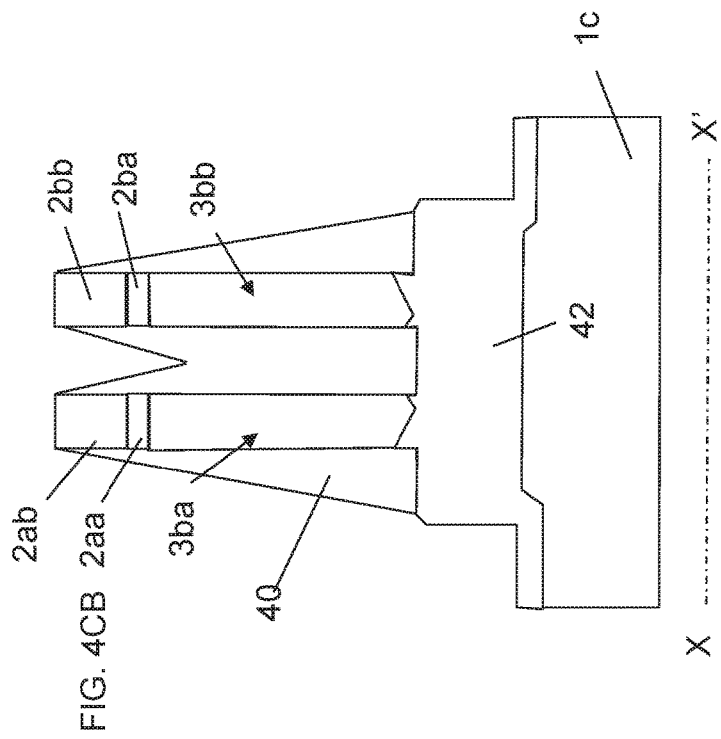
FIG. 4CC
FIG. 4CA
FIG. 4CB

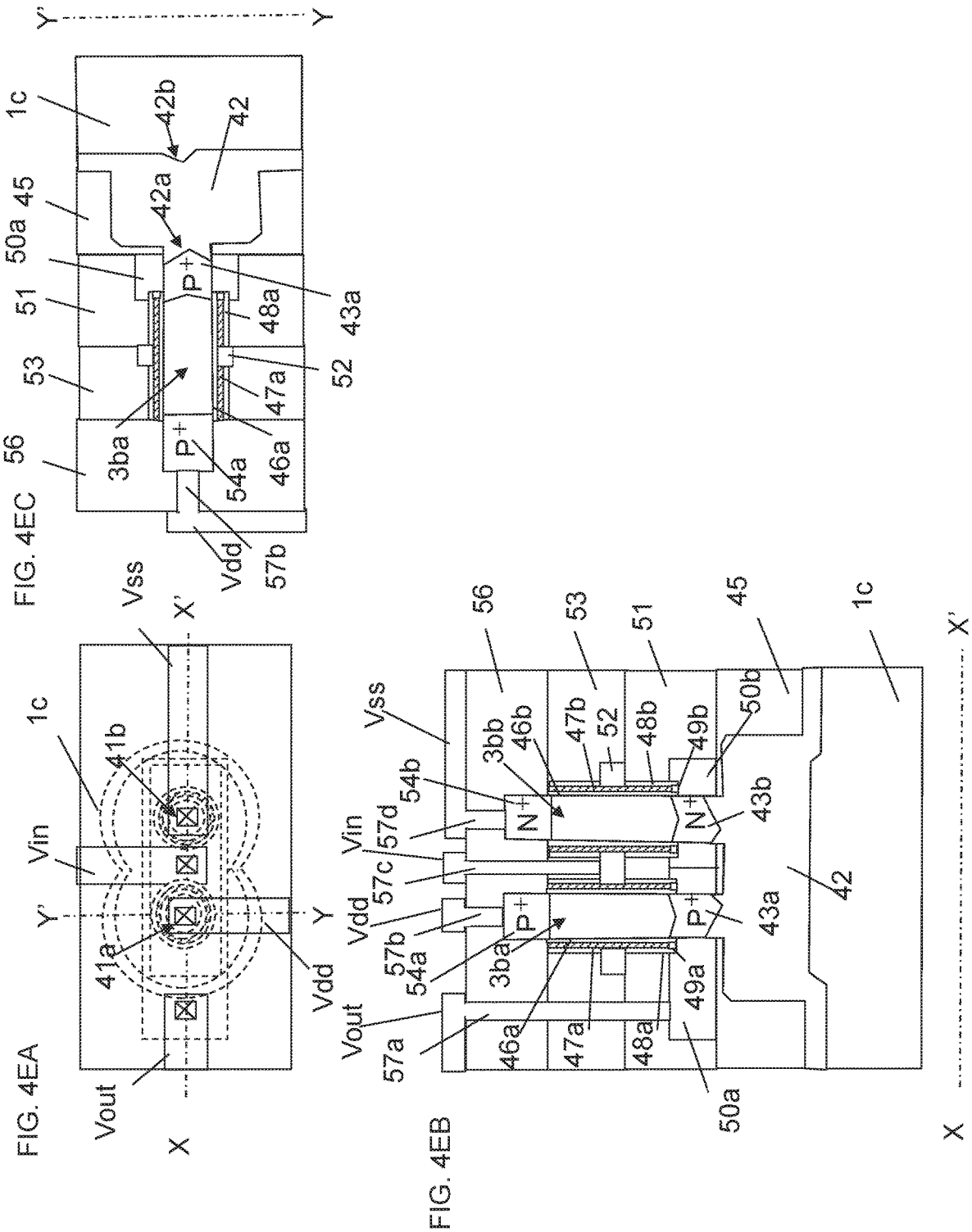

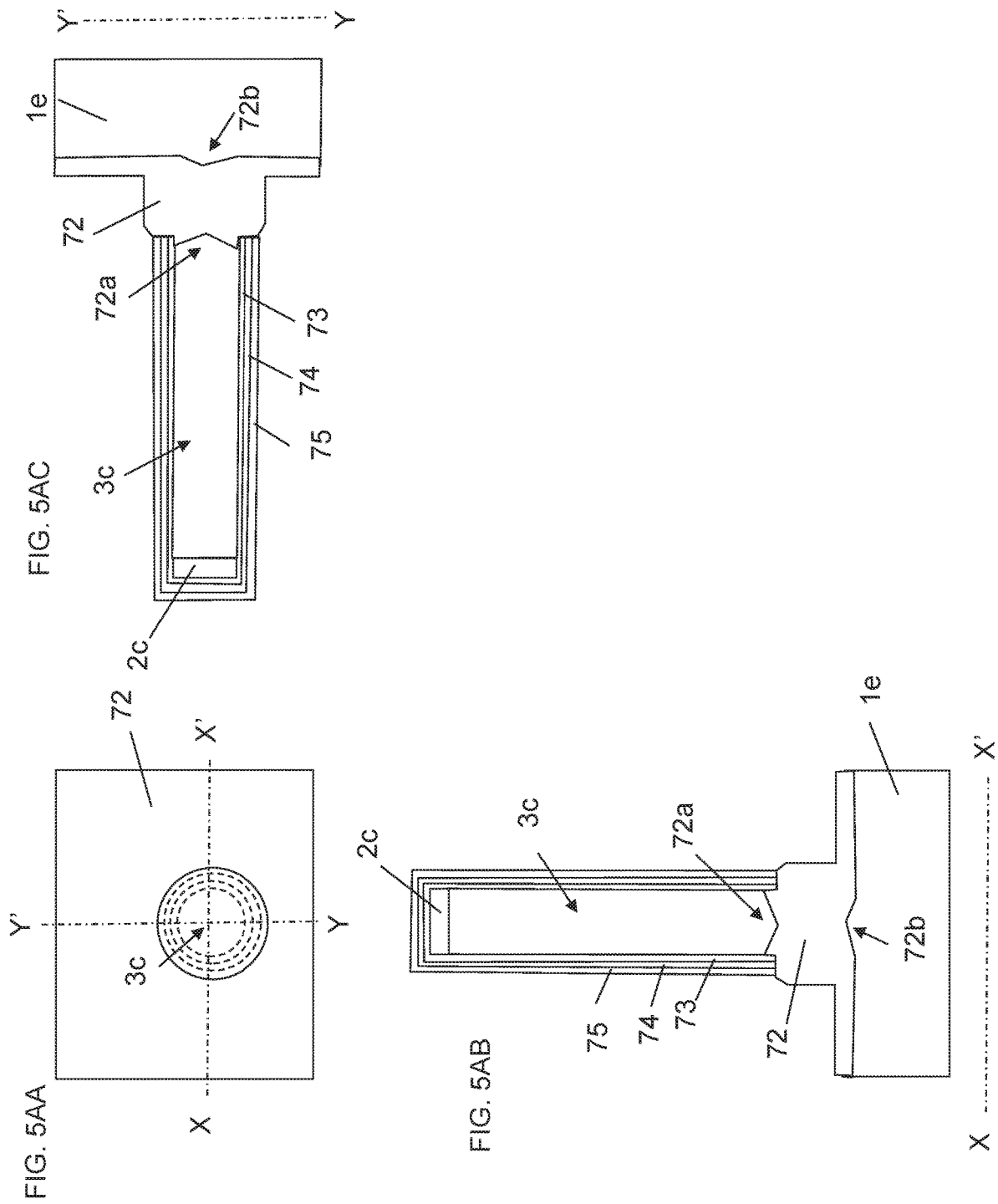

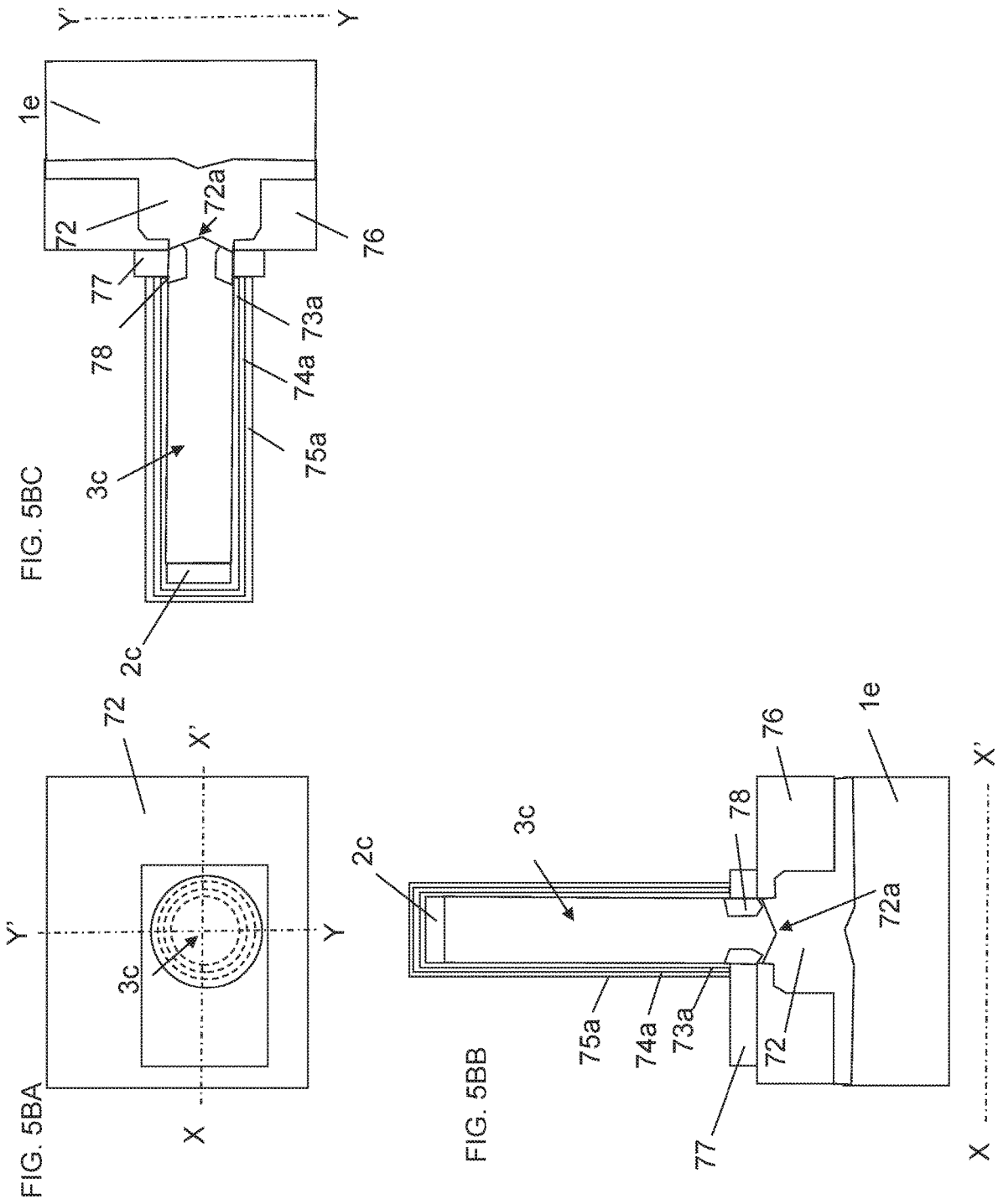

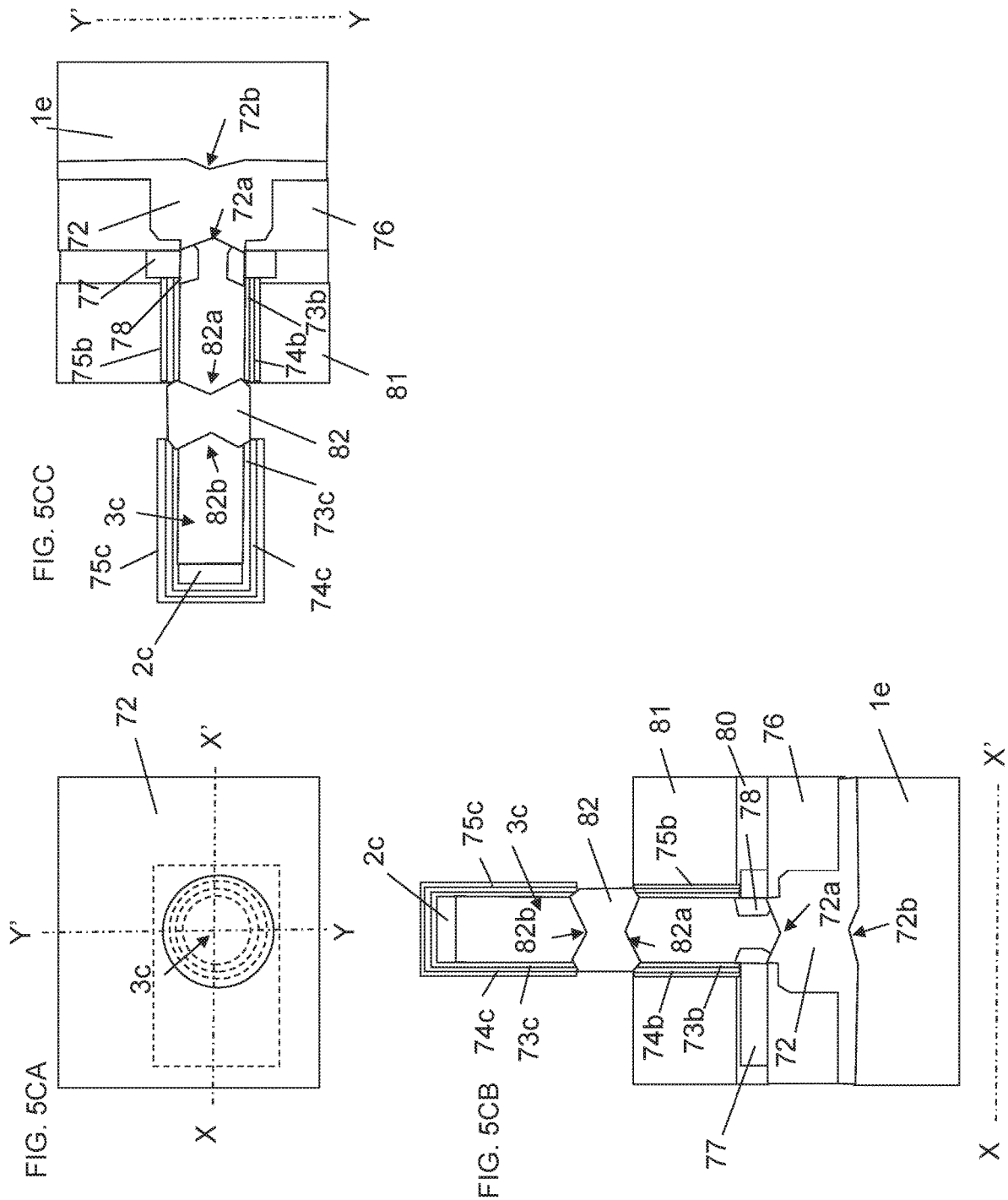

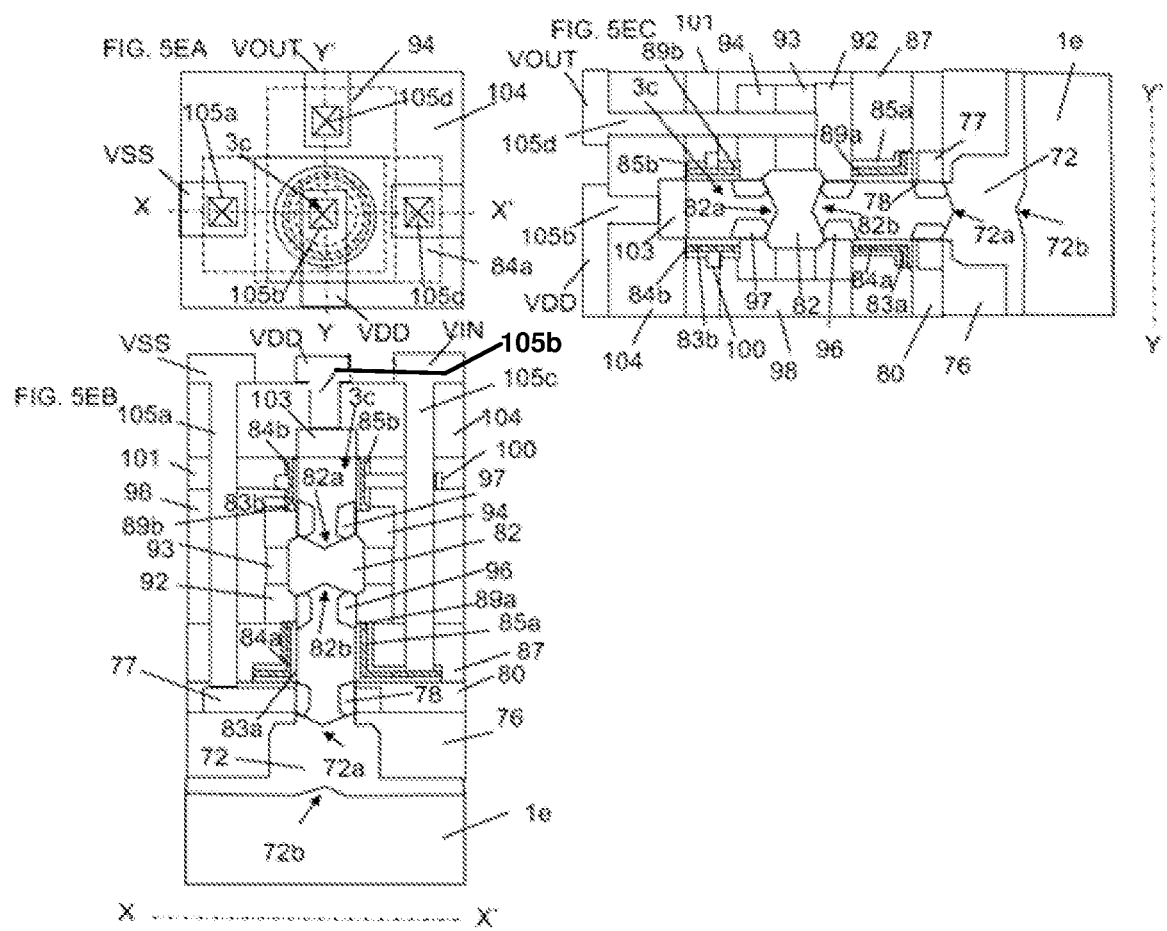

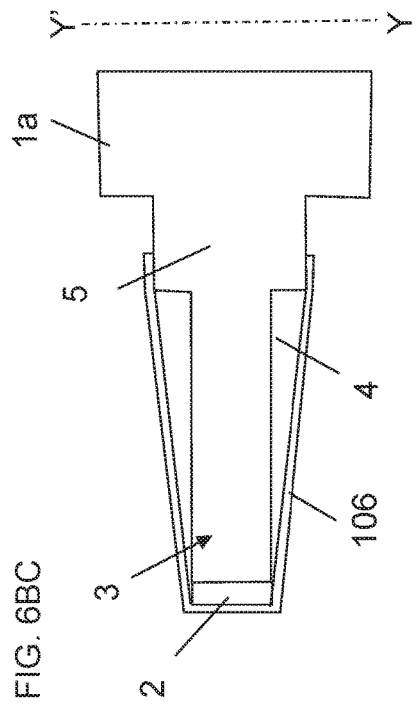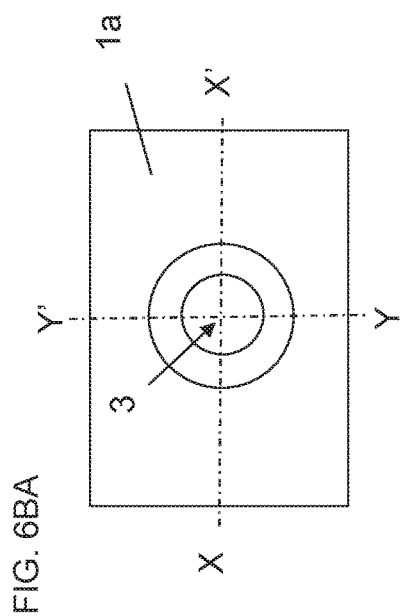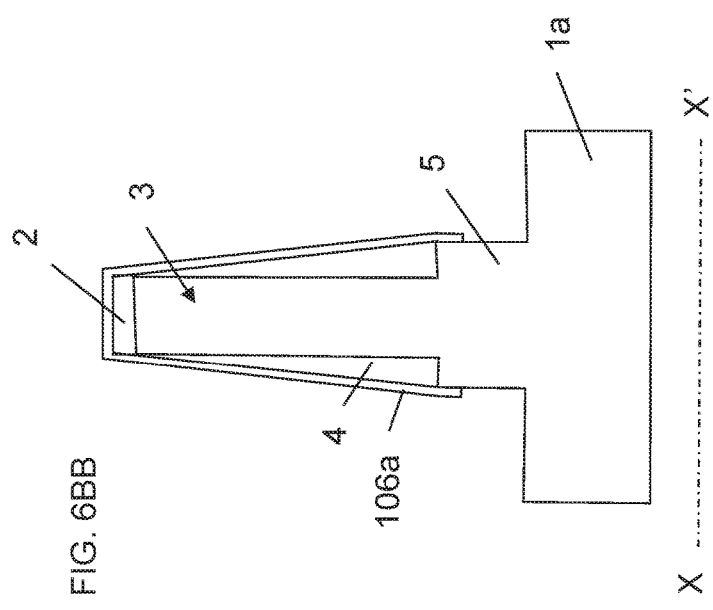

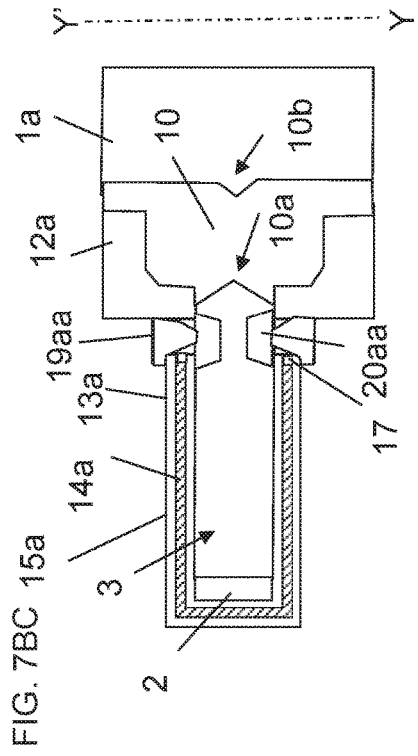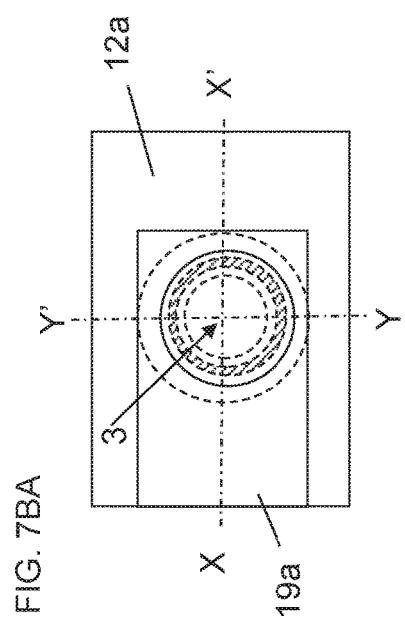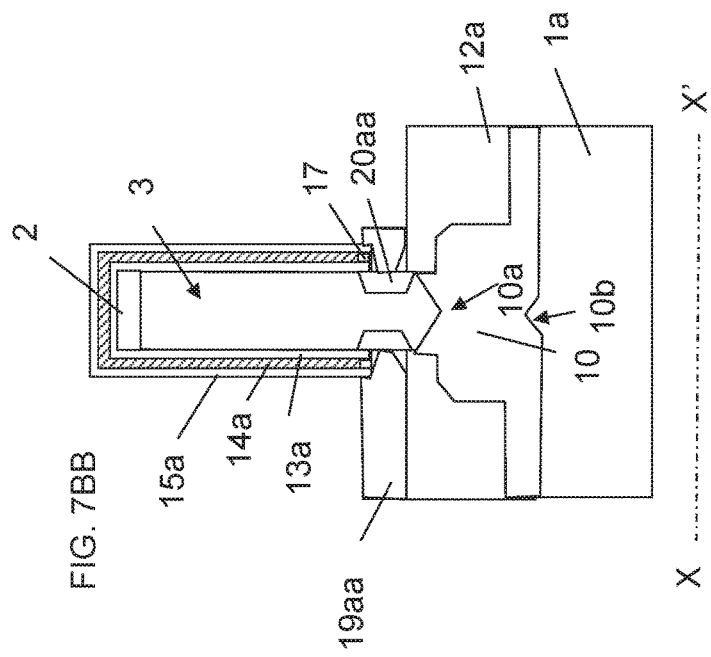

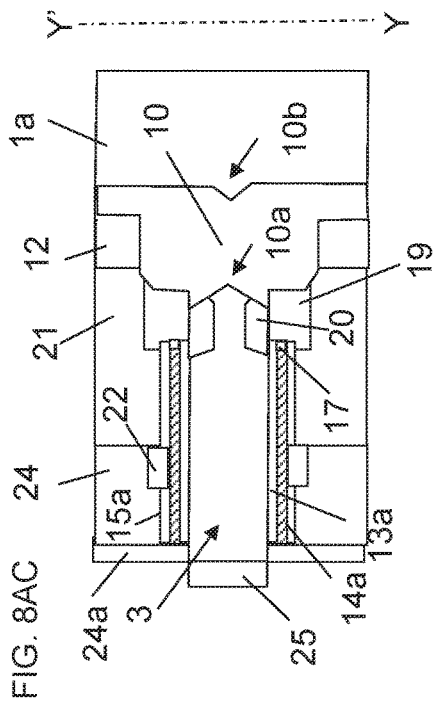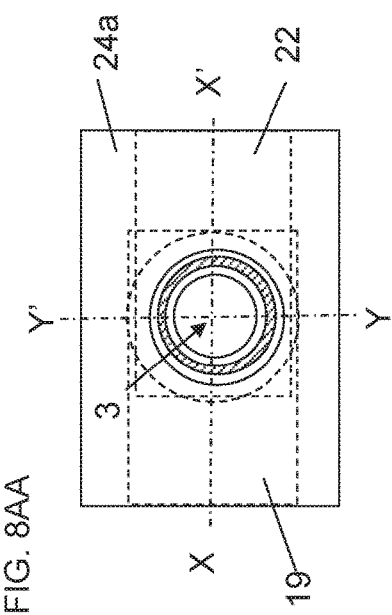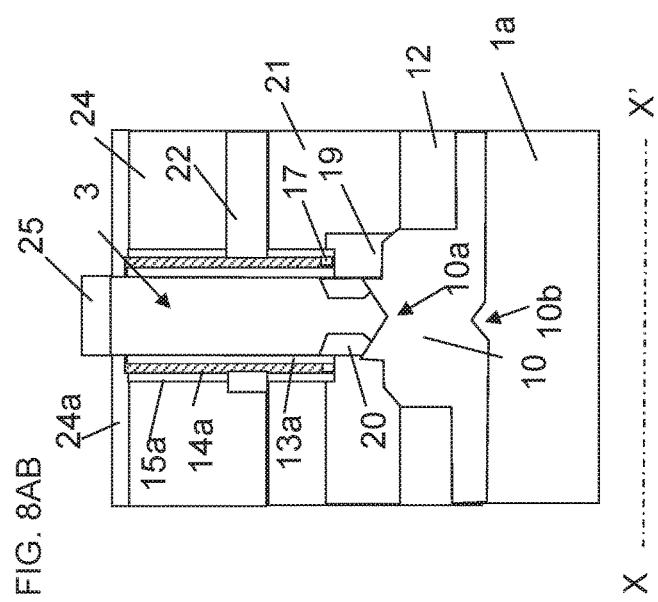
FIG. 8AA
FIG. 8AB
FIG. 8AC

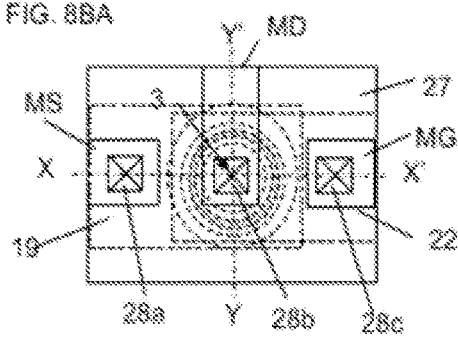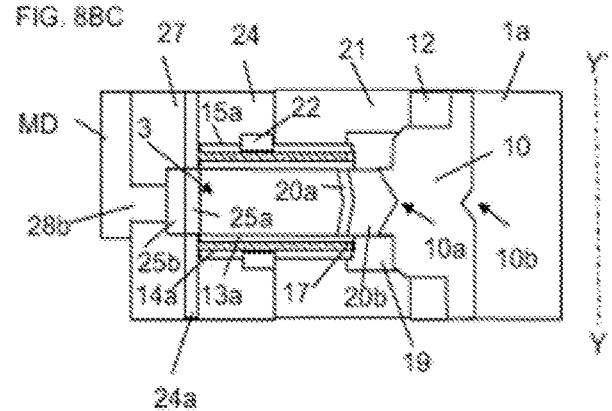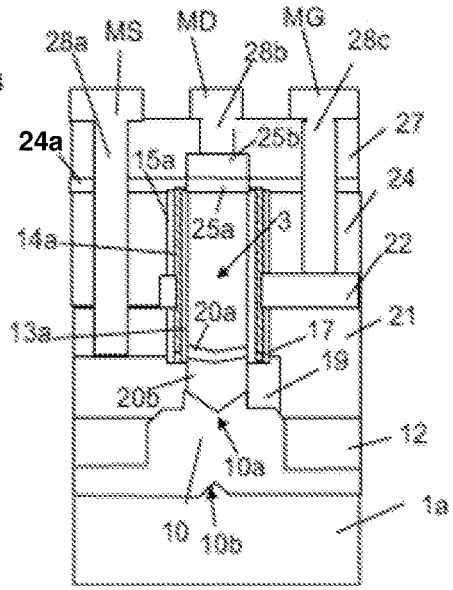

PILLAR-SHAPED SEMICONDUCTOR DEVICE AND METHOD FOR PRODUCING THE SAME

RELATED APPLICATIONS

The present application is a continuation application of PCT/JP2016/074084, filed Aug. 18, 2016, the entire contents of which are incorporated herein by reference.

BACKGROUND

1. Technical Field Text

The present invention relates to a pillar-shaped semiconductor device and a method for producing the pillar-shaped semiconductor device.

2. Background Information

In these years, pillar-shaped semiconductor devices having three-dimensional structures have come to be used for LSI (Large Scale Integration). As such semiconductor devices, SGTs (Surrounding Gate Transistors) have been attracting attention because of the high performance. There has been a demand for a pillar-shaped semiconductor device that has higher density and higher performance and is produced at lower costs.

Existing planar MOS transistors are formed on the surface layers of semiconductor substrates. By contrast, SGTs are formed in pillar-shaped semiconductors formed on substrates (for example, Japanese Unexamined Patent Application Publication No. 2-188966; and Hiroshi Takato, Kazumasa Sunouchi, Naoko Okabe, Akihiro Nitayama, Katsuhiko Hieda, Fumio Horiguchi, and Fujio Masuoka: IEEE Transaction on Electron Devices, Vol. 38, No. 3, pp. 573-578 (1991)). Thus, compared with planar MOS transistors, SGTs enable semiconductor devices having higher performance and higher density.

FIG. 9 is a schematic structural view of an N-channel SGT. A Si pillar 200 of a P or i (intrinsic) conductivity type (hereafter, silicon semiconductor pillars will be referred to as "Si pillars") has, in its upper and lower portions, $N^+$ layers 201a and 201b one of which functions as a source and the other one of which functions as a drain (hereafter, semiconductor regions containing a donor impurity at a high concentration will be referred to as "$N^+$ layers"). A portion of the Si pillar 200 between the $N^+$ layers 201a and 201b, which function as a source and a drain, functions as a channel region 202. Around this channel region 202, a gate insulating layer 203 is formed. Around this gate insulating layer 203, a gate conductor layer 204 is formed. In the SGT, the $N^+$ layers 201a and 201b, which function as a source and a drain, the channel region 202, the gate insulating layer 203, and the gate conductor layer 204 are formed along the single Si pillar 200. Thus, in plan view, the area occupied by the SGT corresponds to the area occupied by a single source-or-drain $N^+$ layer of a planar MOS transistor. As a result, compared with a circuit chip including a planar MOS transistor, an SGT-including circuit chip enables a further reduction in the chip size. The on-state current flowing through the channel region 202 is efficiently controlled with the gate conductor layer 204 surrounding the Si pillar 200, to thereby achieve high performance, compared with the planar MOS transistor.

There has been a demand for an SGT that has higher density and higher performance and is produced at lower costs. In order to increase the density of an SGT, a semiconductor pillar may be formed so as to have a reduced sectional diameter in plan view. However, since the semiconductor pillar is elongated and easily damaged, such a reduction in the sectional diameter causes difficulties in the production. The difficulties make it difficult to provide an SGT that has higher performance and is produced at lower costs.

BRIEF SUMMARY

There has been a demand for a pillar-shaped semiconductor device that has higher density and higher performance and is produced at lower costs.

A method for producing a pillar-shaped semiconductor device according to a first aspect of the present invention is a method for producing a pillar-shaped semiconductor device including a pillar-shaped semiconductor including a semiconductor pillar, first and second impurity regions in contact with lower and upper portions of the semiconductor pillar, a gate insulating layer formed so as to surround the semiconductor pillar between the first and second impurity regions disposed in a vertical direction, and a gate conductor layer formed so as to surround the gate insulating layer, the method including:

a semiconductor-pillar-structure-providing step of providing a structure including, on a semiconductor substrate, a semiconductor-pillar base part, the semiconductor pillar being present on the semiconductor-pillar base part and positioned, in plan view, within the semiconductor-pillar base part, and an oxidation-resistant mask material layer surrounding a top portion and a side surface of the semiconductor pillar; and an oxidation step of using the oxidation-resistant mask material layer as an oxidation-resistant mask, and oxidizing an entirety or a bottom portion of the semiconductor-pillar base part and a surface layer portion of the semiconductor substrate in a region around the semiconductor-pillar base part, to form an oxide insulating layer including, in its upper and lower regions, recessed portions disposed, in plan view, within the semiconductor pillar, wherein the oxide insulating layer is formed by oxidizing, in plan view, an entirety of the semiconductor-pillar base part.

Desirably, the semiconductor-pillar-structure-providing step includes a first-mask-material-layer formation step of forming a first mask material layer on the semiconductor substrate, a semiconductor-pillar formation step of etching the semiconductor substrate through the first mask material layer serving as an etching mask to form the semiconductor pillar, a second-mask-material-layer formation step of forming a second mask material layer surrounding a side surface of the semiconductor pillar, and a semiconductor-pillar-base-part formation step of etching the semiconductor substrate through the first mask material layer and the second mask material layer serving as etching masks to form the semiconductor-pillar base part under the semiconductor pillar.

Desirably, in the semiconductor-pillar-structure-providing step, the first mask material layer and the second mask material layer are each independently formed as a single layer formed of a material providing a function of an etching mask and a function of an oxidation-resistant mask, or each independently formed as a plurality of layers including, in their outermost portion, the single layer, and the oxidation-resistant mask material layer is constituted by the first mask material layer and the second mask material layer.

Desirably, the semiconductor-pillar-structure-providing step further includes a third-mask-material-layer formation step of forming the oxidation-resistant mask material layer so as to surround the semiconductor pillar with none of or at least one of the first mask material layer and the second mask material layer disposed between the oxidation-resistant mask material layer and the semiconductor pillar, and so as to surround an upper side surface of the semiconductor-pillar base part, and in the oxidation step, the oxide insulating layer is formed so as to have an upper end positioned at a level lower than an upper surface of the semiconductor-pillar base part.

Desirably, the semiconductor-pillar-structure-providing step further includes a step of removing the first mask material layer and/or a step of removing the second mask material layer.

Desirably, in the third-mask-material-layer formation step, the oxidation-resistant mask material layer is formed so as to surround the semiconductor pillar with the first mask material layer and the second mask material layer disposed between the oxidation-resistant mask material layer and the semiconductor pillar, and so as to surround the upper side surface of the semiconductor-pillar base part.

Desirably, in the semiconductor-pillar-base-part formation step, the second mask material layer surrounding a bottom side surface of the semiconductor pillar is formed with a predetermined thickness so as to form the semiconductor-pillar base part having a predetermined width in plan view.

Desirably, in the semiconductor-pillar-structure-providing step, a plurality of the semiconductor pillars are formed on and share the semiconductor-pillar base part, and the oxidation-resistant mask material layer is formed so as to surround top portions and side surfaces of all the semiconductor pillars.

Desirably, the semiconductor-pillar-structure-providing step includes a first-mask-material-layer formation step of forming a plurality of first mask material layers on the semiconductor substrate, a semiconductor-pillar formation step of etching the semiconductor substrate through the first mask material layers serving as etching masks to form the plurality of semiconductor pillars, a second-mask-material-layer formation step of forming a second mask material layer so as to surround side surfaces of all the semiconductor pillars, and continuously extend between adjacent ones of the semiconductor pillars, and a semiconductor-pillar-base-part formation step of etching the semiconductor substrate through the first mask material layers and the second mask material layer serving as etching masks, to form the semiconductor-pillar base part disposed under and shared by the plurality of semiconductor pillars.

Desirably, the method for producing a pillar-shaped semiconductor device further includes a step of removing a portion of the oxidation-resistant mask material layer, the portion having a band shape having a predetermined width in a height direction, to expose a side surface of the semiconductor pillar, and a step of using a remaining portion of the oxidation-resistant mask material layer as an oxidation-resistant mask and oxidizing the semiconductor pillar from its exposed surface, to form an additional oxide insulating layer including, in its upper and lower regions, recessed portions within the semiconductor pillar.

Desirably, the method for producing a pillar-shaped semiconductor device further includes a step of forming a cover insulating layer so as to cover an exposed surface of the oxide insulating layer, a step of providing an exposed side surface of a lower portion of the semiconductor pillar, and a step of forming a conductor material layer on the cover insulating layer so as to be in contact with the exposed side surface of the semiconductor pillar, and formed of alloy or semiconductor containing a first donor or acceptor impurity.

Desirably, the method for producing a pillar-shaped semiconductor device further includes a step of performing heating to diffuse the first donor or acceptor impurity from the conductor material layer to the semiconductor pillar, to form the first impurity region in a lower portion of the semiconductor pillar.

Desirably, the cover insulating layer has a smaller diffusion coefficient for the first donor or acceptor impurity than the oxide insulating layer.

Desirably, the method for producing a pillar-shaped semiconductor device further includes a step of, after formation of the cover insulating layer, forming the gate insulating layer, the gate conductor layer, and a first material layer in this order so as to cover the semiconductor pillar and the cover insulating layer, a step of forming, in a region around a bottom portion of the semiconductor pillar, an etching material layer containing an etching material for etching the first material layer, so as to be in contact with the first material layer, a step of using the etching material to etch the first material layer that is in contact with the etching material layer, a step of removing the etching material layer, a step of etching the gate conductor layer through a remaining portion of the first material layer serving as a mask, a step of etching the gate insulating layer through a mask that is at least one of the first material layer and the gate conductor layer, to provide an exposed side surface of the semiconductor pillar, and a step of forming the wiring material layer on the cover insulating layer so as to be in contact with the exposed side surface of the semiconductor pillar, wherein the cover insulating layer has an etching block effect against the etching material.

Desirably, the conductor material layer is a first alloy layer containing first semiconductor atoms, first metal atoms, and the first donor or acceptor impurity, the method further includes a step of performing a heat treatment to form, within the semiconductor pillar, a second alloy layer that connects to the first alloy layer, that contains second semiconductor atoms constituting the semiconductor pillar, the first metal atoms, and the first donor or acceptor impurity, and that occupies, in plan view, an outer peripheral portion or an entirety of the semiconductor pillar, and a step of performing a heat treatment to push out the first donor or acceptor impurity from the first alloy layer and the second alloy layer, to form the first impurity region within the semiconductor pillar.

Desirably, the method for producing a pillar-shaped semiconductor device further includes a step of forming, in a top portion of the semiconductor pillar, a third impurity region containing a second donor or acceptor impurity, a step of depositing second metal atoms having a lower alloying temperature than the first metal atoms so as to be in contact with the third impurity region, and a step of performing a heat treatment to form, in a top portion of the semiconductor pillar, a third alloy layer that contains the second semiconductor atoms, the second metal atoms, and the second donor or acceptor impurity, and that occupies, in plan view, an outer peripheral portion or an entirety of the semiconductor pillar, and the second impurity region containing the second donor or acceptor impurity pushed out from the third alloy layer.

Desirably, the method for producing a pillar-shaped semiconductor device further includes a step of forming a fourth alloy layer that covers at least a side surface of a top portion of the semiconductor pillar, and that contains third semiconductor atoms, second metal atoms having a lower alloying temperature than the first metal atoms, and a second donor or acceptor impurity, and a step of performing a heat treatment to form, within the semiconductor pillar, a third alloy layer that connects to the fourth alloy layer, that contains the second semiconductor atoms, the second metal atoms, and the second donor or acceptor impurity, and that occupies, in plan view, an outer peripheral portion or an entirety of the semiconductor pillar, and the second impurity region containing the second donor or acceptor impurity pushed out from the third alloy layer.

A pillar-shaped semiconductor device according to a second aspect of the present invention is a pillar-shaped semiconductor device including:

an oxide insulating layer being present on a semiconductor substrate, and including, in upper and lower regions, recessed portions;

a semiconductor pillar that is formed on an upper one of the recessed portions of the oxide insulating layer, with a conductor base part disposed between the semiconductor pillar and the upper one of the recessed portions, the conductor base part being constituted by a single layer or a plurality of layers and formed of at least semiconductor, alloy, and metal, the semiconductor pillar having, in plan view, a smaller width than the oxide insulating layer;

a first impurity region in contact with a lower portion of the semiconductor pillar;

a second impurity region being in contact with the semiconductor pillar and positioned higher than the first impurity region;

a gate insulating layer surrounding a portion of the semiconductor pillar, the portion being positioned, in a vertical direction, between the first impurity region and the second impurity region; and a gate conductor layer surrounding the gate insulating layer, wherein the oxide insulating layer and the conductor base part constitute a semiconductor-pillar base part on which the semiconductor pillar stands.

Desirably, the pillar-shaped semiconductor device includes:

a cover insulating layer covering an upper surface of the oxide insulating layer; and a wiring material layer connecting to the first impurity region, formed on the cover insulating layer, and containing a first donor or acceptor impurity, wherein the cover insulating layer has a smaller diffusion coefficient for the first donor or acceptor impurity than the oxide insulating layer.

Desirably, the pillar-shaped semiconductor device further includes:

a first conductor layer formed on the oxide insulating layer, containing first semiconductor atoms, first metal atoms, and the first donor or acceptor impurity, and occupying an outer peripheral portion or an entirety of the semiconductor pillar;

the first impurity region formed on the first conductor layer; and a second conductor layer formed on the second impurity region, and containing second semiconductor atoms, second metal atoms having a lower alloying temperature than the first metal atoms, and a second donor or acceptor impurity.

Desirably, the pillar-shaped semiconductor device further includes an additional oxide insulating layer disposed within the semiconductor pillar, positioned higher than the second impurity region, and including, in upper and lower regions, recessed portions, wherein the semiconductor pillar includes, in a region above the additional oxide insulating layer, a second pillar-shaped semiconductor device.

Desirably, the pillar-shaped semiconductor device includes:

a second oxide insulating layer horizontally connecting to the oxide insulating layer, and having second recessed portions;

a second semiconductor pillar that is formed on an upper one of the second recessed portions of the second oxide insulating layer, with a second conductor base part disposed between the second semiconductor pillar and the upper one of the second recessed portions, the second conductor base part being constituted by a single layer or a plurality of layers and formed of at least semiconductor, alloy, and metal, the second semiconductor pillar having, in plan view, a smaller width than the second oxide insulating layer and the second conductor base part;

a third impurity region in contact with a lower portion of the second semiconductor pillar;

a fourth impurity region being in contact with the second semiconductor pillar and positioned higher than the third impurity region;

a second gate insulating layer surrounding a portion of the second semiconductor pillar, the portion being positioned, in a vertical direction, between the third impurity region and the fourth impurity region; and a second gate conductor layer surrounding the second gate insulating layer, wherein the second oxide insulating layer and the second conductor base part constitute a second semiconductor-pillar base part on which the second semiconductor pillar stands.

BRIEF DESCRIPTION OF THE DRAWINGS

FIGS. 1EA to 1EC are a plan view and sectional structural views that illustrate the method for producing an SGT-including pillar-shaped semiconductor device according to the first embodiment.

FIGS. 1IA to 1IC are a plan view and sectional structural views that illustrate the method for producing an SGT-including pillar-shaped semiconductor device according to the first embodiment.

FIGS. 1KA to 1KC are a plan view and sectional structural views that illustrate the method for producing an SGT-including pillar-shaped semiconductor device according to the first embodiment.

FIGS. 2DA to 2DC are a plan view and sectional structural views that illustrate the method for producing an SGT-including pillar-shaped semiconductor device according to the second embodiment.

FIGS. 2FA to 2FC are a plan view and sectional structural views that illustrate the method for producing an SGT-including pillar-shaped semiconductor device according to the second embodiment.

FIGS. 3BA to 3BC are a plan view and sectional structural views that illustrate the method for producing an SGT-including pillar-shaped semiconductor device according to the third embodiment.

FIGS. 3CA to 3CC are a plan view and sectional structural views that illustrate the method for producing an SGT-including pillar-shaped semiconductor device according to the third embodiment.

FIGS. 3EA to 3EC are a plan view and sectional structural views that illustrate the method for producing an SGT-including pillar-shaped semiconductor device according to the third embodiment.

FIGS. 4AA to 4AC are a plan view and sectional structural views that illustrate a method for producing an SGT-including pillar-shaped semiconductor device according to a fourth embodiment of the present invention.

FIGS. 4BA to 4BC are a plan view and sectional structural views that illustrate the method for producing an SGT-including pillar-shaped semiconductor device according to the fourth embodiment.

FIGS. 4CA to 4CC are a plan view and sectional structural views that illustrate the method for producing an SGT-including pillar-shaped semiconductor device according to the fourth embodiment.

FIGS. 4EA to 4EC are a plan view and sectional structural views that illustrate the method for producing an SGT-including pillar-shaped semiconductor device according to the fourth embodiment.

FIGS. 5AA to 5AC are a plan view and sectional structural views that illustrate the method for producing an SGT-including pillar-shaped semiconductor device according to a fifth embodiment of the present invention.

FIGS. 5BA to 5BC are a plan view and sectional structural views that illustrate the method for producing an SGT-including pillar-shaped semiconductor device according to the fifth embodiment.

FIGS. 5CA to 5CC are a plan view and sectional structural views that illustrate the method for producing an SGT-including pillar-shaped semiconductor device according to the fifth embodiment.

FIGS. 5EA to 5EC are a plan view and sectional structural views that illustrate the method for producing an SGT-including pillar-shaped semiconductor device according to the fifth embodiment.

FIGS. 6BA to 6BC are a plan view and sectional structural views that illustrate the method for producing an SGT-including pillar-shaped semiconductor device according to the sixth embodiment.

FIGS. 7BA to 7BC are a plan view and sectional structural views that illustrate the method for producing an SGT-including pillar-shaped semiconductor device according to the seventh embodiment.

FIGS. 8AA to 8AC are a plan view and sectional structural views that illustrate a method for producing an SGT-including pillar-shaped semiconductor device according to an eighth embodiment of the present invention.

FIGS. 8BA to 8BC are a plan view and sectional structural views that illustrate the method for producing an SGT-including pillar-shaped semiconductor device according to the eighth embodiment.

DETAILED DESCRIPTION OF THE DRAWINGS AND THE PRESENTLY PREFERRED EMBODIMENTS

Hereinafter, methods for producing a pillar-shaped semiconductor device according to embodiments of the present invention will be described with reference to the drawings.

First Embodiment

Hereinafter, with reference to FIG. 1AA to FIG. 1KC, a method for producing an SGT-including pillar-shaped semiconductor device according to a first embodiment of the present invention will be described. Among FIG. 1AA to FIG. 1KC, figures suffixed with A are plan views; figures suffixed with B are sectional structural views taken along lines X-X' in the corresponding figures suffixed with A; and figures suffixed with C are sectional structural views taken along lines Y-Y' in the corresponding figures suffixed with A.

Figure 1A:
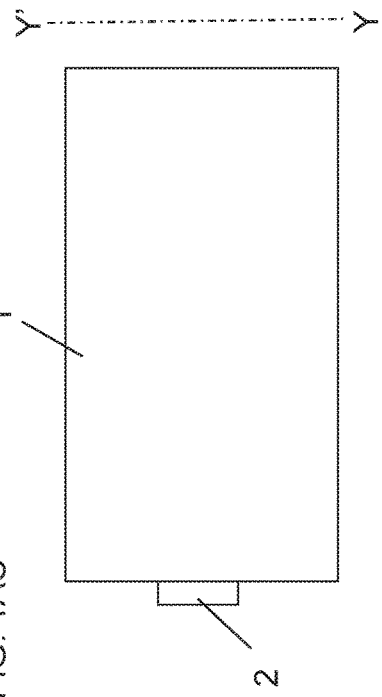
FIGS. 1AA to 1AC are a plan view and sectional structural views that illustrate a method for producing an SGT-including pillar-shaped semiconductor device according to a first embodiment of the present invention.
Figure 1A:
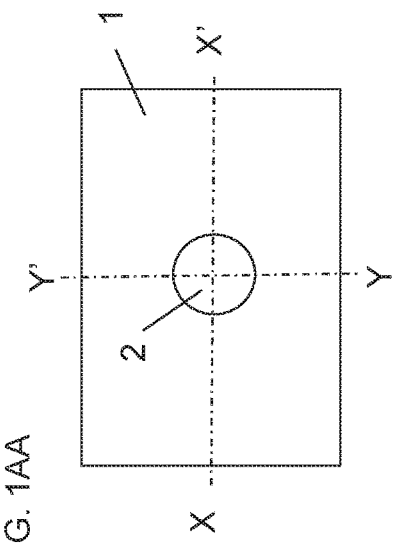
Figure 1A:
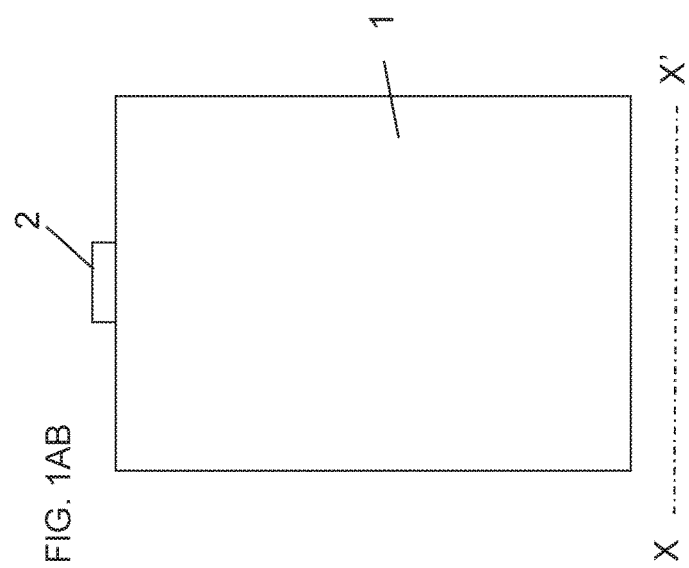

As illustrated in FIGS. 1AA to 1AC, on a Si substrate 1, a silicon nitride ($Si_3N_4$) layer and a $SiO_2$ layer that have a circular shape in plan view are stacked in this order, to thereby form a mask material layer 2 constituted by these two layers.

Figure 1B:
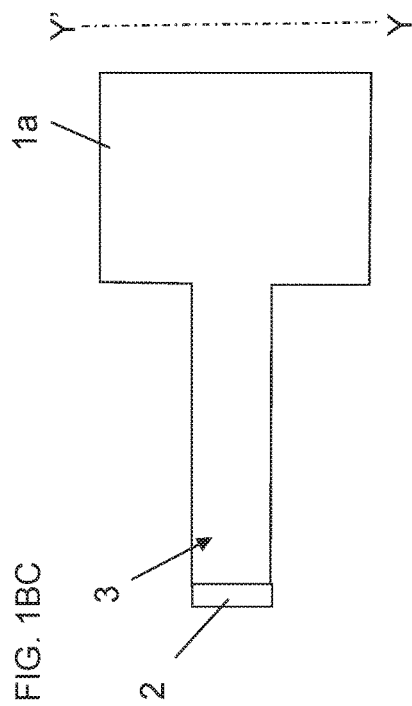
FIGS. 1BA to 1BC are a plan view and sectional structural views that illustrate the method for producing an SGT-including pillar-shaped semiconductor device according to the first embodiment.
Figure 1B:
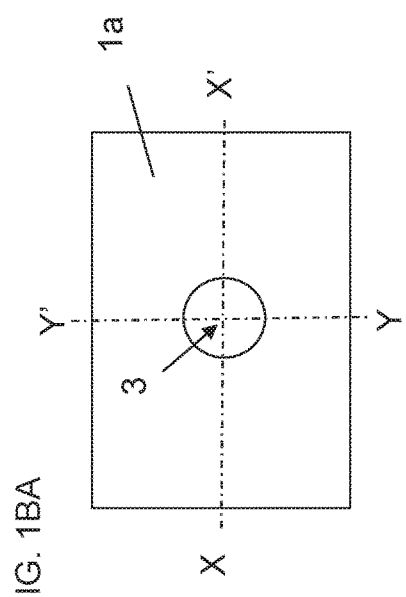
Figure 1B:
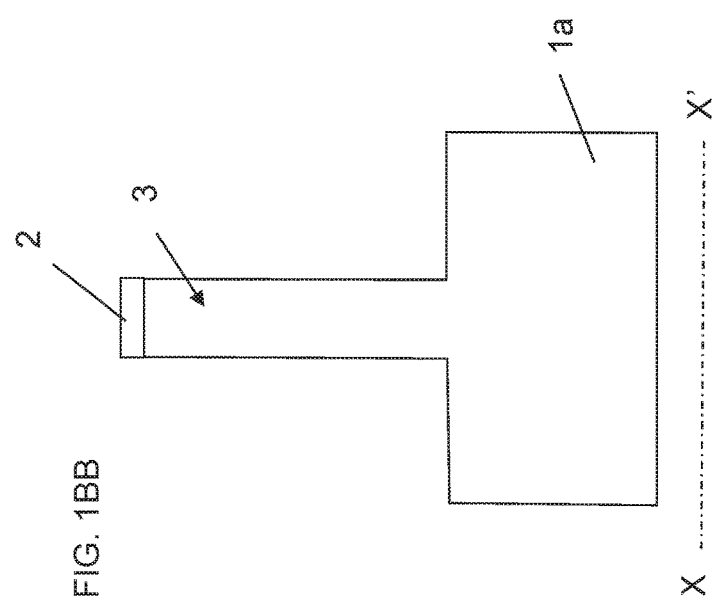

Subsequently, as illustrated in FIGS. 1BA to 1BC, the Si substrate 1 is etched through the mask material layer 2 serving as a mask by an RIE (Reactive Ion Etching) process, to form a Si pillar 3 on a Si substrate 1a.

Figure 1C:
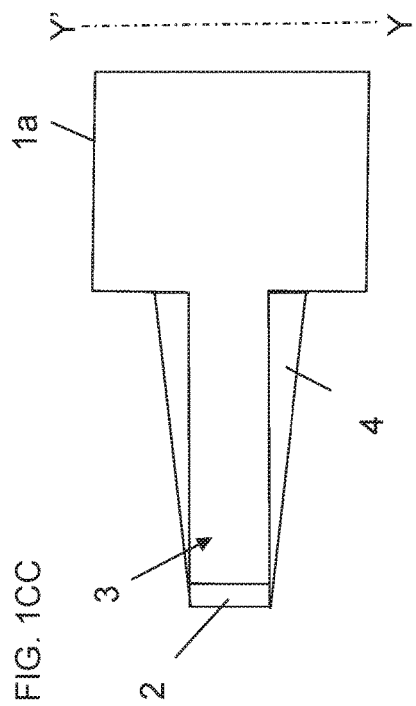
FIGS. 1CA to 1CC are a plan view and sectional structural views that illustrate the method for producing an SGT-including pillar-shaped semiconductor device according to the first embodiment.
Figure 1C:
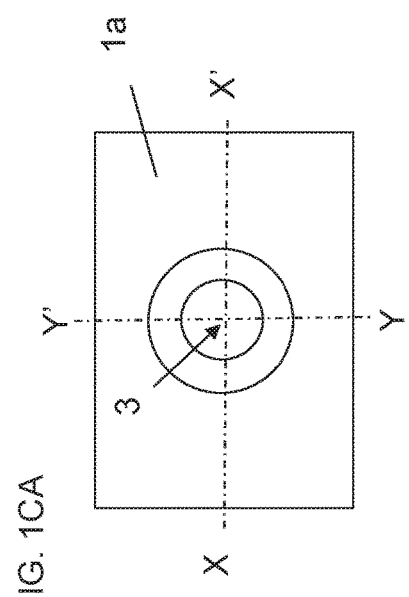
Figure 1C:
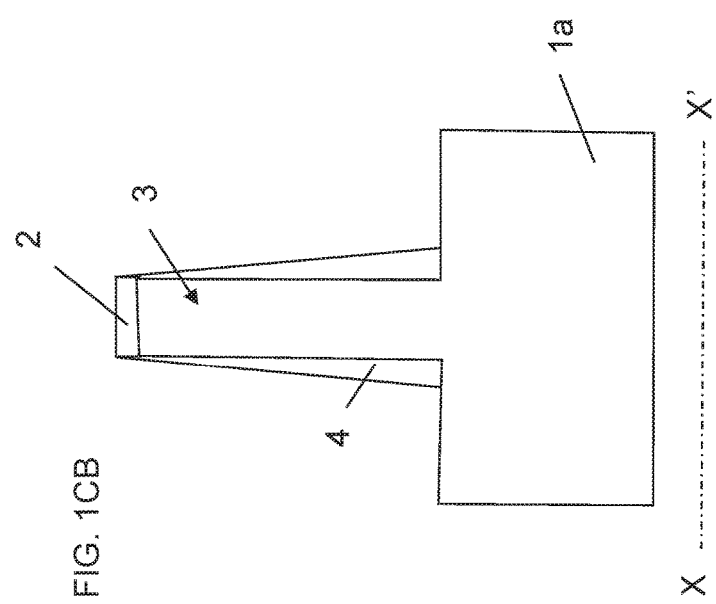

Subsequently, as illustrated in FIGS. 1CA to 1CC, an ALD (Atomic Layer Deposition) process is performed over the whole structure to stack a $SiO_2$ layer, a silicon nitride ($Si_3N_4$) layer, and a $SiO_2$ layer (not shown) in this order so as to cover the surfaces of the Si pillar 3 and the Si substrate 1a. Subsequently, an RIE process is performed to etch these three layers so as to leave a mask material layer 4 disposed around the side surface of the Si pillar 3 and constituted by the $SiO_2$ layer, the $Si_3N_4$ layer, and the $SiO_2$ layer.

Figure 1D:
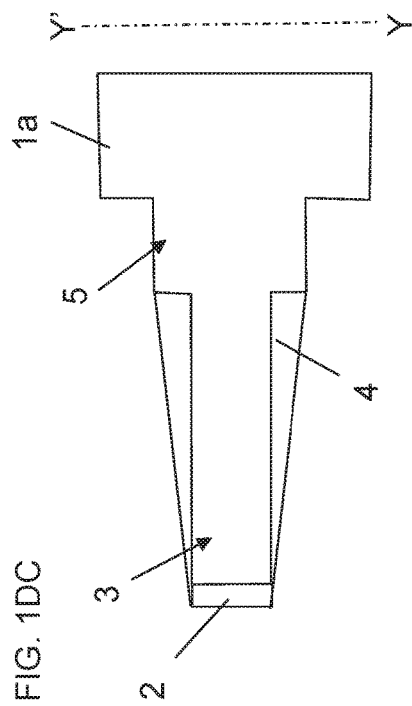
FIGS. 1DA to 1DC are a plan view and sectional structural views that illustrate the method for producing an SGT-including pillar-shaped semiconductor device according to the first embodiment.
Figure 1D:
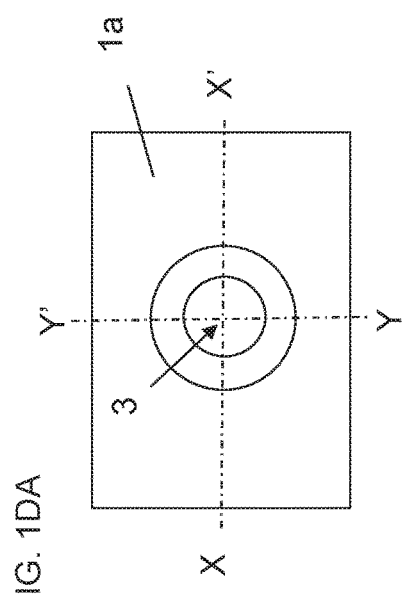
Figure 1D:
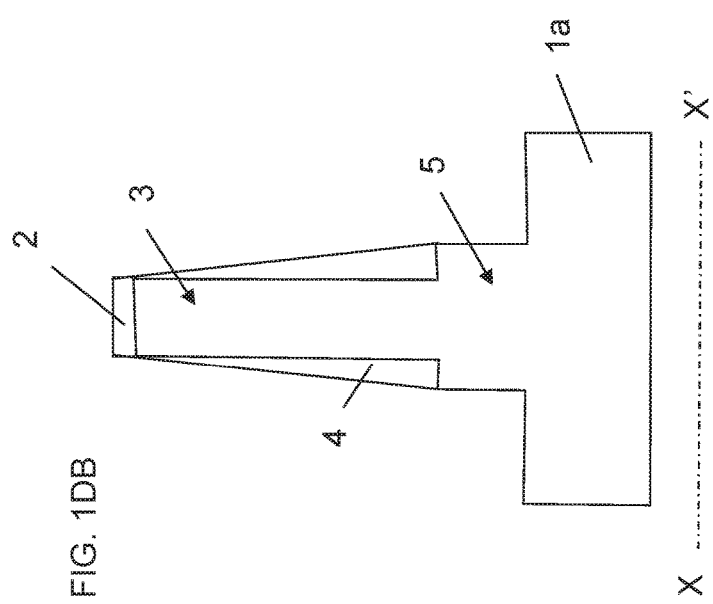

Subsequently, as illustrated in FIGS. 1DA to 1DC, an RIE process is performed to etch the Si substrate 1a through the mask material layers 2 and 4, to form a Si-pillar base part 5 under the Si pillar 3. In this case, the Si-pillar base part 5 is formed so as to surround the Si pillar 3 in plan view.

Subsequently, as illustrated in FIGS. 1EA to 1EC, the mask material layers 2 and 4 are used as masks to selectively oxidize portions formed of Si from their exposed surfaces, to thereby form a $SiO_2$ layer 10, which is a combination of a portion of the lower portion of the Si pillar 3, the whole Si-pillar base part 5, and the surface of the Si substrate 1a. The central portion of the lower portion of the Si pillar 3 is far from the exposed surfaces and is less likely to be oxidized; as a result, a recessed portion 10a is formed in the top portion of the $SiO_2$ layer 10 (the top portion serving as the interface between the $SiO_2$ layer 10 and the Si pillar 3) so as to be recessed toward the center. In addition, a portion (immediately below the Si pillar 3) of the Si substrate 1a is also far from the exposed surfaces and is less likely to be oxidized; as a result, a recessed portion 10b is formed in the bottom portion of the $SiO_2$ layer 10 (the bottom portion serving as the interface between the $SiO_2$ layer 10 and the Si substrate 1a) so as to be recessed toward the center.

Figure 1F:
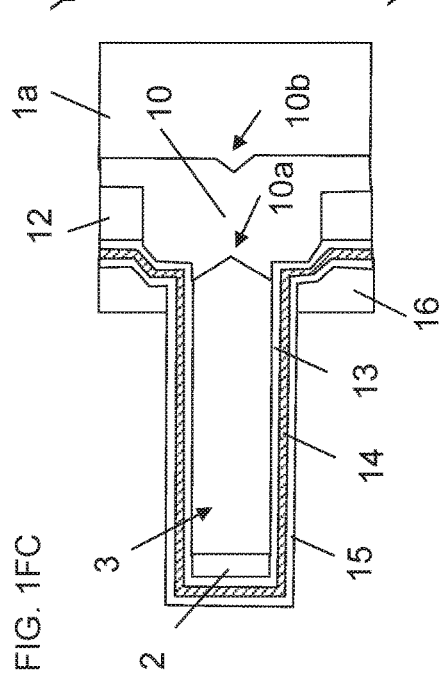
FIGS. 1FA to 1FC are a plan view and sectional structural views that illustrate the method for producing an SGT-including pillar-shaped semiconductor device according to the first embodiment.
Figure 1F:
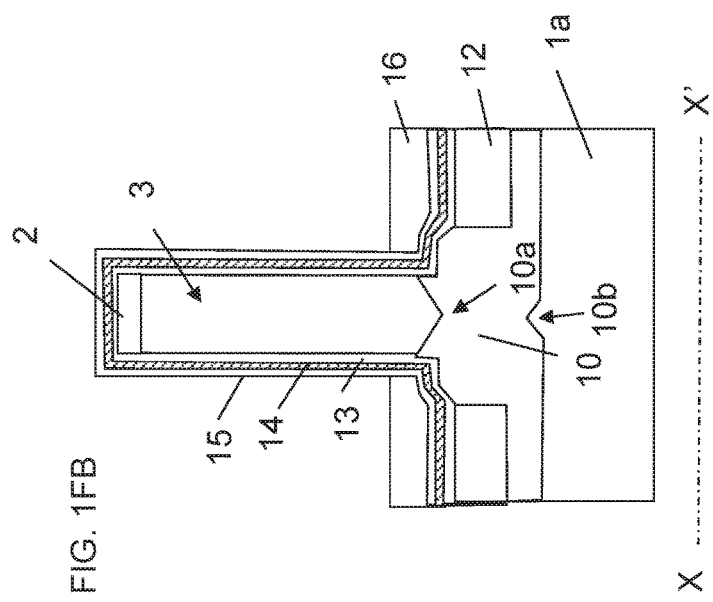
Figure 1F:
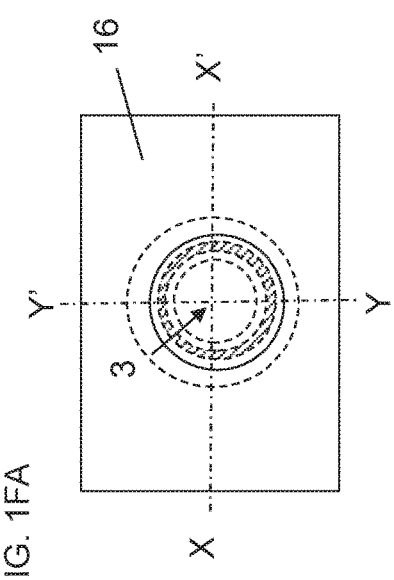

Subsequently, as illustrated in FIGS. 1FA to 1FC, the mask material layer 4 is removed. Subsequently, a $Si_3N_4$ layer 12 is formed on the $SiO_2$ layer 10 that is positioned in a region around the Si pillar 3, so as to have an upper surface positioned at a level at or near the top portion of the $SiO_2$ layer 10. Subsequently, an ALD process is performed over the whole structure to stack a hafnium oxide ($HfO_2$) layer 13, a titanium nitride (TiN) layer 14, and a $SiO_2$ layer 15 in this order. Subsequently, a resist layer 16 is formed on the $SiO_2$ layer 15 that is positioned in a region around the Si pillar 3.

Subsequently, in the step illustrated in FIGS. 1GA to 1GC, hydrogen fluoride gas (hereafter, referred to as "HF gas") is fed to the whole structure. Subsequently, the ambient temperature is increased to, for example, 180° C., so that the HF gas is ionized by water contained within the resist layer 16, to generate hydrogen fluoride ions ($HF_2^+$) (hereafter, referred to as "HF ions"). The HF ions diffuse through the resist layer 16 to etch the $SiO_2$ layer 15 that is in contact with the resist layer 16 (for the mechanism of this etching, refer to Tadashi Shibata, Susumu Kohyama and Hisakazu Iizuka: "A New Field Isolation Technology for High Density MOS LSI", Japanese Journal of Applied Physics, Vol. 18, pp. 263-267 (1979)). On the other hand, the $SiO_2$ layer 15 that is not in contact with the resist layer 16 is substantially not etched and is left as a $SiO_2$ layer 15a. Subsequently, the resist layer 16 is removed. Furthermore, the $SiO_2$ layer 15a is used as a mask to etch the titanium nitride (TiN) layer 14, to thereby form a TiN layer 14a. Subsequently, at least one of the $SiO_2$ layer 15a and the TiN layer 14a is used as a mask to etch the $HfO_2$ layer 13, to thereby form a $HfO_2$ layer 13a. An etchant appropriately selected enables etching of one or both of the $SiO_2$ layer 15a and the TiN layer 14a. Subsequently, the exposed surface layer of the TiN layer 14a is oxidized to form a titanium oxide (TiO) layer 17. In this way, the structure illustrated in FIGS. 1GA to 1GC is provided.

Figure 1G:
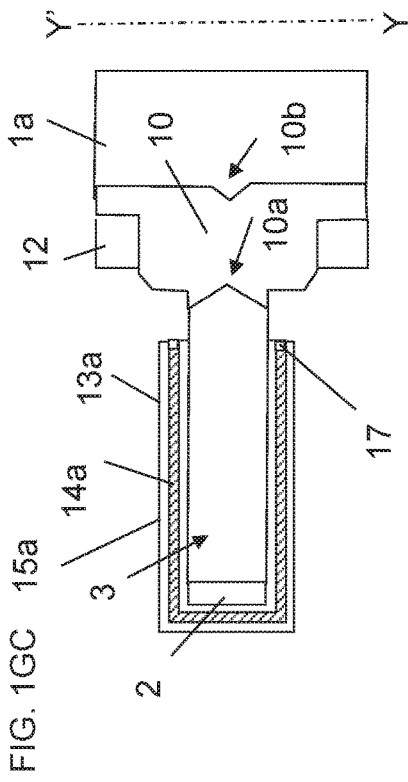
FIGS. 1GA to 1GC are a plan view and sectional structural views that illustrate the method for producing an SGT-including pillar-shaped semiconductor device according to the first embodiment.
Figure 1G:
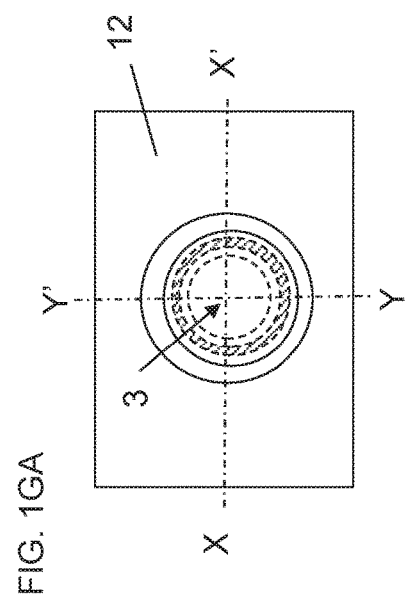
Figure 1G:
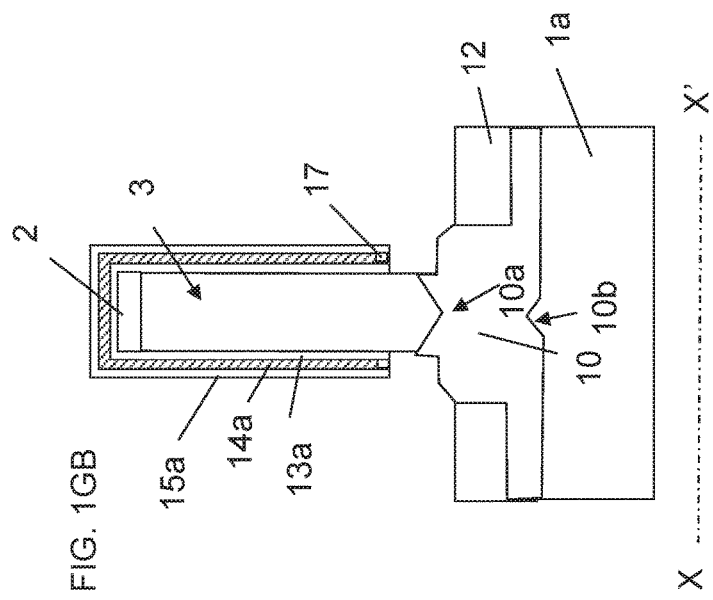
Figure 1H:
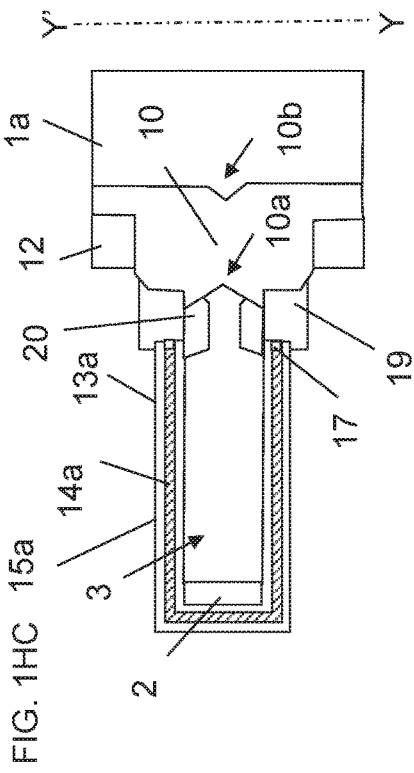
FIGS. 1HA to 1HC are a plan view and sectional structural views that illustrate the method for producing an SGT-including pillar-shaped semiconductor device according to the first embodiment.
Figure 1H:
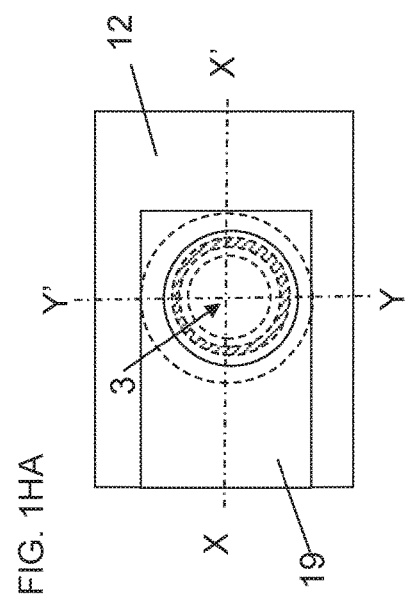
Figure 1H:
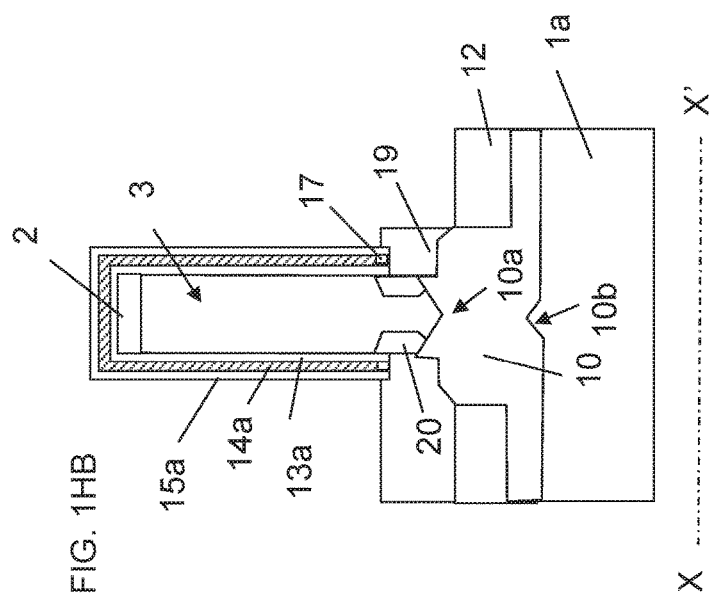

Subsequently, as illustrated in FIGS. 1HA to 1HC, a nickel silicide (NiSi) layer 19 containing, for example, a donor impurity is formed on the $Si_3N_4$ layer 12 so as to surround the Si pillar 3. Subsequently, a heat treatment is performed to diffuse the donor impurity from the NiSi layer 19 into the Si pillar 3, to thereby form an $N^+$ layer 20. Alternatively, the NiSi layer 19 may be replaced by a semiconductor layer containing a donor impurity, such as a Si layer.

Subsequently, as illustrated in FIGS. 1IA to 1IC, a $Si_3N_4$ layer 21 is formed so as to cover the $Si_3N_4$ layer 12 and the NiSi layer 19 and have an upper surface positioned at an intermediate level in the height direction of the Si pillar 3. Subsequently, an intermediate portion of the $SiO_2$ layer 15a is etched, and then a NiSi layer 22 connecting to the TiN layer 14a is formed on the $Si_3N_4$ layer 21.

Figure 1J:
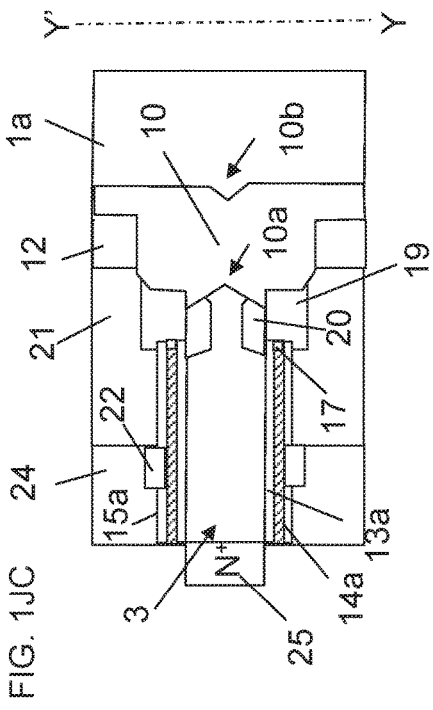
FIGS. 1JA to 1JC are a plan view and sectional structural views that illustrate the method for producing an SGT-including pillar-shaped semiconductor device according to the first embodiment.
Figure 1J:
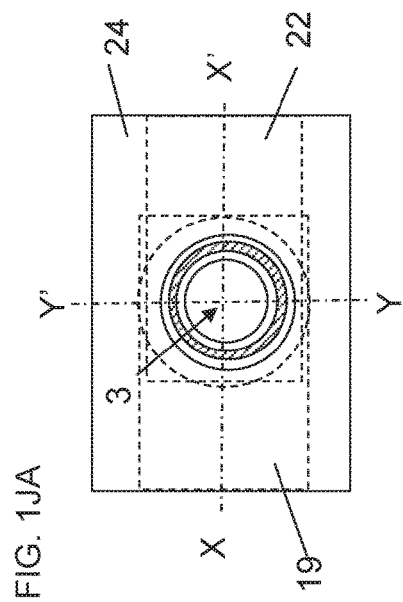
Figure 1J:
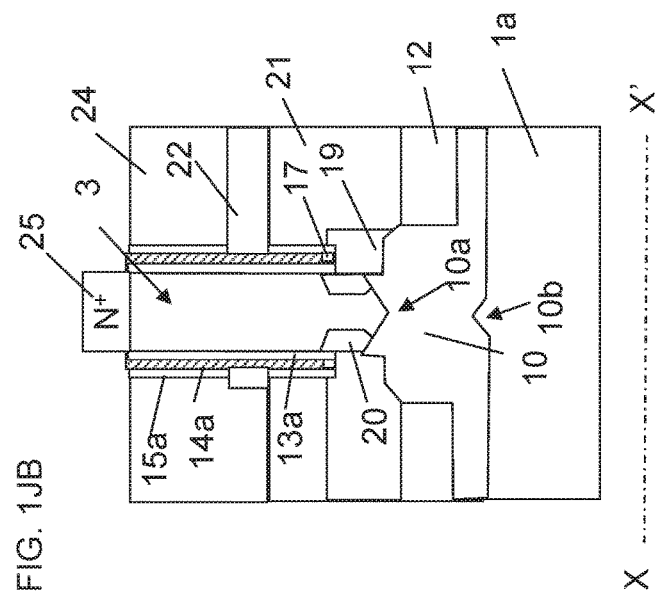

Subsequently, as illustrated in FIGS. 1JA to 1JC, a $SiO_2$ layer 24 is formed so as to have an upper surface positioned at a level below the top portion of the Si pillar 3. Subsequently, the $SiO_2$ layer 24 is used as a mask to remove, from the top portion of the Si pillar, the $SiO_2$ layer 15a, the TiN layer 14a, and the $HfO_2$ layer 13a. Subsequently, an $N^+$ layer 25 is formed by ion implantation, for example.

Subsequently, as illustrated in FIGS. 1KA to 1KC, a $SiO_2$ layer 27 is formed over the whole structure. Subsequently, a contact hole 28a is formed to the NiSi layer 19. Similarly, a contact hole 28b is formed to the $N^+$ layer 25. Similarly, a contact hole 28c is formed to the NiSi layer 22. Subsequently, a wiring metal layer MS is formed on the $SiO_2$ layer 27 so as to connect through the contact hole 28a to the NiSi layer 19. Similarly, a wiring metal layer MD is formed on the $SiO_2$ layer 27 so as to connect through the contact hole 28b to the $N^+$ layer 25. Similarly, a wiring metal layer MG is formed on the $SiO_2$ layer 27 so as to connect through the contact hole 28c to the NiSi layer 22. Thus, an SGT has been formed on the Si substrate 1a.

The production method according to the first embodiment provides the following advantages.

1. The first mask material layer 2 and the second mask material layer 4 each have both of a function of an etching mask during etching of the Si substrate 1a, and a function of an oxidation-resistant mask during formation of the $SiO_2$ layer 10 by oxidation. This enables simplification of the steps, which leads to a reduction in the costs.

2. The Si-pillar base part 5, which is formed with the first mask material layer 2 and the second mask material layer 4 serving as etching masks, surrounds the side surface of the Si pillar 3 in plan view. In other words, the Si-pillar base part 5 is formed by self-alignment without the necessity of performing a mask alignment step in a lithographic process. Thus, a high-density SGT-including circuit is formed at low costs.

3. The $SiO_2$ layer 10, which supports the Si pillar 3 in which the SGT is formed, is wider than the Si pillar 3 in plan view, so that the Si pillar 3 resists external stress and is less likely to collapse. Because of the difference between the stress coefficients of $SiO_2$ and Si, the interface between the Si pillar 3 and the $SiO_2$ layer 10 is relatively weak; when a step such as a washing step applies a force to the Si pillar 3, the Si pillar 3 may separate from the $SiO_2$ layer 10 and collapse; however, this is prevented by the recessed portion 10a formed at the interface between the Si pillar 3 and the $SiO_2$ layer 10. Similarly, the recessed portion 10b prevents the $SiO_2$ layer 10 from separating from the Si substrate 1a and collapsing. This is particularly advantageous when the $SiO_2$ layer 10 is formed so as to have a large height in order to enhance the effect of insulation between the Si substrate 1a and the SGT. The narrower the Si pillar 3 and the $SiO_2$ layer 10 (in particular, a portion derived from the Si-pillar base part 5) are formed in order to increase the density of the circuit, the more important the above-described three stabilization effects become.

4. As illustrated in FIGS. 1KA to 1KC, the $SiO_2$ layer 10 is formed so as to connect to the whole bottom portion of the Si pillar 3 and the surface layer of the Si substrate 1a. As a result, the SGT formed in the Si pillar 3 is insulated by the $SiO_2$ layer 10 from the Si substrate 1a. This means that using not an SOI substrate but the Si substrate 1a still provides the advantages due to use of an SOI substrate. In other words, the necessity of forming a P well and an N well has been eliminated, which have been formed in the case of forming an SGT-including CMOS circuit with a Si substrate. Thus, the necessity of using expensive SOI wafers and the necessity of forming P wells and N wells have been eliminated, which enables a considerable reduction in the production costs.

Second Embodiment

Hereinafter, with reference to FIG. 2AA to FIG. 2FC, a method for producing an SGT-including pillar-shaped semiconductor device according to a second embodiment of the present invention will be described. Among FIG. 2AA to FIG. 2FC, figures suffixed with A are plan views; figures suffixed with B are sectional structural views taken along lines X-X' in the corresponding figures suffixed with A; and figures suffixed with C are sectional structural views taken along lines Y-Y' in the corresponding figures suffixed with A. The production method according to the second embodiment is the same as in the steps according to the first embodiment illustrated in FIG. 1AA to FIG. 1KC except for the following differences.

Figure 2A:
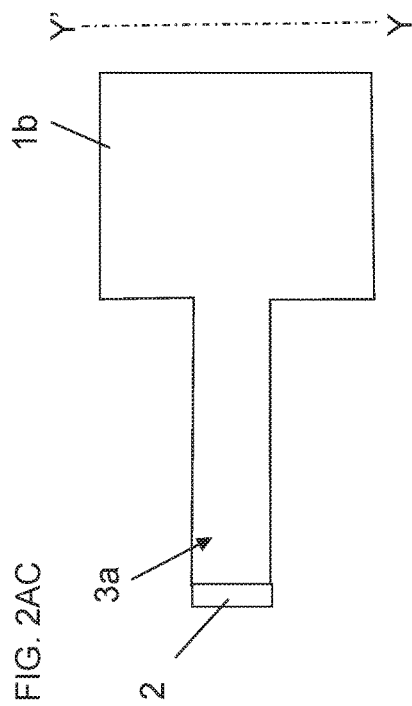
FIGS. 2AA to 2AC are a plan view and sectional structural views that illustrate a method for producing an SGT-including pillar-shaped semiconductor device according to a second embodiment of the present invention.
Figure 2A:
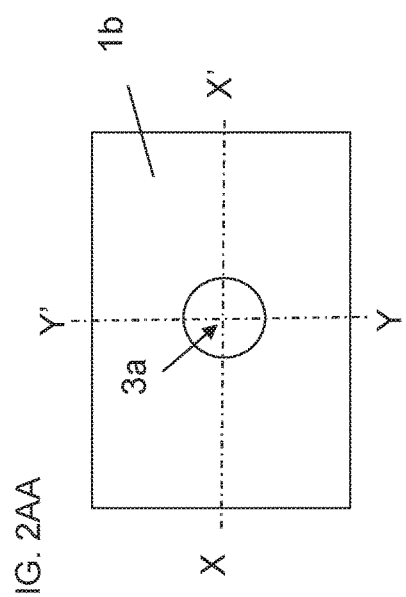
Figure 2A:
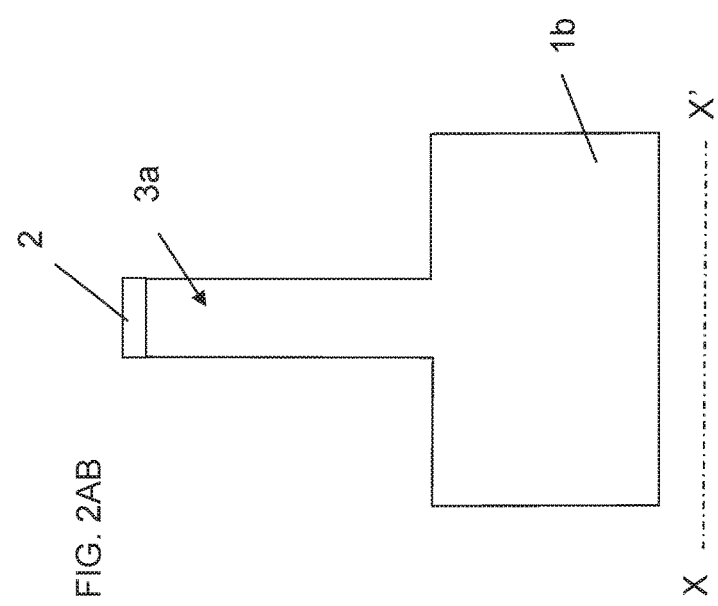

As illustrated in FIGS. 2AA to 2AC, a mask material layer 2 is used as a mask to etch a Si substrate 1b by an RIE process, to form a Si pillar 3a on the Si substrate 1b. Incidentally, the mask material layer 2 may be formed of a material not providing the function of an oxidation-resistant mask as long as it functions as an etching mask.

Figure 2B:
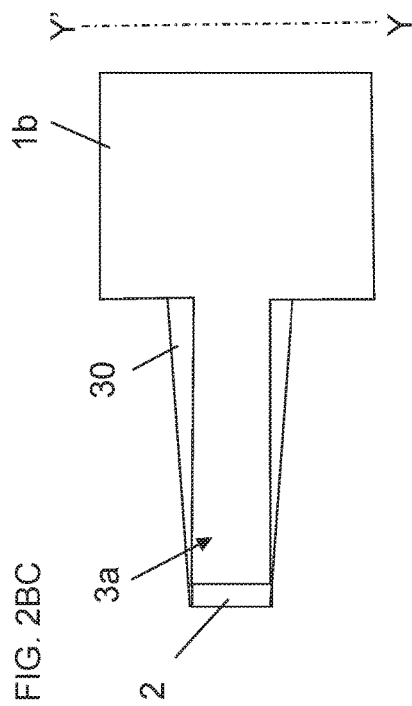
FIGS. 2BA to 2BC are a plan view and sectional structural views that illustrate the method for producing an SGT-including pillar-shaped semiconductor device according to the second embodiment.
Figure 2B:
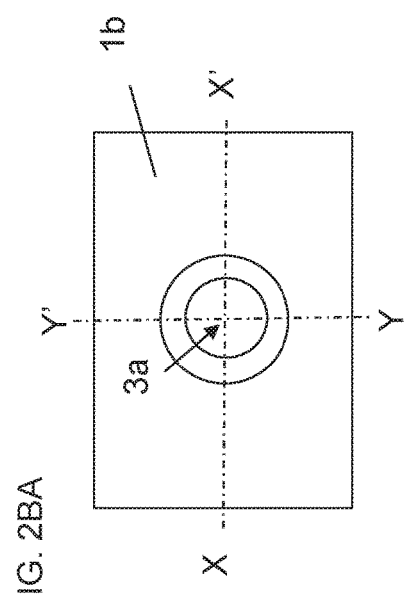
Figure 2B:
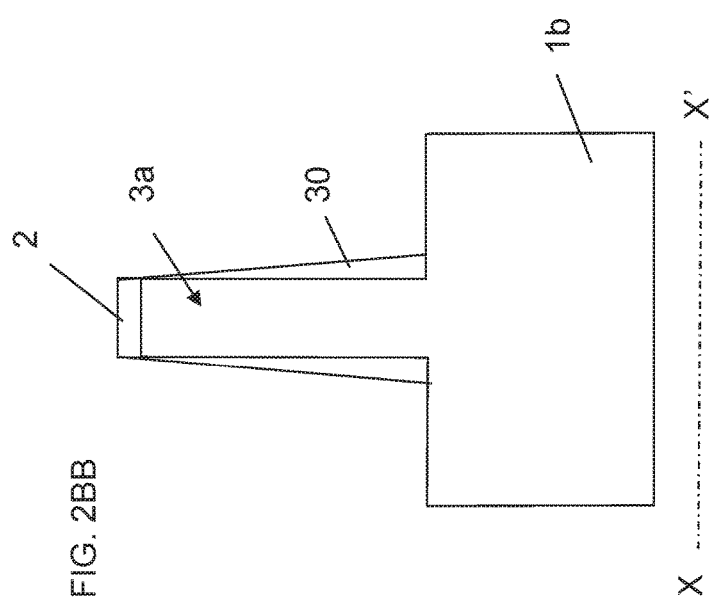

Subsequently, as illustrated in FIGS. 2BA to 2BC, as with the mask material layer 4 according to the first embodiment, a mask material layer 30 is formed so as to surround the outer circumferential side surface of the Si pillar 3a. Incidentally, the mask material layer 30 may be formed of a material not providing the function of an oxidation-resistant mask as long as it functions as an etching mask.

Figure 2C:
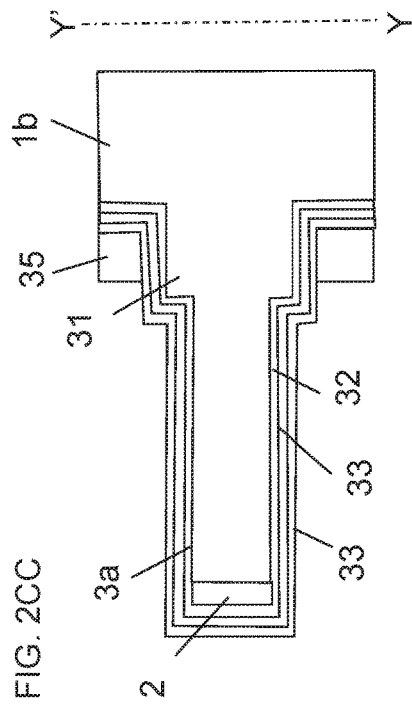
FIGS. 2CA to 2CC are a plan view and sectional structural views that illustrate the method for producing an SGT-including pillar-shaped semiconductor device according to the second embodiment.
Figure 2C:
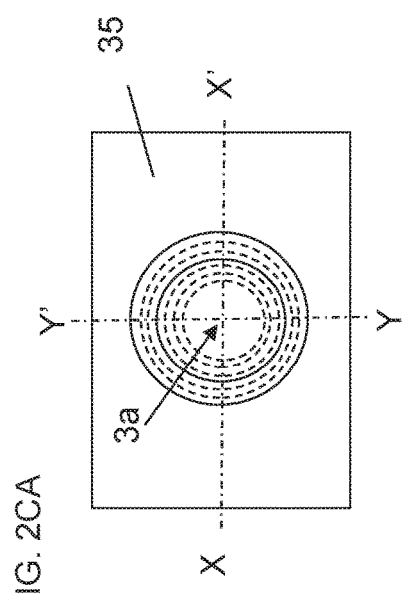
Figure 2C:
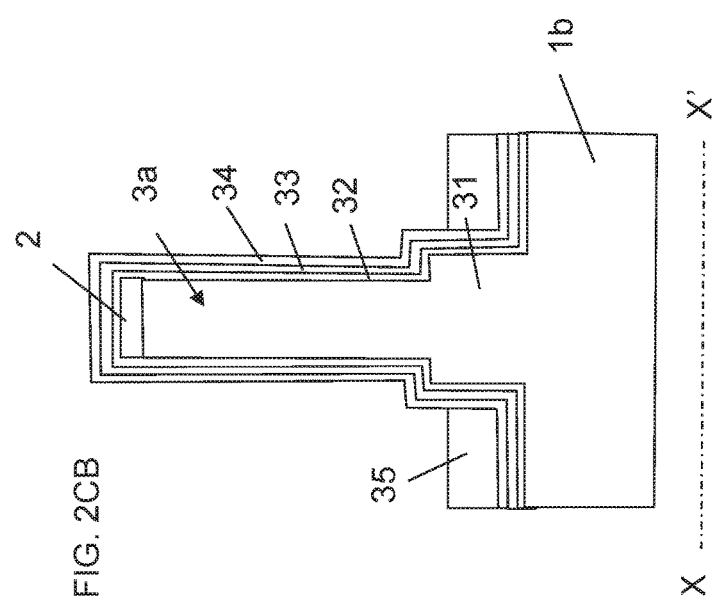

Subsequently, as illustrated in FIGS. 2CA to 2CC, an RIE process is performed through the mask material layers 2 and 30 serving as masks to etch the Si substrate 1b, to thereby form a Si-pillar base part 31 under the Si pillar 3a so as to surround the Si pillar 3a in plan view. Subsequently, the mask material layer 30 is removed; an ALD process is then performed over the whole structure to stack a $SiO_2$ layer 32, a $Si_3N_4$ layer 33, and a $SiO_2$ layer 34 in this order. Subsequently, a resist layer 35 is formed in a region around the Si-pillar base part 31 so as to have an upper surface positioned lower than the upper surface of the Si-pillar base part 31.

Subsequently, as illustrated in FIGS. 2DA to 2DC, the same process as in FIGS. 1GA to 1GC is performed to etch portions (adjacent to the resist layer 35) of the $SiO_2$ layer 32, the $Si_3N_4$ layer 33, and the $SiO_2$ layer 34. Subsequently, the resist layer 35 is removed. This provides a $SiO_2$ layer 32a, a $Si_3N_4$ layer 33a, and a $SiO_2$ layer 34a, which cover the upper portion of the Si-pillar base part 31 and the Si pillar 3a.

Figure 2E:
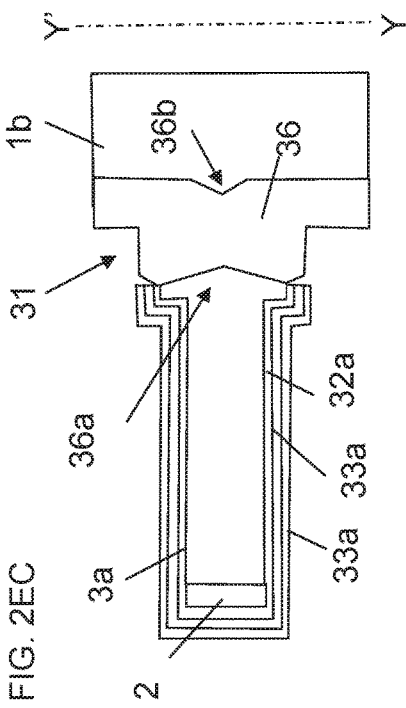
FIGS. 2EA to 2EC are a plan view and sectional structural views that illustrate the method for producing an SGT-including pillar-shaped semiconductor device according to the second embodiment.
Figure 2E:
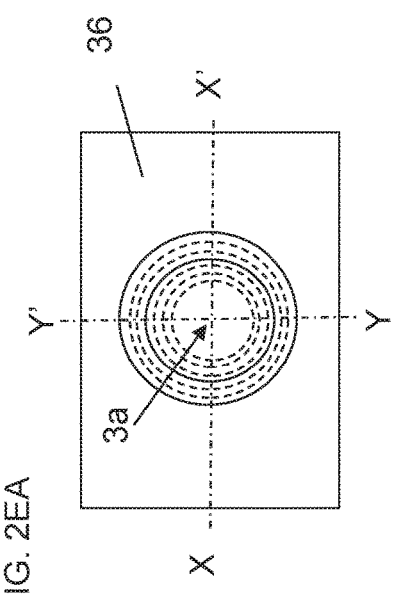
Figure 2E:
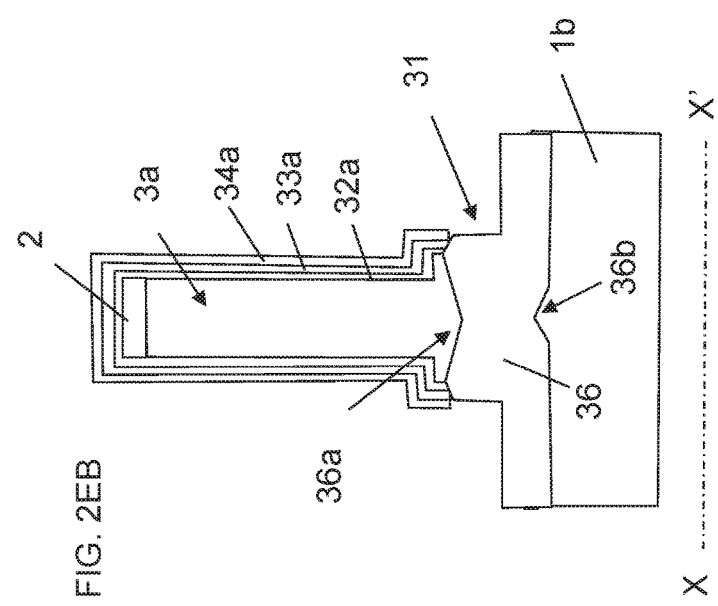

Subsequently, as illustrated in FIGS. 2EA to 2EC, wet oxidation is performed to oxidize the surface layer of the Si substrate 1b and the bottom portion of the Si-pillar base part 31, which are not covered by the $Si_3N_4$ layer 33a, to thereby form a $SiO_2$ layer 36. The $SiO_2$ layer 36 is formed through the $Si_3N_4$ layer 33a serving as a mask, so that the central portion is less likely to be oxidized. As a result, recessed portions 36a and 36b are formed in upper and lower regions of the Si-pillar base part 31. Subsequently, the $SiO_2$ layer 32a, the $Si_3N_4$ layer 33a, and the $SiO_2$ layer 34a are removed.

Subsequently, the same steps as in FIG. 1FA to FIG. 1KC are performed to thereby form, as illustrated in FIGS. 2FA to 2FC, an SGT on the Si substrate 1b. In the top portion of the remaining Si-pillar base part 31, an impurity region serving as the source or drain of the SGT and containing donor impurity atoms may be formed so as to be in contact with the Si pillar 3a. In this case, formation of the NiSi layer 19 and the $N^+$ layer 20 is no longer necessary. The contact hole 28a is formed so as to extend to the impurity region in the top portion of the remaining Si-pillar base part 31. On or within the top portion of the remaining Si-pillar base part 31, a single semiconductor layer or a plurality of semiconductor layers containing metal, alloy, or donor or acceptor impurity atoms may be formed.

The production method according to the second embodiment provides the following advantages.

1. In this embodiment, the SiO$_2$ layer 36 having, in its upper and lower regions, the recessed portions 36a and 36b is formed in the Si-pillar base part 31, which is wider than the Si pillar 3a. The interface between the Si pillar 3a and the SiO$_2$ layer 36 is positioned within the wide Si-pillar base part 31. As a result, in subsequent steps, the Si pillar 3a is even less likely to collapse.

2. The SiO$_2$ layer 36 is formed so as to connect to the whole bottom portion of the Si-pillar base part 31 and the surface layer of the Si substrate 1b. As a result, the SGT formed in the Si pillar 3a is insulated by the SiO$_2$ layer 36 from the Si substrate 1b. This means, as in the first embodiment, elimination of the necessity of use of SOI substrates and elimination of the necessity of formation of P wells and N wells during formation of SGT-including CMOS circuits. This enables a considerable reduction in the production costs.

3. In the first embodiment, the mask material layers 2 and 4 have both of a function of an etching mask and a function of an oxidation-resistant mask. By contrast, in this embodiment, the mask material layers 2 and 30 may be formed to have the function of an etching mask alone. This increases the degree of freedom of selecting materials for the mask material layers 2 and 30 and the oxidation-resistant mask (in this embodiment, the SiO$_2$ layer 32a, the Si$_3$N$_4$ layer 33a, and the SiO$_2$ layer 34a).

Third Embodiment

Hereinafter, with reference to FIG. 3AA to FIG. 3EC, a method for producing an SGT-including pillar-shaped semiconductor device according to a third embodiment of the present invention will be described. Among FIG. 3AA to FIG. 3EC, figures suffixed with A are plan views; figures suffixed with B are sectional structural views taken along lines X-X' in the corresponding figures suffixed with A; and figures suffixed with C are sectional structural views taken along lines Y-Y' in the corresponding figures suffixed with A. The production method according to the third embodiment is the same as in the steps according to the first embodiment illustrated in FIG. 1AA to FIG. 1KC except for the following differences.

Figure 3A:
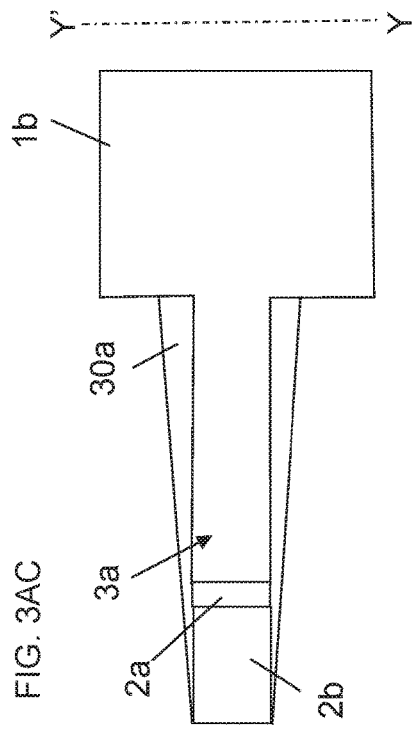
FIGS. 3AA to 3AC are a plan view and sectional structural views that illustrate a method for producing an SGT-including pillar-shaped semiconductor device according to a third embodiment of the present invention.
Figure 3A:
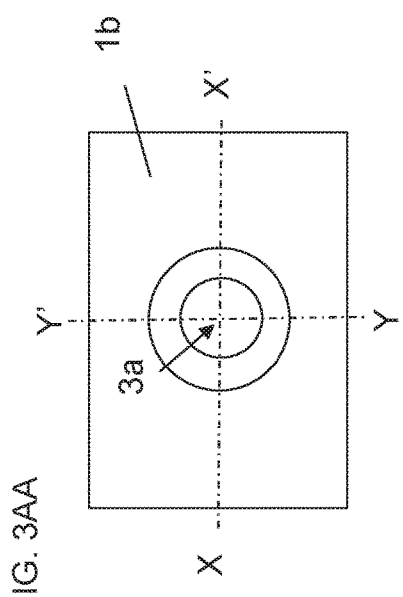
Figure 3A:
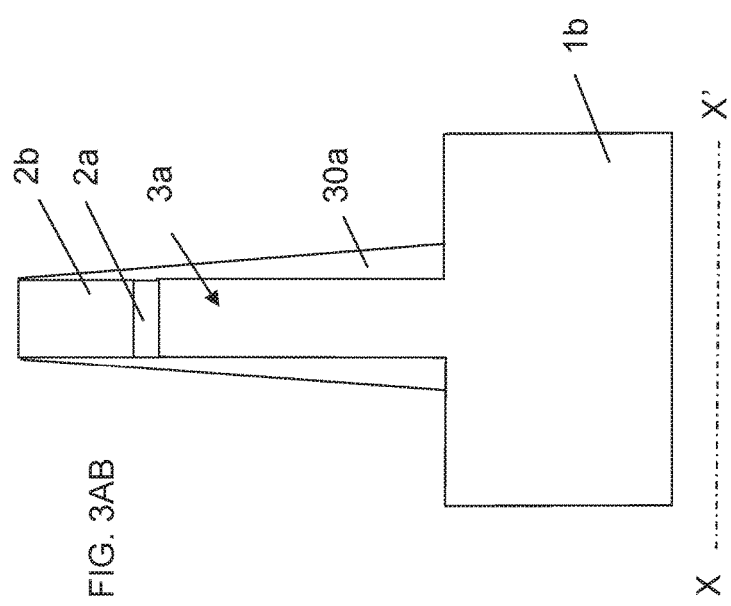

As illustrated in FIGS. 3AA to 3AC, on a Si substrate 1 (not shown), a Si$_3$N$_4$ layer 2a and a SiO$_2$ layer 2b that have a circular shape in plan view are stacked in this order. The Si$_3$N$_4$ layer 2a and the SiO$_2$ layer 2b are used as masks to etch the Si substrate 1 by an RIE process, to thereby form a Si pillar 3a on the Si substrate 1b. Subsequently, an ALD process is performed over the whole structure to stack a SiO$_2$ layer, a Si$_3$N$_4$ layer, and a SiO$_2$ layer (not shown) in this order so as to cover the surfaces of the Si pillar 3a and the Si substrate 1b. Subsequently, an RIE process is performed to etch these three layers so as to leave a mask material layer 30a constituted by the SiO$_2$ layer, the silicon nitride (Si$_3$N$_4$) layer, and the SiO$_2$ layer that surround the side surface of the Si pillar 3a.

Subsequently, as illustrated in FIGS. 3BA to 3BC, an RIE process is performed to etch the Si substrate 1b through the SiO$_2$ layer 2b and the mask material layer 30a serving as masks, to thereby form a Si-pillar base part 31a under the Si pillar 3a. In this case, the Si-pillar base part 31a is formed so as to surround the Si pillar 3a in plan view. In the etching by an RIE process, the width Ls of the bottom portion of the mask material layer 30a surrounding the Si pillar 3a in plan view can be changed by changing the height Lh of the SiO$_2$ layer 2b. In this way, the Si-pillar base part 31a can be formed so as to have a desired diameter Ld. Alternatively, the Si-pillar base part 31a can also be formed so as to have a desired diameter Ld by changing the thickness of the mask material layer 30a deposited to change the thickness Ls of the bottom portion of the mask material layer 30a.

Subsequently, as illustrated in FIGS. 3CA to 3CC, the Si$_3$N$_4$ layer 2a and the mask material layer 30a are used as masks to selectively oxidize portions formed of Si from their exposed surfaces, to thereby form a SiO$_2$ layer 37, which is a combination of a portion of the lower portion of the Si pillar 3a, the whole Si-pillar base part 31a, and the surface of the Si substrate 1b. The central portion of the lower portion of the Si pillar 3a is far from the exposed surfaces and is less likely to be oxidized; as a result, a recessed portion 37a is formed in the top portion of the SiO$_2$ layer 37 (the top portion serving as the interface between the SiO$_2$ layer 37 and the Si pillar 3a) so as to be recessed toward the center. A portion (immediately below the Si pillar 3a) of the Si substrate 1b is also far from the exposed surfaces and less likely to be oxidized; as a result, a recessed portion 37b is formed in the bottom portion of the SiO$_2$ layer 37 (the bottom portion serving as the interface between the SiO$_2$ layer 37 and the Si substrate 1b) so as to be recessed toward the center.

Figure 3D:
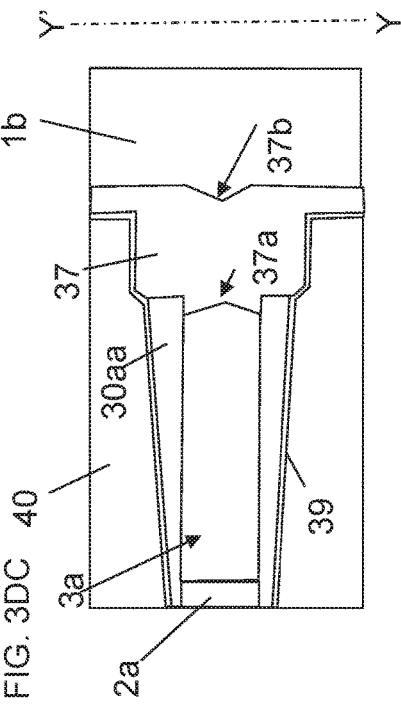
FIGS. 3DA to 3DC are a plan view and sectional structural views that illustrate the method for producing an SGT-including pillar-shaped semiconductor device according to the third embodiment.
Figure 3D:
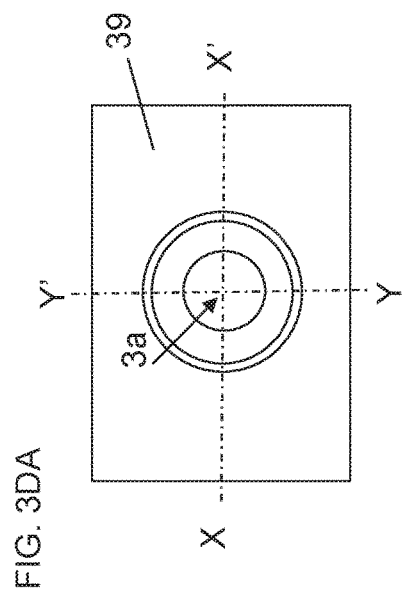
Figure 3D:
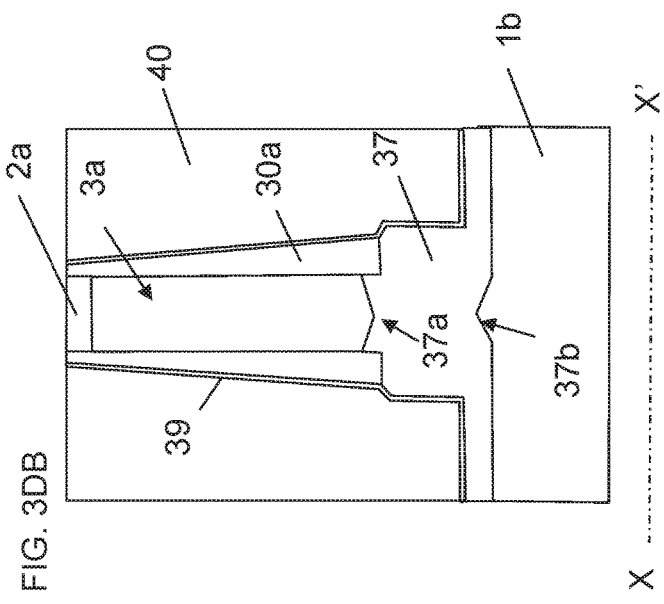

Subsequently, as illustrated in FIGS. 3DA to 3DC, an ALD process is performed to deposit a Si$_3$N$_4$ layer (not shown) over the whole structure. Subsequently, a SiO$_2$ layer (not shown) is deposited over the whole structure. Subsequently, a CMP (Chemical Mechanical Polishing) process is performed to polish the structure down to the level of the upper surface of the Si$_3$N$_4$ layer 2a, to thereby form a Si$_3$N$_4$ layer 39 and a SiO$_2$ layer 40.

Subsequently, as illustrated in FIGS. 3EA to 3EC, the SiO$_2$ layer 40, the Si$_3$N$_4$ layers 2a and 39, and the mask material layer 30a are removed. Subsequently, the steps as in FIG. 1FA to FIG. 1KC are performed. This forms an SGT disposed on the Si substrate 1b and isolated from the Si substrate 1b by the SiO$_2$ layer 37.

The production method according to the third embodiment provides the following advantages: as illustrated in FIGS. 3BA to 3BC, by changing the height Lh of the SiO$_2$ layer 2b or by changing the thickness of the mask material layer 30a deposited, the Si-pillar base part 31a is formed so as to have a desired diameter Ld.

Fourth Embodiment

Hereinafter, with reference to FIG. 4AA to FIG. 4EC, a method for producing an SGT-including pillar-shaped semiconductor device according to a fourth embodiment of the present invention will be described. In this embodiment, two SGTs are formed on a single elongated Si-pillar base part, to produce a CMOS inverter circuit. Among FIG. 4AA to FIG. 4EC, figures suffixed with A are plan views; figures suffixed with B are sectional structural views taken along lines X-X' in the corresponding figures suffixed with A; and figures suffixed with C are sectional structural views taken along lines Y-Y' in the corresponding figures suffixed with A. The production method according to the fourth embodiment is the same as in the steps according to the first embodiment illustrated in FIG. 1AA to FIG. 1KC except for the following differences.

As illustrated in FIGS. 4AA to 4AC, on a Si substrate 1 (not shown), a $Si_3N_4$ layer 2aa and a $SiO_2$ layer 2ab are stacked in this order; on the Si substrate 1, a $Si_3N_4$ layer 2ba and a $SiO_2$ layer 2bb are stacked in this order; an RIE process is performed through these combinations of layers serving as masks, to form Si pillars 3aa and 3ab, which stand adjacent to each other. Subsequently, an ALD process is performed over the whole structure to stack a $SiO_2$ layer, a $Si_3N_4$ layer, and a $SiO_2$ layer (not shown) in this order so as to cover the surfaces of the Si pillars 3aa and 3ab and a Si substrate 1c. Subsequently, an RIE process is used to etch these three layers so as to leave a mask material layer 30b, which surrounds the side surfaces of the Si pillars 3aa and 3ab, also continuously extends between the Si pillars 3aa and 3ab, and is constituted by the $SiO_2$ layer, the $Si_3N_4$ layer, and the $SiO_2$ layer. The portion (continuously extending between the Si pillars 3aa and 3ab) of the mask material layer 30b can be formed by, for example, appropriately adjusting the height of the $SiO_2$ layers 2ab and 2bb or the distance between the Si pillars 3aa and 3ab.

Subsequently, as illustrated in FIGS. 4BA to 4BC, the $SiO_2$ layers 2ab and 2bb and the mask material layer 30b are used as masks and an RIE process is performed to etch the Si substrate 1c, to form a Si-pillar base part 41.

Subsequently, as illustrated in FIGS. 4CA to 4CC, selective oxidation is performed through the $Si_3N_4$ layers 2aa and 2ba and the mask material layer 30b serving as masks, to form a $SiO_2$ layer 42, which is a combination of portions of the lower portions of the Si pillars 3ba and 3bb, the whole Si-pillar base part 41, and the surface of the Si substrate 1c. As with the recessed portions 10a and 10b in the first embodiment, as illustrated in FIG. 4CC, recessed portions 42a and 42b are formed in the upper and lower regions of the $SiO_2$ layer 42. The recessed portion 42b has a width along line X-X', the width being larger than that of the recessed portion 10b.

Figure 4D:
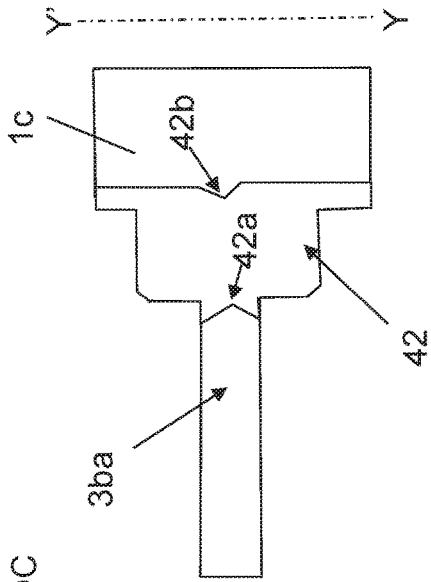
FIGS. 4DA to 4DC are a plan view and sectional structural views that illustrate the method for producing an SGT-including pillar-shaped semiconductor device according to the fourth embodiment.
Figure 4D:
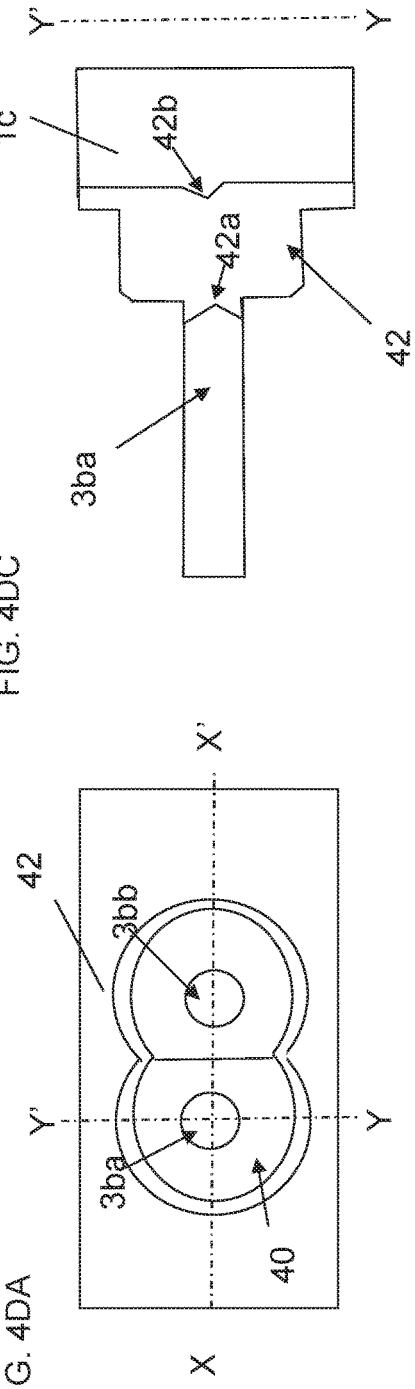
Figure 4D:
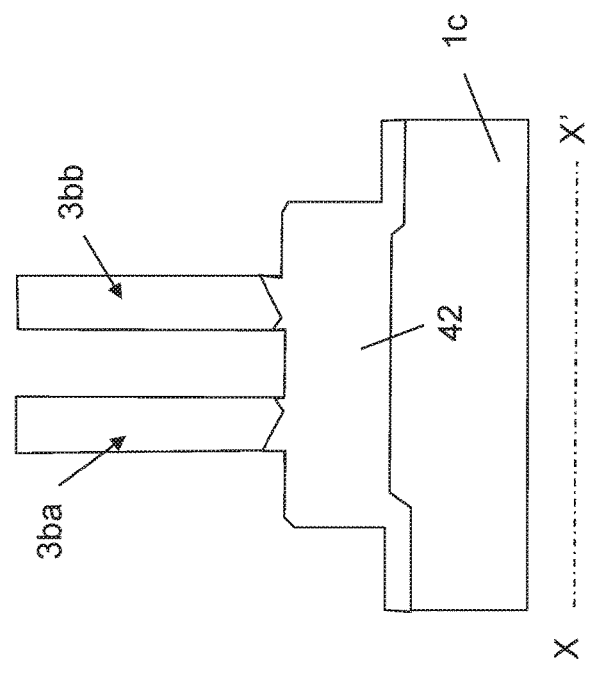

Subsequently, as illustrated in FIGS. 4DA to 4DC, the $SiO_2$ layers 2ab and 2bb, the $Si_3N_4$ layers 2aa, 2ba, and 39, and the mask material layer 30b are removed.

Subsequently, as illustrated in FIGS. 4EA to 4EC, the same steps as in FIG. 1FA to 1KC are performed, to form a CMOS inverter circuit in which the Si substrate 1c and the two SGTs are isolated by the $SiO_2$ layer 42. The $Si_3N_4$ layer 45 is formed in regions around the Si pillars 3ba and 3bb so as to have an upper surface positioned at the same level as the level of the upper surface of the $SiO_2$ layer 42. Subsequently, the same steps as in FIG. 1GA to FIG. 1HC are performed, to form gate insulating $HfO_2$ layers 46a and 46b, gate conductor TiN layers 47a and 47b, and $SiO_2$ layers 48a and 48b so as to surround the Si pillars 3ba and 3bb. Subsequently, Si surfaces of the bottom portions of the Si pillars 3ba and 3bb are exposed. Subsequently, a wiring NiSi layer 50a and a wiring NiSi layer 50b are formed: the wiring NiSi layer 50a contains, for example, an acceptor impurity and is in contact with the Si surfaces of the bottom portions of the Si pillars 3ba and 3bb; and the wiring NiSi layer 50b connects to the wiring NiSi layer 50a and contains a donor impurity. Subsequently, a heat treatment is performed, to form a $P^+$ layer 43a in the bottom portion of the Si pillar 3ba, and an $N^+$ layer 43b in the bottom portion of the Si pillar 3bb. Subsequently, a $Si_3N_4$ layer 51 is formed so as to have an upper surface (in the height direction) positioned at a level corresponding to an intermediate portion of the gate conductor TiN layer 47a, and surround the Si pillars 3ba and 3bb. Subsequently, portions of the $SiO_2$ layers 48a and 48b are etched off, and then a wiring NiSi layer 52 is formed on the $Si_3N_4$ layer 51 so as to be in contact with the outer circumferences of the gate conductor TiN layers 47a and 47b. Subsequently, a $SiO_2$ layer 53 is formed so as to have an upper surface (in the height direction) positioned lower than the top portions of the gate conductor TiN layers 47a and 47b. Subsequently, a $P^+$ layer 54a and an $N^+$ layer 54b are formed in the top portions of the Si pillars 3ba and 3bb by ion implantation, for example. Subsequently, a $SiO_2$ layer 56 is formed over the whole structure. Subsequently, a contact hole 57a is formed so as to extend from the upper surface of the $SiO_2$ layer 56 to the wiring NiSi layer 50a; a contact hole 57b is formed so as to extend from the upper surface of the $SiO_2$ layer 56 to the $P^+$ layer 54a; a contact hole 57c is formed so as to extend from the upper surface of the $SiO_2$ layer 56 to the wiring NiSi layer 52; and a contact hole 57d is formed so as to extend from the upper surface of the $SiO_2$ layer 56 to the $N^+$ layer 54b. Subsequently, an output wiring metal layer Vout is formed so as to connect through the contact hole 57a to the wiring NiSi layer 50; a power supply wiring metal layer Vdd is formed so as to connect through the contact hole 57b to the $P^+$ layer 54a; an input wiring metal layer Vin is formed so as to connect through the contact hole 57c to the wiring NiSi layer 52; and a ground wiring metal layer Vss is formed so as to connect through the contact hole 57d to the $N^+$ layer 54b.

The production method according to the fourth embodiment provides the following advantages.

1. In this embodiment, since the Si-pillar base part 41 is widely formed so as to continuously extend under the two Si pillars 3ba and 3bb, the Si pillars 3ba and 3bb resists an external stress in the X-X' direction, and are less likely to collapse. The Si pillars 3ba and 3bb and the $SiO_2$ layer 42 also resist another external stress in the Y-Y' direction, and are less likely to collapse because of, as in the first embodiment, the presence of the recessed portions 42a and 42b in the upper and lower regions of the $SiO_2$ layer 42.

2. The $SiO_2$ layer 42 is formed so as to extend through the whole bottom portion of the Si-pillar base part 41 to the surface layer of the Si substrate 1c. As a result, the SGTs formed in the Si pillars 3ba and 3bb are insulated by the $SiO_2$ layer 42 from the Si substrate 1c. This means, as in the first embodiment, elimination of the necessity of use of SOI substrates and elimination of the necessity of formation of P wells and N wells during formation of SGT-including CMOS circuits. This enables a considerable reduction in the production costs.

Fifth Embodiment

Hereinafter, with reference to FIG. 5AA to FIG. 5EC, a method for producing a CMOS inverter circuit including a double-stacked SGT according to a fifth embodiment of the present invention will be described. Among FIG. 5AA to FIG. 5EC, figures suffixed with A are plan views; figures suffixed with B are sectional structural views taken along lines X-X' in the corresponding figures suffixed with A; and figures suffixed with C are sectional structural views taken along lines Y-Y' in the corresponding figures suffixed with A. The production method according to the fifth embodiment is the same as in the steps according to the first embodiment illustrated in FIG. 1AA to FIG. 1KC except for the following differences.

As illustrated in FIGS. 5AA to 5AC, a mask material layer 2c (formed as with the mask material layer 2 of the first embodiment) is used as a mask and an RIE process is performed to form a Si pillar 3c; an ALD process is performed to form a $SiO_2$ layer (not shown), a $Si_3N_4$ layer (not shown), and a $SiO_2$ layer (not shown) so as to cover the entirety of the Si pillar 3c and a Si substrate 1e. Subsequently, the SiO₂ layer, the Si₃N₄ layer, and the SiO₂ layer are removed so as to expose the Si surfaces of the bottom portion of the Si pillar 3c and the upper surface of the Si substrate 1e, to thereby form a SiO₂ layer 73, a Si₃N₄ layer 74, and a SiO₂ layer 75. Subsequently, the SiO₂ layer 73, the Si₃N₄ layer 74, and the SiO₂ layer 75 are used as masks and the bottom portion of the Si pillar 3c and the adjoining upper surface of the Si substrate 1e are selectively oxidized to form a SiO₂ layer 72. As a result, recessed portions 72a and 72b are formed in the upper and lower regions of the SiO₂ layer 72 under the Si pillar 3c.

Subsequently, as illustrated in FIGS. 5BA to 5BC, a Si₃N₄ layer 76 is formed in a region around the Si pillar 3c. Subsequently, the SiO₂ layer 73, the Si₃N₄ layer 74, and the SiO₂ layer 75 are removed so as to expose the Si surface of the bottom portion of the Si pillar 3c above the SiO₂ layer 72, to form a SiO₂ layer 73a, a Si₃N₄ layer 74a, and a SiO₂ layer 75a. Subsequently, a WSi layer 77 is formed so as to be in contact with the exposed Si surface of the Si pillar 3c, surround the Si pillar 3c, extend in a horizontal direction, and contain a donor impurity. Subsequently, a heat treatment is performed to diffuse the donor impurity within the WSi layer into the Si pillar 3c, to form an N⁺ layer 78.

Subsequently, as illustrated in FIGS. 5CA to 5CC, a SiO₂ layer 80 is formed in a region around the Si pillar 3c so as to have an upper surface positioned higher than the upper surface of the WSi layer 77. Subsequently, a Si₃N₄ layer 81 is formed in a region around the Si pillar 3c so as to have an upper surface positioned at a level corresponding to an intermediate portion of the Si pillar 3c. Subsequently, a resist layer (not shown) is formed; as in FIGS. 1GA to 1GC, the HF ion diffusion process using the resist layer is performed, to expose the Si surface of a portion of the circumferential portion of the Si pillar 3c. As a result, the SiO₂ layer 73a, the Si₃N₄ layer 74a, and the SiO₂ layer 75a are divided to form, in the lower portion, a SiO₂ layer 73b, a Si₃N₄ layer 74b, and a SiO₂ layer 75b, and to form, in the upper portion, a SiO₂ layer 73c, a Si₃N₄ layer 74c, and a SiO₂ layer 75c. Subsequently, the SiO₂ layers 73a and 73b, the Si₃N₄ layers 74a, 74b, and 81, and the SiO₂ layers 75a and 75b are used as masks and the portion (having the exposed Si surface) of the Si pillar 3c is selectively oxidized to the central portion in plan view, to form a SiO₂ layer 82. This selective oxidation forms recessed portions 82a and 82b, which are disposed in the upper and lower regions of the SiO₂ layer 82 and are recessed toward the center. Subsequently, from the region around the Si pillar 3c, the Si₃N₄ layer 81, the SiO₂ layers 73a and 73b, the Si₃N₄ layers 74a and 74b, and the SiO₂ layers 75a and 75b are removed.

Figure 5D:
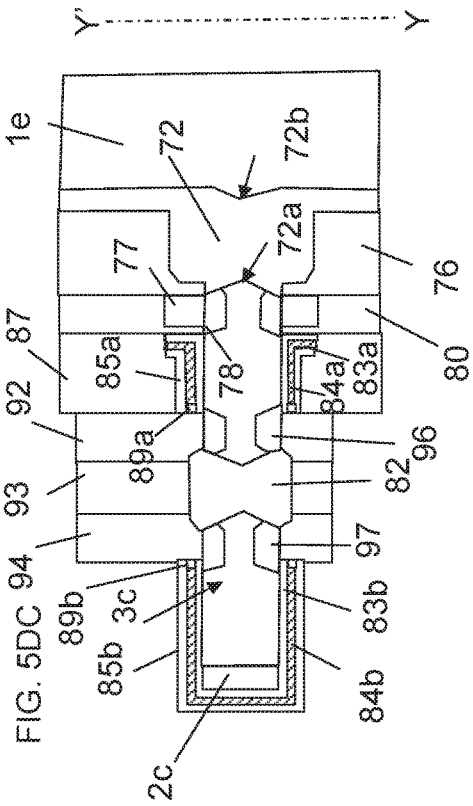
FIGS. 5DA to 5DC are a plan view and sectional structural views that illustrate the method for producing an SGT-including pillar-shaped semiconductor device according to the fifth embodiment.
Figure 5D:
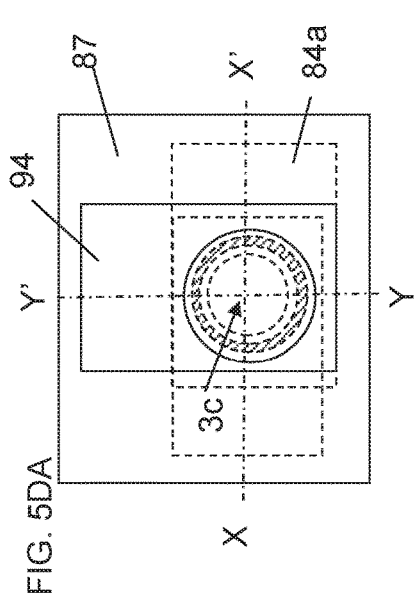
Figure 5D:
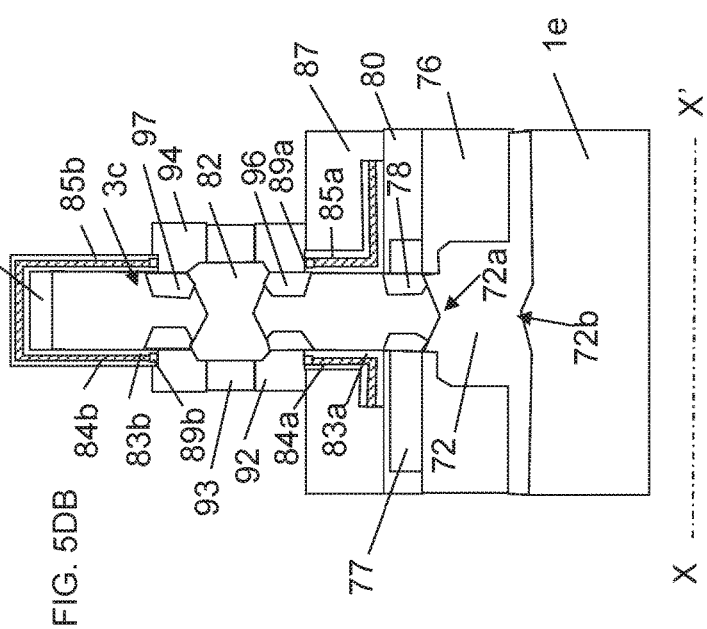

Subsequently, as illustrated in FIGS. 5DA to 5DC, a HfO₂ layer (not shown), a TiN layer (not shown), and a SiO₂ layer (not shown) are formed so as to cover the whole Si pillar 3c, to connect to the Si pillar 3c, and to extend to the SiO₂ layer 80. Subsequently, a Si₃N₄ layer 87 is formed in a region around the Si pillar 3c so as to have an upper surface positioned at a level below the SiO₂ layer 82. Subsequently, portions of the HfO₂ layer, the TiN layer, and the SiO₂ layer sandwiching the SiO₂ layer 82 are etched off to expose the Si surface of the Si pillar 3c in the height direction. This etching forms, for the lower portion of the Si pillar 3c, a HfO₂ layer 83a, a TiN layer 84a, and a SiO₂ layer 85a, and, for the upper portion of the Si pillar 3c, a HfO₂ layer 83b, a TiN layer 84b, and a SiO₂ layer 85b. Subsequently, the exposed surfaces of the TiN layers 84a and 84b are oxidized to form TiO layers 89a and 89b. Subsequently, on the Si₃N₄ layer 87 disposed in a region around the Si pillar 3c, a NiSi layer 92, a SiO₂ layer 93, and a NiSi layer 94 are stacked upward in this order: the NiSi layer 92 is in contact with the exposed Si surface of the Si pillar 3c and contains a donor impurity; the SiO₂ layer 93 is in contact with the SiO₂ layer 82; and the NiSi layer 94 is in contact with the exposed Si surface of the Si pillar 3c and contains an acceptor impurity. Subsequently, a heat treatment is performed to diffuse the donor and acceptor impurities from the NiSi layers 92 and 94 into the Si pillar 3c, to form an N⁻ layer 96 and a P⁻ layer 97 within the Si pillar 3c.

Subsequently, as illustrated in FIGS. 5EA to 5EC, a Si₃N₄ layer 98 is formed in a region around the Si pillar 3c so as to have an upper surface positioned (in the height direction) at a level corresponding to an intermediate portion of the TiN layer 84b. Subsequently, on the Si₃N₄ layer 98, a NiSi layer 100 is formed so as to be in contact with the TiN layer 84b. Subsequently, in the region around the Si pillar 3c, a SiO₂ layer 101 is formed so as to have an upper surface positioned (in the height direction) at a level lower than the top portion of the Si pillar 3c. Subsequently, the HfO₂ layer 83b, the TiN layer 84b, the SiO₂ layer 85b, and the mask material layer 2c that are positioned higher than the SiO₂ layer 101 are removed. Subsequently, an ion implantation process is used to form a P⁺ layer 103 in the top portion of the Si pillar 3c. Subsequently, a SiO₂ layer 104 is formed over the whole structure. Subsequently, a contact hole 105a is formed so as to extend from the upper surface of the SiO₂ layer 104 to the upper surface of the WSi layer 77; a contact hole 105b is formed so as to extend from the upper surface of the SiO₂ layer 104 to the upper surface of the p⁺ layer 103; a contact hole 105c is formed so as to extend from the upper surface of the SiO₂ layer 104 to the upper surface of the TiN layer 84a, and so as to be in contact with the NiSi layer 100; and a contact hole 105d is formed so as to extend from the upper surface of the SiO₂ layer 104 to the upper surface of the NiSi layer 92, and so as to be in contact with the NiSi layer 94. Subsequently, a ground wiring metal layer VSS is formed so as to connect through the contact hole 105a to the WSi layer 77; a power supply wiring metal layer VDD is formed so as to connect through the contact hole 105b to the P⁺ layer 103; an input wiring metal layer VIN is formed so as to connect through the contact hole 105c to the TiN layer 84a and the NiSi layer 100; and an output wiring metal layer VOUT is formed so as to connect through the contact hole 105d to the NiSi layers 92 and 94. As a result, a double-stacked SGT is formed in the Si pillar 3c in which the Si substrate 1e and the lower SGT are isolated from each other by the SiO₂ layer 72, and the upper and lower SGTs are isolated from each other by the SiO₂ layer 82.

The production method according to the fifth embodiment provides the following advantages.

1. The SiO₂ layer 72, which is present in the bottom portion of the Si pillar 3c and has, in the upper and lower regions, the recessed portions 72a and 72b, prevents the Si pillar 3c from collapsing in steps after formation of the Si pillar 3c, and eliminates the necessity of performing the step of forming an N well or a P well as in the first embodiment. This enables a reduction in the costs.

2. The SiO₂ layer 82, which is disposed between the upper and lower SGTs, has, in its upper and lower regions, the recessed portions 82a and 82b. This prevents the Si pillar 3c from collapsing in the subsequent steps.

Sixth Embodiment

Hereinafter, with reference to FIG. 6AA to FIG. 6CC, a method for producing an SGT according to a sixth embodiment of the present invention will be described. Among FIG. 6AA to FIG. 6CC, figures suffixed with A are plan views; figures suffixed with B are sectional structural views taken along lines X-X' in the corresponding figures suffixed with A; and figures suffixed with C are sectional structural views taken along lines Y-Y' in the corresponding figures suffixed with A. The production method according to the sixth embodiment is the same as in the steps according to the first embodiment illustrated in FIG. 1AA to FIG. 1KC except for the following differences.

The same steps as in FIG. 1AA to FIG. 1DC are performed. However, the mask material layers 2 and 4 may be formed of a material not providing the function of an oxidation-resistant mask as long as they function as etching masks. Subsequently, as illustrated in FIGS. 6AA to 6AC, a mask material layer 106 constituted by a $SiO_2$ layer, a silicon nitride ($Si_3N_4$) layer, and a $SiO_2$ layer is deposited over the whole structure. The mask material layer 106 may be formed of a material that does not provide the function of an etching mask as long as it functions as an oxidation-resistant mask. Subsequently, a resist layer 107 is formed in a region around the Si-pillar base part 5 so as to have an upper surface positioned at a level lower than the upper surface of the Si-pillar base part 5.

Subsequently, as illustrated in FIGS. 6BA to 6BC, the same process as in FIGS. 1GA to 1GC and FIGS. 2DA to 2DC is performed, to etch the mask material layer 106 that is in contact with the resist layer 107, to form a mask material layer 106a having a lower end positioned on the upper portion of the Si-pillar base part 5. Alternatively, another process may be performed as long as it achieves exposure of the bottom portion of the Si-pillar base part 5.

Figure 6A:
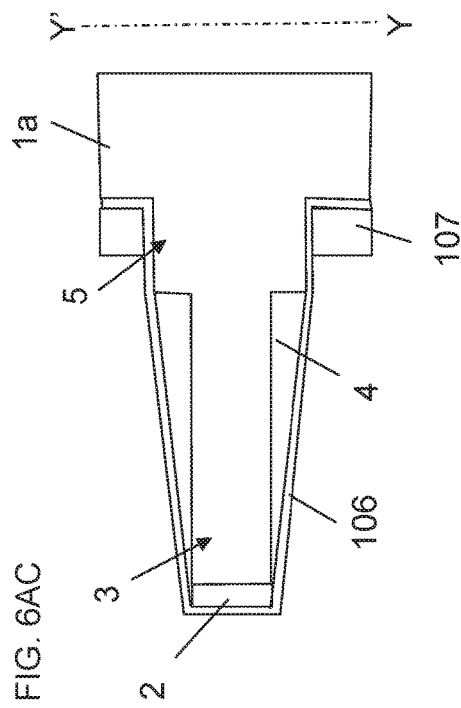
FIGS. 6AA to 6AC are a plan view and sectional structural views that illustrate a method for producing an SGT-including pillar-shaped semiconductor device according to a sixth embodiment of the present invention.
Figure 6A:
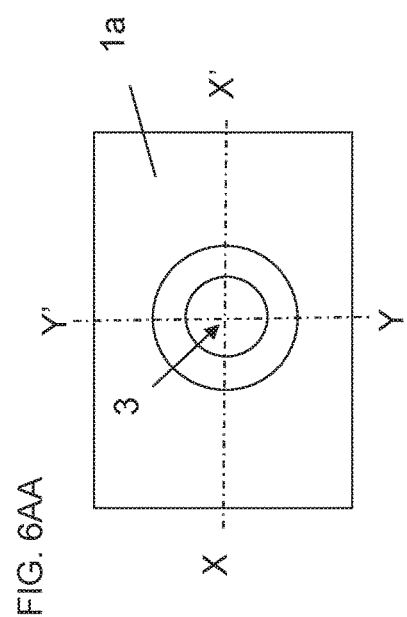
Figure 6A:
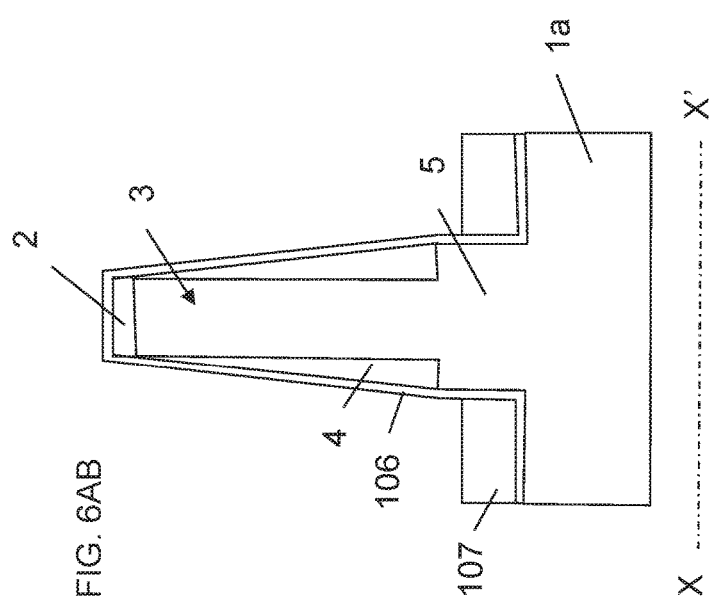
Figure 6C:
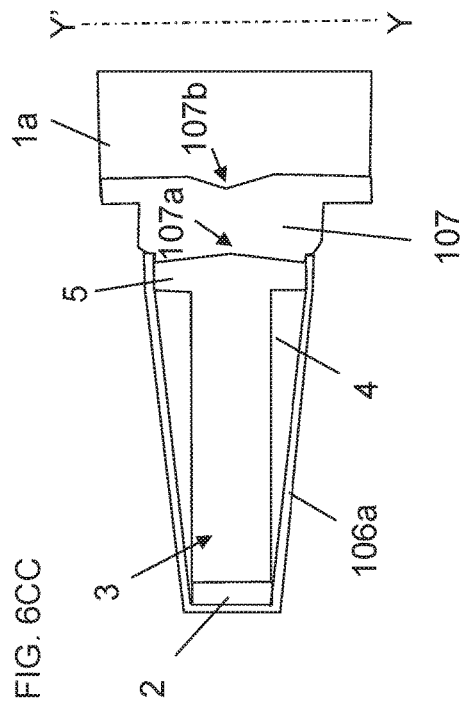
FIGS. 6CA to 6CC are a plan view and sectional structural views that illustrate the method for producing an SGT-including pillar-shaped semiconductor device according to the sixth embodiment.
Figure 6C:
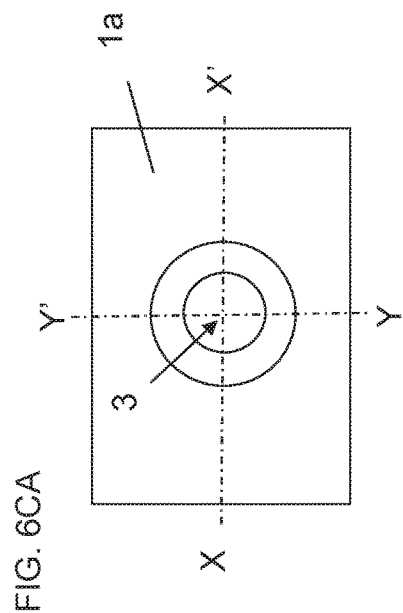
Figure 6C:
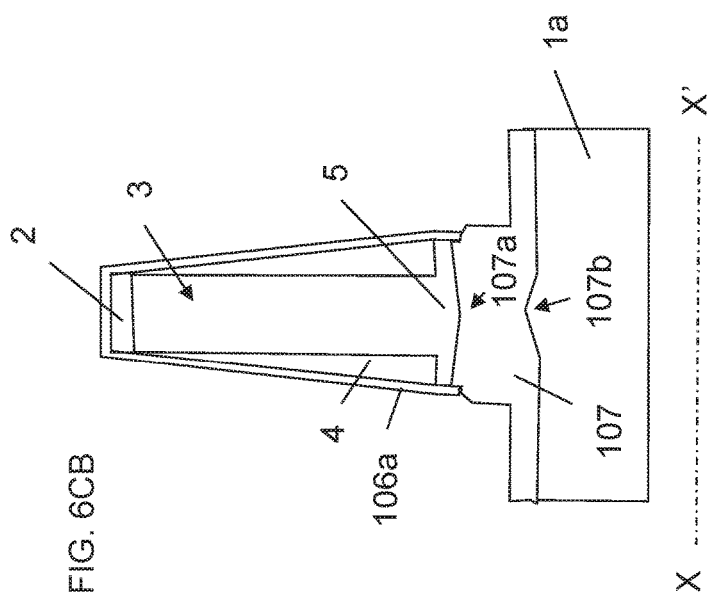

Subsequently, as illustrated in FIGS. 6CA to 6CC, the mask material layer 106a is used as an oxidation-resistant mask and the bottom portion of the Si-pillar base part 5 and the upper surface of the Si substrate 1a in a region around the Si-pillar base part 5 are oxidized to form a $SiO_2$ layer 107. This forms, in plan view, recessed portions 107a and 107b in the upper and lower regions of the $SiO_2$ layer 107 under the Si pillar 3. Subsequently, the mask material layer 106a is removed. Subsequently, the same steps as in FIG. 1EA to FIG. 1KC are performed to form an SGT on the Si substrate 1a as in FIGS. 2FA to 2FC.

The production method according to the sixth embodiment provides the following advantages.

1. In this embodiment, the $SiO_2$ layer 107, which has, in its upper and lower regions, the recessed portions 107a and 107b, is formed in the Si-pillar base part 5, which has a larger diameter than the Si pillar 3. The interface between the Si pillar 3 and the $SiO_2$ layer 107 is present within the Si-pillar base part 5 having a large diameter, so that the Si pillar 3 is less likely to collapse in the subsequent steps.

2. The $SiO_2$ layer 107 is formed so as to extend through the whole bottom portion of the Si-pillar base part 5 to the surface layer of the Si substrate 1a. As a result, the resultant SGT is insulated by the $SiO_2$ layer 107 from the Si substrate 1a. This means, as in the first embodiment, elimination of the necessity of use of SOI substrates and elimination of the necessity of formation of P wells and N wells during formation of SGT-including CMOS circuits. This enables a considerable reduction in the production costs.

3. In the first embodiment, the mask material layers 2 and 4 have both of the function of an etching mask and the function of an oxidation-resistant mask. By contrast, in this embodiment, the mask material layers 2 and 4 may have the function of an etching mask alone. This increases the degree of freedom of selecting materials for the mask material layers 2, 4, and 106a.

Seventh Embodiment

Hereinafter, with reference to FIG. 7AA to FIG. 7BC, a method for producing an SGT according to a seventh embodiment of the present invention will be described. Among FIG. 7AA to FIG. 7BC, figures suffixed with A are plan views; figures suffixed with B are sectional structural views taken along lines X-X' in the corresponding figures suffixed with A; and figures suffixed with C are sectional structural views taken along lines Y-Y' in the corresponding figures suffixed with A. The production method according to the seventh embodiment is the same as in the steps according to the first embodiment illustrated in FIG. 1AA to FIG. 1KC except for the following differences.

Figure 7A:
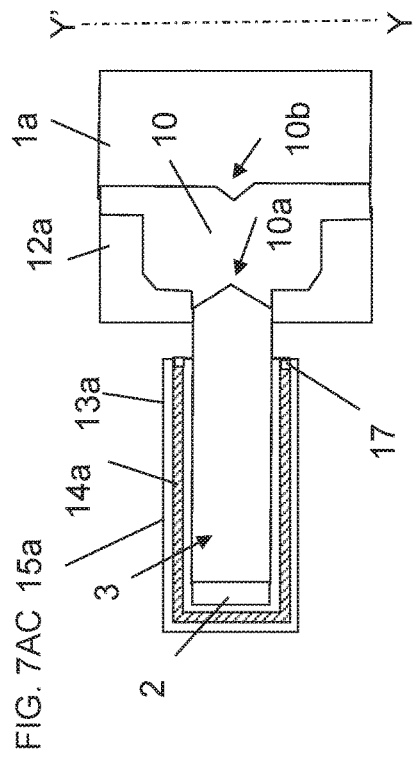
FIGS. 7AA to 7AC are a plan view and sectional structural views that illustrate a method for producing an SGT-including pillar-shaped semiconductor device according to a seventh embodiment of the present invention.
Figure 7A:
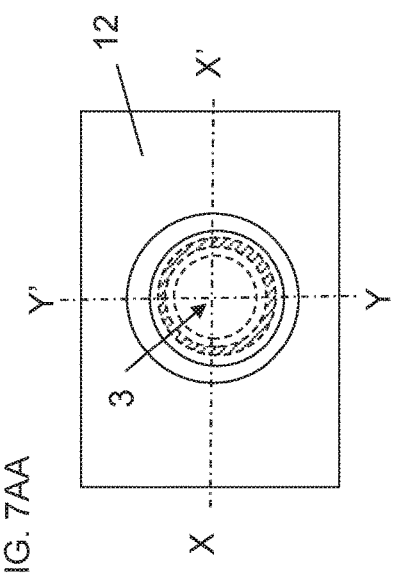
Figure 7A:
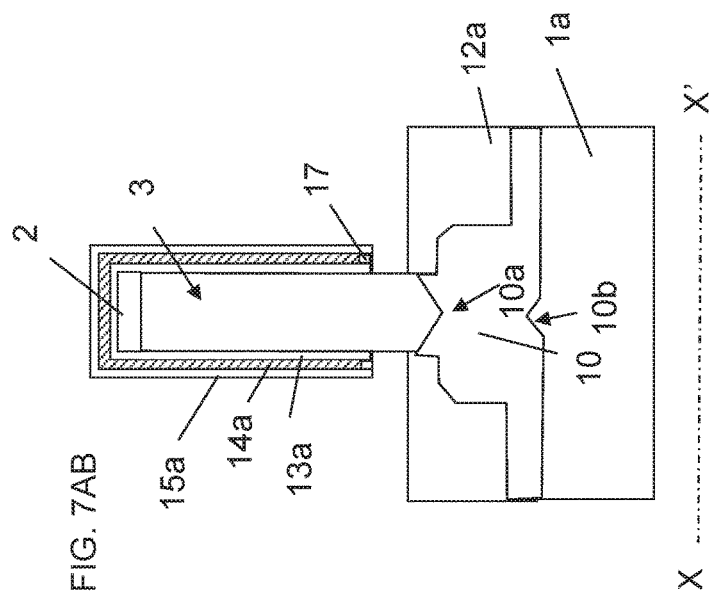
Figure 9:
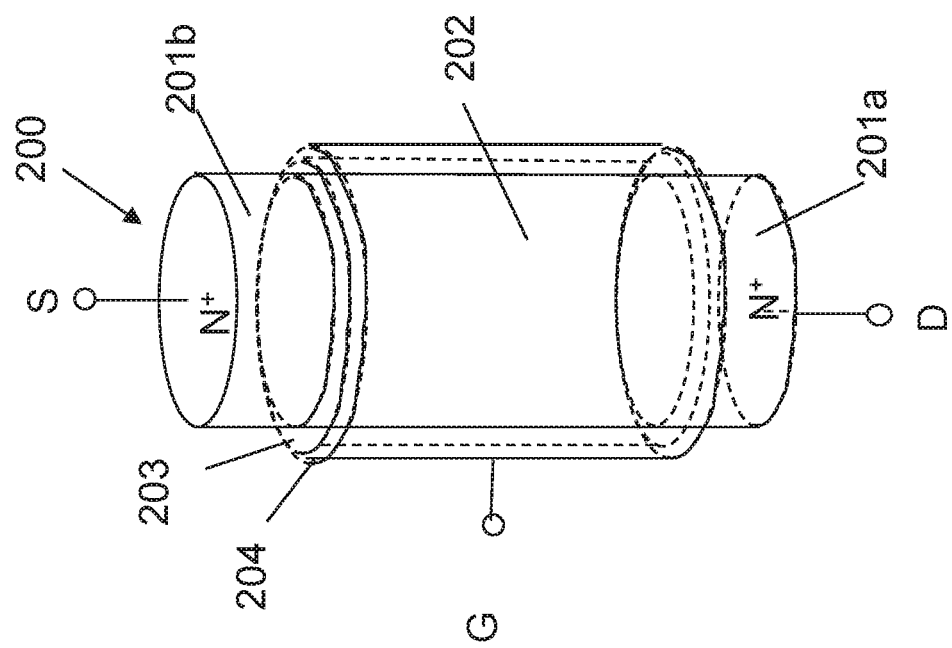
FIG. 9 is a schematic structural view of an existing SGT.

As illustrated in FIGS. 7AA to 7AC, in the step illustrated in FIGS. 1GA to 1GC in the first embodiment, a $Si_3N_4$ layer 12a is formed so as to cover the whole exposed surface of the $SiO_2$ layer 10. The $Si_3N_4$ layer 12a, a $HfO_2$ layer 13a, a TiN layer 14a, and a $SiO_2$ layer 15a are formed by the processes illustrated in FIG. 1FA to FIG. 1GC. In this step, HF ions are diffused through the resist layer 16, to etch off the $SiO_2$ layer 15 that is in contact with the resist layer 16.

Subsequently, as illustrated in FIGS. 7BA to 7BC, a NiSi layer 19a containing a donor impurity is formed so as to surround the Si pillar 3. In this case, a Ni layer (not shown) is formed over or under a poly-Si layer containing a donor impurity (not shown) so as to be disposed, in plan view, in a region around the $SiO_2$ layer 15a; subsequently, a heat treatment is performed such that the poly-Si layer is turned into silicide and its inner side surfaces protrude to be in contact with the side surface of the Si pillar 3, to thereby form a NiSi layer 19aa. Subsequently, a heat treatment is performed to make the donor impurity within the NiSi layer 19a diffuse into the Si pillar 3 to form an $N^+$ layer 20aa. In this case, the whole exposed surfaces of the $SiO_2$ layer 10 in the region around the Si pillar 3 are covered by the $Si_3N_4$ layer 12a having a smaller diffusion coefficient for the donor impurity than the $SiO_2$ layer 10; as a result, diffusion of the donor impurity within the NiSi layer 19a into the $Si_3N_4$ layer 12a is suppressed, to thereby form a high-concentration $N^-$ layer 20aa within the Si pillar 3. In this case, the $Si_3N_4$ layer 12a has both of a function of an etching block layer against the resist layer 16 containing HF ions, and a function of a barrier insulating layer that prevents diffusion of the donor impurity from the NiSi layer 19aa. Subsequently, the steps in FIG. 1IA to FIG. 1KC are performed to thereby form an SGT disposed on the Si substrate 1a, and isolated from the Si substrate 1a by the $SiO_2$ layer 10.

The production method according to the seventh embodiment provides the following advantages.

1. In FIGS. 1HA to 1HC in the first embodiment, the top portion of the $SiO_2$ layer 10 is not covered by the $Si_3N_4$ layer 12 and is in contact with the NiSi layer 19. A heat treatment performed in this state causes the donor impurity within the NiSi layer 19 to diffuse into the Si pillar 3, and to diffuse also into the $SiO_2$ layer 10 but in a smaller amount than into the Si pillar. The $SiO_2$ layer 10's effect of drawing the donor impurity from the NiSi layer 19 causes a decrease in the donor impurity concentration of the $N^+$ layer 20. This results in an increase in the series resistance of the source or drain of the SGT, which is degradation of transistor characteristics of the SGT. By contrast, in this embodiment, the $Si_3N_4$ layer 12a is formed so as to cover the whole exposed surfaces of the SiO$_2$ layer 10, so that the SiO$_2$ layer 10 is not in contact with the NiSi layer 19aa. The Si$_3$N$_4$ layer 12a functions as a barrier layer against the SiO$_2$ layer 10's effect of drawing the donor impurity from the NiSi layer 19a. This prevents the decrease in the donor impurity concentration in the N$^-$ layer 20aa. This prevents the increase in the series resistance of the source or drain of the SGT, and the resultant degradation of the transistor characteristics of the SGT.

2. The Si$_3$N$_4$ layer 12a has, in addition to the function of a barrier layer, another function of an etching block layer against the resist layer 16 containing HF ions. Thus, the Si$_3$N$_4$ layer 12a prevents degradation of the transistor characteristics of the SGT, and facilitates formation of the NiSi layer 19aa, which is a wiring conductor layer connecting to the N$^-$ layer 20aa.

Eighth Embodiment

Hereinafter, with reference to FIG. 8AA to FIG. 8BC, a method for producing an SGT according to an eighth embodiment of the present invention will be described. Among FIG. 8AA to FIG. 8BC, figures suffixed with A are plan views; figures suffixed with B are sectional structural views taken along lines X-X' in the corresponding figures suffixed with A; and figures suffixed with C are sectional structural views taken along lines Y-Y' in the corresponding figures suffixed with A. The production method according to the eighth embodiment is the same as in the steps according to the first embodiment illustrated in FIG. 1AA to FIG. 1KC except for the following differences.

As illustrated in FIGS. 8AA to 8AC, in the step illustrated in FIGS. 1JA to 1JC of the first embodiment, before formation of the N$^+$ layer 25, a SiO$_2$ layer 24a is formed on the SiO$_2$ layer 24 disposed in a region around the Si pillar 3, and on the upper end portions of the HfO$_2$ layer 13a, the TiN layer 14a, and the SiO$_2$ layer 15a.

Subsequently, as illustrated in FIGS. 8BA to 8BC, in the step illustrated in FIGS. 1KA to 1KC of the first embodiment, the contact holes 28a, 28b, and 28c are formed; subsequently, on the bottom portions of the contact holes and the SiO$_2$ layer 27, a Ni layer (not shown) is formed by vapor deposition, for example. Subsequently, a heat treatment is performed to form, in the bottom portion of the Si pillar 3, silicide from the NiSi layer 19 into the Si pillar 3 to thereby form, within the Si pillar 3, a NiSi layer 20b and an N$^+$ layer 20a due to the donor impurity pushed out from the NiSi layer 20b. Similarly, silicide is formed between the Ni layer formed in the bottom portion of the contact hole 28b and Si in the top portion of the Si pillar 3, to thereby form, in the top portion of the Si pillar 3, a NiSi layer 25b and an N$^+$ layer 25a due to the donor impurity pushed out from the NiSi layer 25b. Subsequently, the Ni layer on the SiO$_2$ layer 27 is removed. Subsequently, as in the first embodiment, the wiring metal layers MS, MD, and MG are formed. Incidentally, in plan view, the whole Si pillar 3 is turned into silicide to form the NiSi layers 20b and 25b.

Alternatively, instead of the NiSi layer 19, a layer of a material having a higher silicide formation temperature than NiSi, such as a tungsten silicide (WSi) layer, may be employed, so that the heat treatment performed in the step to the formation of the NiSi layer 25b does not cause excessive formation of silicide into the Si pillar 3.

The production method according to the eighth embodiment provides the following advantages.

As illustrated in FIGS. 8BA to 8BC, in the final step, the NiSi layer 20b is formed between the bottom portion of the Si pillar 3 and the SiO$_2$ layer 10. In general, stacked layers having different stress coefficients tend to separate from each other. By contrast, in this embodiment, the recessed portions bond together the Si pillar 3 and the NiSi layer 20b, and the NiSi layer 20b and the SiO$_2$ layer 10, so that separation is less likely to occur. Instead of the NiSi layer 19 in the lower portion, a layer of a material having a higher silicide formation temperature (for example, a WSi layer) than the NiSi layer 25b in the upper portion may be employed, so that formation of silicide, which causes separation of the Si pillar 3, is achieved while the Si pillar 3 is surrounded by support elements such as the Si$_3$N$_4$ layer 21 and the SiO$_2$ layer 24. This enables a further decrease in the probability of separation during the production. Incidentally, the structure of this embodiment and the production method for this structure are also applicable to other embodiments.

The first, second, third, sixth, seventh, and eighth embodiments have been described with examples of single-SGTs. The fourth and fifth embodiments have been described with examples of SGT-including CMOS inverter circuits. However, these configurations described in the embodiments are also applicable to, instead of the single-SGTs or CMOS inverter circuits, other SGT-including circuits.

The first embodiment has been described with the example in which the first mask material layer 2 has a bilayer structure of a Si$_3$N$_4$ layer and a SiO$_2$ layer. Alternatively, another structure may be employed in which a thin SiO$_2$ layer is disposed between a Si$_3$N$_4$ layer and a Si substrate. The first mask material layer 2 may be constituted by a single or plural layers of other materials as long as it has the function of an etching mask during etching of the Si substrate 1, and the function of an oxidation-resistant mask during oxidation for forming the SiO$_2$ layer 10. The same applies to other embodiments according to the present invention.

The first embodiment has been described with the example in which the second mask material layer 4 has a trilayer structure constituted by a SiO$_2$ layer, a Si$_3$N$_4$ layer, and a SiO$_2$ layer. Alternatively, the second mask material layer 4 may be constituted by a single or plural layers of other materials as long as it has the function of an etching mask during etching of the Si substrate 1a, and the function of an oxidation-resistant mask during oxidation for forming the SiO$_2$ layer 10. The same applies to other embodiments according to the present invention.

In the first embodiment, in the step illustrated in FIGS. 1FA to 1FC, the mask material layer 4 is completely removed. Alternatively, the SiO$_2$ layer constituting the mask material layer 4 may be left on the side surface of the Si pillar 3, and this SiO$_2$ layer may be used as a protective film to prevent contamination of the surface of the Si pillar 3 during formation of the Si$_3$N$_4$ layer 12. Alternatively, before formation of the Si$_3$N$_4$ layer 12, for example, an ALD process may be performed such that a SiO$_2$ layer or a thin insulating material layer not etched by HF ions is formed so as to cover the whole structure, and the layer is removed after formation of the Si$_3$N$_4$ layer 12, to thereby prevent contamination of the surface of the Si pillar 3 during formation of the Si$_3$N$_4$ layer 12. The same applies to other embodiments according to the present invention.

In the first embodiment, in the step illustrated in FIGS. 1GA to 1GC, HF gas is fed to the whole structure; and heating or the like is performed to generate HF ions and to diffuse the HF ions through the resist layer 16, to thereby etch the SiO$_2$ layer 15 that is in contact with the resist layer 16. However, instead of this process, another process may be employed as long as it enables exposure of the Si surface of the bottom portion of the Si pillar 3. Alternatively, instead of feeding HF gas to the resist layer 16, a resist layer 16 or another material layer formed so as to contain HF ions may be used for exposing the Si surface of the bottom portion of the Si pillar 3. The same applies to other embodiments according to the present invention.

The second embodiment has been described with the example in which the mask material layer has a trilayer structure constituted by the $SiO_2$ layer 32a, the $Si_3N_4$ layer 33a, and the $SiO_2$ layer 34a. Alternatively, the mask material layer may be constituted by a single or plural layers of other materials as long as it has the function of an oxidation-resistant mask during oxidation for forming the $SiO_2$ layer 36.

In FIGS. 1GA to 1GC, at least one of the $SiO_2$ layer 15a and the TiN layer 14a is used as a mask and the $HfO_2$ layer 13 is etched to form the $HfO_2$ layer 13a; and the exposed surface layer of the TiN layer 14a is oxidized to form the titanium oxide (TiO) layer 17. This formation of the TiO layer 17 may be performed before etching of the $HfO_2$ layer 13a. Another process may be performed to form an insulating layer on the end surface of the TiO layer 17. The same applies to other embodiments according to the present invention.

In the second embodiment, before formation of the oxidation-resistant mask including the $SiO_2$ layer 32a, the $Si_3N_4$ layer 33a, and the $SiO_2$ layer 34a, the mask material layer 4 is removed. Alternatively, the mask material layer 4 may be left. Alternatively, the mask material layer 2 may be removed.

In the third embodiment, the height Lh of the $SiO_2$ layer 2b is changed, to thereby obtain a desired diameter Ld (in plan view) of the Si-pillar base part 31a surrounding the Si pillar 3a. Alternatively, the height of the $Si_3N_4$ layer 2a, or both of the height of the $Si_3N_4$ layer 2a and the height of the $SiO_2$ layer 2b may be changed, to thereby obtain a desired diameter Ld of the Si-pillar base part 31a.

In the third embodiment, as illustrated in FIGS. 3DA to 3DC, in order to remove the $SiO_2$ layer 2b, a $Si_3N_4$ layer (not shown) and a $SiO_2$ layer (not shown) are deposited over the whole structure, and subsequently a CMP (Chemical Mechanical Polishing) process is performed to polish the whole structure down to the level of the upper surface of the $Si_3N_4$ layer 2a, to thereby form the $Si_3N_4$ layer 39 and the $SiO_2$ layer 40. Instead of this process of removing the $SiO_2$ layer 2b, another process may be employed as long as it achieves removal of the $SiO_2$ layer 2b. Alternatively, when the $SiO_2$ layer 2b has a height Lh that does not cause a problem such as collapse of the Si pillar 3a, the $SiO_2$ layer 2b is not necessarily removed. In this case, the same step as in the first embodiment may be employed to obtain a desired diameter Ld of the Si-pillar base part.

In the sixth embodiment, as illustrated in FIGS. 6AA to 6AC, the mask material layer 106 constituted by a $SiO_2$ layer, a $Si_3N_4$ layer, and a $SiO_2$ layer is deposited over the whole structure. Alternatively, the mask material layer 106 may be constituted by a single or plural layers of other materials as long as it has the function of an oxidation-resistant mask against oxidation for forming the $SiO_2$ layer 107.

The second and sixth embodiments have a feature of leaving the top portions of the Si-pillar base parts 31 and 5 on the $SiO_2$ layers 36 and 107. In these left top portions of the Si-pillar base parts 31 and 5, impurity regions containing donor or acceptor impurity atoms and serving as the source or drain of the SGTs may be formed in contact with the Si pillars 3a and 3. In this case, it is no longer necessary to form the NiSi layer 19 and the $N^+$ layer 20 in FIGS. 2FA to 2FC.

The source wiring metal layers MS are formed so as to connect, through the contact holes formed above the left top portions of the Si-pillar base parts 31 and 5, to the impurity regions in the left top portions of the Si-pillar base parts 31 and 5. Over or within the left top portions of the Si-pillar base parts 31 and 5, a single or plural semiconductor layers containing metal, alloy, or donor or acceptor impurity atoms may be formed. It is obvious that the same applies to formation of other circuits including CMOS inverter circuits.

The first embodiment has been described with the case where the first mask material layer 2 is circular in plan view; however, the first mask material layer 2 may be rectangular or elliptical. The same applies to other embodiments according to the present invention.

The first embodiment has been described with the example in which a single Si pillar 3 is formed on the Si-pillar base part 4. Alternatively, a plurality of Si-pillar base parts and Si pillars may be formed on the Si substrate 1a to form an SGT circuit. In this case, a Si base part that continuously extends between the Si-pillar bases is formed; on this Si base part, a $SiO_2$ layer 10 is formed and a $SiO_2$ layer is formed. Subsequently, on this $SiO_2$ layer, wiring conductor layers of SGTs can be formed. The fourth embodiment has been described with the example in which two Si pillars 3ba and 3bb are arranged on the Si-pillar base part 41. Alternatively, three or more Si pillars may be arranged on the Si-pillar base part 41. On a Si substrate, SGTs according to the first embodiment and the fourth embodiment may be formed in combination. Not only in the case where Si pillars are arranged in a straight line, but also in cases where Si pillars are arranged in another configuration such as an L shape or a T shape, a plurality of Si pillars may be arranged on the Si-pillar base part 41. The same applies to other embodiments according to the present invention.

In the first embodiment, the $N^+$ layer 20 is formed at the stage illustrated in FIGS. 1IA to 1IC. Alternatively, this $N^+$ layer 20 may be formed by the end of the steps for producing the SGT circuit. In a case where, instead of the NiSi layer 19, a single-crystal semiconductor layer containing a donor or acceptor impurity is formed, the single-crystal semiconductor layer itself serves as a source-or-drain impurity layer; thus, the $N^+$ layer 20 may be omitted or may be formed as a thin surface layer on the side surface of the Si pillar 3. The $N^+$ layer 20 may be formed on the outer circumferential side surface of the Si pillar 3, or may be formed so as to occupy the whole section in plan view. The same applies to other embodiments according to the present invention.

The vertical NAND-type flash memory circuit includes a plurality of memory cells stacked in the vertical direction, the plurality of memory cells each including a semiconductor pillar as the channel and including, around the semiconductor pillar, a tunnel oxide layer, a charge storage layer, an interlayer insulating layer, and a control conductor layer. Semiconductor pillars at both ends of the memory cells include a source line impurity layer corresponding to a source and a bit line impurity layer corresponding to a drain. In addition, when one of memory cells on both sides of a memory cell functions as a source, the other functions as a drain. Thus, the vertical NAND-type flash memory circuit is one of SGT circuits. Therefore, the present invention is also applicable to NAND-type flash memory circuits.

The present invention is also applicable to an SGT imaging device (for example, refer to U.S. Pat. No. 8,748, 938) including, in the bottom portion of a semiconductor pillar, an impurity region for reading signal charges; a gate insulating layer and a gate conductor layer disposed in contact with the reading impurity region and surrounding, an upper semiconductor pillar serving as the channel, the channel semiconductor pillar; a light-sensitive region disposed in the semiconductor pillar so as to be in contact with the upper portion of the channel; and an impurity region serving as a signal charge accumulation portion in the outer peripheral portion of the light-sensitive region.

In the first embodiment, a single SGT is formed in the Si pillar 3. In the fifth embodiment, two SGTs are formed in the Si pillar 3c. The present invention is also applicable to formation of a circuit in which three or more SGTs are formed in a Si pillar. The same applies to other embodiments according to the present invention.

The first embodiment has been described with the $Si_3N_4$ layers 12 and 21, which are single-material layers. Alternatively, composite-material layers may be used, for example, composite-material layers having a $SiO_2$ layer as a lower layer and a $Si_3N_4$ layer as an upper layer. Alternatively, instead of the $Si_3N_4$ layers 12 and 21, insulating material layers having small HF-ion diffusion coefficients may be used. The NiSi layers 19 and 22 may be formed by, instead of the HF ion etching process used in the first embodiment, another process. The same applies to other embodiments according to the present invention.

In the seventh embodiment, the NiSi layer 19aa contains a donor impurity. Alternatively, the NiSi layer 19aa may contain an acceptor impurity. In the seventh embodiment, the $Si_3N_4$ layer 12a covering the exposed surface of the $SiO_2$ layer 10 is used as a barrier layer for protecting the $SiO_2$ layer 10 from the impurity diffusing from the NiSi layer 19aa. Instead of the $Si_3N_4$ layer 12a, another material layer may be used that has a smaller diffusion coefficient for the impurity contained in the NiSi layer 19aa than the $SiO_2$ layer 10. In the case of forming, on the $SiO_2$ layer 10, in addition to the Si pillar 3 having, in its lower portion, an $N^-$ layer containing a donor impurity, another Si pillar having, in its lower portion, a layer containing another impurity different from the impurity (for example, a $P^-$ layer), it is necessary to form a NiSi layer containing the different impurity (for example, an acceptor impurity) in addition to the NiSi layer 19aa; a single barrier layer protects the $SiO_2$ layer 10 from the impurities diffusing from both of the NiSi layers. In this case, the barrier layer is preferably a material layer having smaller diffusion coefficients for both of the impurities than the $SiO_2$ layer 10. Similarly, in the case of forming a plurality of Si pillars on the $SiO_2$ layer 10, a material layer that has smaller diffusion coefficients for all the impurities contained in the impurity layers formed in the lower portions of the Si pillars than the $SiO_2$ layer 10 may be used as a common barrier layer. In the case of employing, instead of the Si pillar 3, another semiconductor pillar, the $SiO_2$ layer 10 is preferably replaced by another insulating layer such as an oxide insulating layer of the semiconductor. In this case, the barrier layer is formed as a material layer that has a smaller diffusion coefficient for the impurity contained in the NiSi layer 19aa than the insulating layer. This barrier layer is formed between a wiring material layer (the NiSi layer 19aa in the seventh embodiment) and an oxide insulating layer (the $SiO_2$ layer 10 in the seventh embodiment) to thereby provide the same advantages as in the seventh embodiment. The same applies to other embodiments according to the present invention.

In the seventh embodiment, the Ni layer (not shown) is formed over or under the poly-Si layer (not shown) containing a donor impurity so as to be disposed, in plan view, in a region around the $SiO_2$ layer 15a; subsequently, a heat treatment is performed to turn the poly-Si layer into silicide such that its inner side surfaces protrude to and in contact with the side surface of the Si pillar 3 to thereby form the NiSi layer 19aa. This process of forming the NiSi layer is also applicable to other embodiments according to the present invention.

In the seventh embodiment, the $Si_3N_4$ layer 12a has a function of a barrier layer against diffusion of the impurity from the NiSi layer 19aa to the $SiO_2$ layer 10, and a function of an etching block layer against etching by HF ions contained in the resist layer 16. Alternatively, the $Si_3N_4$ layer 12a may be replaced by another material layer that has a function of a barrier layer against diffusion of the impurity to the $SiO_2$ layer 10, and a function of an etching block layer against etching by HF ions contained in the resist layer 16. Alternatively, in the case of employing another etching process not using HF ions, the $SiO_2$ layer 15a and the $Si_3N_4$ layer 12a are preferably replaced by material layers suitable for the etching process. The same is also applicable to other embodiments according to the present invention.

The above-described embodiments have been described with examples in which the semiconductor regions such as the channel, the source, and the drain in the semiconductor pillar are formed of Si (silicon). However, this is not limiting, and the technical idea of the present invention is also applicable to pillar-shaped semiconductor devices in which a Si-containing semiconductor material such as SiGe or a non-Si semiconductor material is partially or entirely employed.

In the first embodiment, the gate conductive layer is constituted by the TiN layer 14a. However, this is not limiting, and the gate conductive layer may be formed of another metal material. The gate conductive layer may have a multilayer structure constituted by a metal layer and, for example, a poly-Si layer. The same is similarly applicable to other embodiments according to the present invention.

In the first embodiment, the TiN gate conductor layer is formed by the gate first process; alternatively, the TiN gate conductor layer may be formed by the gate last process. The same is similarly applicable to other embodiments according to the present invention.

The first embodiment has been described with the SGT in which the $N^+$ layers 20 and 21 serving as the source and the drain are constituted by impurity layers containing the same donor impurity. Alternatively, a tunnel effect SGT may be provided in which one of the layers is an $N^+$ layer and the other is a $P^+$ layer. The same is similarly applicable to other embodiments according to the present invention.

The fifth embodiment has been described with the example in which the gate conductor layers of the SGTs formed in the upper and lower portions of the Si pillar 3c are formed as layers of the same material that are the TiN layers 84a and 84b. Alternatively, in the case of an N-channel SGT and a P-channel SGT, the gate conductive layers may be formed of different materials. The same is also applicable to other embodiments according to the present invention.

In the eighth embodiment, the NiSi layers 20b and 25b and the $N^+$ layers 20a and 25a, which are alloy layers formed in upper and lower portions of the Si pillar, may be replaced by other alloy layers that contain semiconductor atoms, metal atoms, and a donor or acceptor impurity. The combinations of semiconductor atoms, metal atoms, and a donor or acceptor impurity contained in the upper and lower alloy layers may be different between the upper and lower alloy layers. The same is similarly applicable to other embodiments according to the present invention.

In the eighth embodiment, the contact hole 28b is formed in the upper surface of the Si pillar 3; alternatively, the contact hole 28b may be formed so as to surround the top portion of the Si pillar 3 and have a bottom portion on the SiO$_2$ layer 24a, and, subsequently, the exposed top portion of the Si pillar 3 may be covered with a Ni layer and a heat treatment may be performed to form a NiSi layer 25b and an N$^+$ layer 25a. In this case, the SiO$_2$ layer 24a is preferably replaced by a layer, such as a Si$_3$N$_4$ layer, that provides a strong etching block effect during formation of the contact hole 28b within the SiO$_2$ layer 27. Alternatively, another material layer may be used that similarly provides the etching block effect. The same is similarly applicable to other embodiments according to the present invention.

In the eighth embodiment, the NiSi layer 25b and the N$^+$ layer 25a may be formed by the following process: a contact hole 28b is formed on the SiO$_2$ layer 24a so as to have an outer periphery surrounding the Si pillar 3 in plan view and have a larger width than the Si pillar 3; a NiSi layer containing a donor impurity is formed within the contact hole so as to cover at least the side surface of the top portion of the Si pillar 3; and heating is performed to form a NiSi layer 25b in the top portion of the Si pillar 3 and to form an N$^+$ layer 25a due to diffusion of the donor impurity pushed out from the NiSi layer 25b. The NiSi layer containing a donor impurity may be replaced by an alloy layer that contains a donor or acceptor impurity, metal atoms, and semiconductor atoms that are different from the semiconductor atoms constituting the semiconductor pillar. In this case, instead of the NiSi layer 25b, an alloy layer containing the metal atoms and semiconductor atoms constituting the semiconductor pillar is formed. Incidentally, this alloy layer may contain the above-described semiconductor atoms different from the semiconductor atoms constituting the semiconductor pillar. The descriptions in this paragraph are similarly applicable to other embodiments according to the present invention.

In the eighth embodiment, in order to form the NiSi layer 20b and the N$^+$ layer 20a, the NiSi layer 19 containing a donor impurity is used; alternatively, a metal layer containing a donor or acceptor impurity or a material layer that contains a donor or acceptor impurity and metal and that substantially does not contain semiconductor atoms may be used. The same is also applicable to the above-described formation of the NiSi layer 25b and the N$^+$ layer 25a from the NiSi layer containing a donor impurity. The same is similarly applicable to other embodiments according to the present invention.

In the first embodiment, the N$^+$ layers 20 and 25 are formed so as to be in contact with the top and bottom of the Si pillar 3 and formed of the same Si material as in the Si pillar 3; alternatively, the impurity layers may be formed of another semiconductor material. In the first embodiment, as illustrated in FIGS. 1HA to 1HC, the N$^+$ layer 20 is formed in the following manner: the nickel silicide (NiSi) layer 19 containing, for example, a donor impurity is formed on the Si$_3$N$_4$ layer 12 so as to surround the Si pillar 3; subsequently, a heat treatment is performed to diffuse the donor impurity from the NiSi layer 19 into the Si pillar 3. Such a material source containing an impurity is not limited to the NiSi layer, and may be an alloy of another material, or a semiconductor layer. The N$^+$ layer 20 may be formed in the following manner: a Ni layer is formed over or under a poly-Si layer containing a donor impurity; subsequently, a heat treatment is performed to form silicide during which the donor impurity is diffused from the NiSi layer 19 into the Si pillar 3. Instead of the Ni layer, another metal layer (for example, Co or W) may be employed. Another process may be employed to form an impurity layer so as to be in contact with the lower portion of the Si pillar 3. The same is also applicable to other embodiments according to the present invention.

The first embodiment has been described with the example in which the mask material layer 4 is formed on the side surface of the Si pillar 3; the mask material layer 4 may be left on the side surface or the upper surface of the mask material layer 2. The mask material layer 4 covers the whole side surface of the Si pillar 3. The mask material layer 4 may be formed in the following manner: a mask material film is formed by a CVD process so as to cover the entirety of Si pillar 3; the whole structure is then etched by an RIE process so as to leave the mask material layer 4 on the side surface of the Si pillar 3. Alternatively, the mask material layer 4 may be formed in the following manner: a mask material film is deposited over the whole structure; subsequently, the film is planarized by a CMP process so as to have a top portion positioned at the level of the upper surface of the mask material layer 2; subsequently, an RIE process is performed to etch-back the mask material film down to the top portion of the Si pillar 3; subsequently, the second mask material layer is formed so as to surround the mask material layer 2; subsequently, the mask material film is etched by an RIE process through the second mask material layer serving as mask. The mask material layer 4 may be formed by another process. The same is also applicable to other embodiments according to the present invention.

In the first embodiment, the Si pillar 3 is formed directly on the recessed portion; alternatively, at least one other layer may be formed between the Si pillar 3 and the recessed portion, the at least one other layer each having a recessed portion in the upper region and a protruding portion in the lower region. The same is also applicable to other embodiments according to the present invention.

The present invention encompasses various embodiments and various modifications without departing from the broad spirit and scope of the present invention. The above-described embodiments are provided for understanding of examples of the present invention and do not limit the scope of the present invention. Features of the above-described examples and modifications can be appropriately combined. The above-described embodiments from which some optional features have been eliminated depending on the need still fall within the spirit and scope of the present invention.

Methods for producing a pillar-shaped semiconductor device according to the present invention provide, at lower costs, semiconductor devices having high degrees of integration.

What is claimed is:

1. A method for producing a pillar-shaped semiconductor device including a semiconductor pillar, first and second impurity regions in contact with lower and upper portions of the semiconductor pillar, a gate insulating layer surrounding the semiconductor pillar between the first and second impurity regions in a vertical direction, and a gate conductor layer surrounding the gate insulating layer, the method comprising:

providing a structure on a semiconductor substrate, the structure including a semiconductor-pillar base part, the semiconductor pillar on the semiconductor-pillar base part and positioned, in plan view, within the semiconductor-pillar base part, and an oxidation-resistant mask material layer surrounding a top portion and a side surface of the semiconductor pillar;

using the oxidation-resistant mask material layer as an oxidation-resistant mask, and oxidizing an entirety of the semiconductor-pillar base part, in plan view, and a surface layer portion of the semiconductor substrate in a region around the semiconductor-pillar base part, to form an oxide insulating layer including, in its upper and lower regions, recessed portions disposed, in plan view, within the semiconductor pillar;

forming a cover insulating layer so as to cover an exposed surface of the oxide insulating layer;

providing an exposed side surface of a lower portion of the semiconductor pillar; and forming a conductor material layer of an alloy or a semiconductor containing a first donor or acceptor impurity on the cover insulating layer so as to be in contact with the exposed side surface of the semiconductor pillar.

2. The method for producing a pillar-shaped semiconductor device according to claim 1, wherein providing a structure includes:
    forming a first mask material layer on the semiconductor substrate,
    etching the semiconductor substrate through the first mask material layer serving as an etching mask to form the semiconductor pillar,
    forming a second mask material layer surrounding a side surface of the semiconductor pillar, and
    etching the semiconductor substrate through the first mask material layer and the second mask material layer serving as etching masks to form the semiconductor-pillar base part under the semiconductor pillar.

3. The method for producing a pillar-shaped semiconductor device according to claim 2, wherein providing a structure further includes:
    independently forming the first mask material layer and the second mask material layer as a single layer of a material providing a function of an etching mask and a function of an oxidation-resistant mask, or each independently formed as a plurality of layers including, in their outermost portion, the single layer, and
    the oxidation-resistant mask material layer is constituted by the first mask material layer and the second mask material layer.

4. The method for producing a pillar-shaped semiconductor device according to claim 2, wherein providing a structure further includes a third-mask-material-layer formation step of forming the oxidation-resistant mask material layer so as to surround the semiconductor pillar with none of or at least one of the first mask material layer and the second mask material layer disposed between the oxidation-resistant mask material layer and the semiconductor pillar, and so as to surround an upper side surface of the semiconductor-pillar base part, and
    in using the oxidation-resistant mask material layer as an oxidation-resistant mask, the oxide insulating layer is formed so as to have an upper end positioned at a level lower than an upper surface of the semiconductor-pillar base part.

5. The method for producing a pillar-shaped semiconductor device according to claim 4, wherein providing a structure further includes a step of removing the first mask material layer and/or a step of removing the second mask material layer.

6. The method for producing a pillar-shaped semiconductor device according to claim 4, wherein, in the third-mask-material-layer formation step, the oxidation-resistant mask material layer is formed so as to surround the semiconductor pillar with the first mask material layer and the second mask material layer disposed between the oxidation-resistant mask material layer and the semiconductor pillar, and so as to surround the upper side surface of the semiconductor-pillar base part.

7. The method for producing a pillar-shaped semiconductor device according to claim 2, wherein the second mask material layer is formed with a predetermined thickness so as to form the semiconductor-pillar base part having a predetermined width in plan view.

8. The method for producing a pillar-shaped semiconductor device according to claim 1, wherein, providing a structure further comprising;
    forming a plurality of the semiconductor pillars on and share the semiconductor-pillar base part, and
    forming the oxidation-resistant mask material layer so as to surround top portions and side surfaces of all the semiconductor pillars.

9. The method for producing a pillar-shaped semiconductor device according to claim 8, wherein providing a structure further includes;
    forming a plurality of first mask material layers on the semiconductor substrate,
    etching the semiconductor substrate through the first mask material layers serving as etching masks to form the plurality of semiconductor pillars,
    forming a second mask material layer so as to surround side surfaces of all the semiconductor pillars, and continuously extend between adjacent ones of the semiconductor pillars, and
    etching the semiconductor substrate through the first mask material layers and the second mask material layer serving as etching masks, to form the semiconductor-pillar base part disposed under and shared by the plurality of semiconductor pillars.

10. The method for producing a pillar-shaped semiconductor device according to claim 1, further comprising a step of removing a portion of the oxidation-resistant mask material layer, the portion having a band shape having a predetermined width in a height direction, to expose a side surface of the semiconductor pillar, and
    a step of using a remaining portion of the oxidation-resistant mask material layer as an oxidation-resistant mask and oxidizing the semiconductor pillar from its exposed surface, to form an additional oxide insulating layer including, in its upper and lower regions, recessed portions within the semiconductor pillar.

11. The method for producing a pillar-shaped semiconductor device according to claim 1, further comprising forming the first impurity region in a lower portion of the semiconductor pillar by heating to diffuse the first donor or acceptor impurity from the conductor material layer to the semiconductor pillar.

12. The method for producing a pillar-shaped semiconductor device according to claim 1, wherein forming the cover insulating layer comprising forming the insulating layer to have a smaller diffusion coefficient for the first donor or acceptor impurity than the oxide insulating layer.

13. The method for producing a pillar-shaped semiconductor device according to claim 1, further comprising:
    after forming the cover insulating layer, sequentially forming the gate insulating layer, the gate conductor layer, and a first material layer so as to cover the semiconductor pillar and the cover insulating layer,
    forming, an etching material layer containing an etching material for etching the first material layer, in a region around a bottom portion of the semiconductor pillar, so as to be in contact with the first material layer, using the etching material to etch the first material layer that is in contact with the etching material layer, removing the etching material layer, etching the gate conductor layer through a remaining portion of the first material layer serving as a mask, etching the gate insulating layer through a mask that is at least one of the first material layer and the gate conductor layer, to provide an exposed side surface of the semiconductor pillar, and forming the conductor material layer on the cover insulating layer so as to be in contact with the exposed side surface of the semiconductor pillar, wherein the cover insulating layer has an etching block effect against the etching material.

14. The method for producing a pillar-shaped semiconductor device according to claim 1, wherein the conductor material layer is a first alloy layer containing first semiconductor atoms, first metal atoms, and the first donor or acceptor impurity, the method further comprises a step of performing a heat treatment to form, within the semiconductor pillar, a second alloy layer that connects to the first alloy layer, that contains second semiconductor atoms constituting the semiconductor pillar, the first metal atoms, and the first donor or acceptor impurity, and that occupies, in plan view, an outer peripheral portion or an entirety of the semiconductor pillar, and a step of performing a heat treatment to push out the first donor or acceptor impurity from the first alloy layer and the second alloy layer, to form the first impurity region within the semiconductor pillar.

15. The method for producing a pillar-shaped semiconductor device according to claim 14, further comprising a step of forming, in a top portion of the semiconductor pillar, a third impurity region containing a second donor or acceptor impurity, a step of depositing second metal atoms having a lower alloying temperature than the first metal atoms so as to be in contact with the third impurity region, and a step of performing a heat treatment to form, in a top portion of the semiconductor pillar, a third alloy layer that contains the second semiconductor atoms, the second metal atoms, and the second donor or acceptor impurity, and that occupies, in plan view, an outer peripheral portion or an entirety of the semiconductor pillar, and the second impurity region containing the second donor or acceptor impurity pushed out from the third alloy layer.

16. The method for producing a pillar-shaped semiconductor device according to claim 14, the method further comprising a step of forming a fourth alloy layer that covers at least a side surface of a top portion of the semiconductor pillar, and that contains third semiconductor atoms, second metal atoms having a lower alloying temperature than the first metal atoms, and a second donor or acceptor impurity, and a step of performing a heat treatment to form, within the semiconductor pillar, a third alloy layer that connects to the fourth alloy layer, that contains the second semiconductor atoms, the second metal atoms, and the second donor or acceptor impurity, and that occupies, in plan view, an outer peripheral portion or an entirety of the semiconductor pillar, and the second impurity region containing the second donor or acceptor impurity pushed out from the third alloy layer.

17. A pillar-shaped semiconductor device comprising:

an oxide insulating layer on a semiconductor substrate, and including recessed portions in upper and lower regions thereof;

a cover insulating layer covering an upper surface of the oxide insulating layer;

a semiconductor pillar on an upper one of the recessed portions of the oxide insulating layer, a conductor base part between the semiconductor pillar and the upper one of the recessed portions, the conductor base part comprising a single layer or a plurality of layers and of at least a semiconductor, an alloy, and a metal, the semiconductor pillar having, in plan view, a smaller width than the oxide insulating layer and the conductor base part;

a first impurity region in contact with a lower portion of the semiconductor pillar;

a conductor material layer on the cover insulating layer and connecting to the first impurity region, the conductor material comprising an alloy or a semiconductor containing a first donor or acceptor impurity;

a second impurity region in contact with the semiconductor pillar and higher than the first impurity region;

a gate insulating layer surrounding a portion of the semiconductor pillar, the portion between the first impurity region and the second impurity region in a vertical direction; and a gate conductor layer surrounding the gate insulating layer, wherein the oxide insulating layer and the conductor base part constitute a semiconductor-pillar base part on which the semiconductor pillar stands.

18. The pillar-shaped semiconductor device according to claim 17, wherein the cover insulating layer has a smaller diffusion coefficient for the first donor or acceptor impurity than the oxide insulating layer.

19. The pillar-shaped semiconductor device according to claim 17, further comprising:

a first conductor layer on the oxide insulating layer, containing first semiconductor atoms, first metal atoms, and the first donor or acceptor impurity, and occupying an outer peripheral portion or an entirety of the semiconductor pillar, wherein the first impurity region is on the first conductor layer; and a second conductor layer on the second impurity region, and containing second semiconductor atoms, second metal atoms having a lower alloying temperature than the first metal atoms, and a second donor or acceptor impurity.

20. The pillar-shaped semiconductor device according to claim 17, further comprising an additional oxide insulating layer within the semiconductor pillar, higher than the second impurity region, and including, in upper and lower regions, recessed portions, wherein the semiconductor pillar includes, in a region above the additional oxide insulating layer, a second pillar-shaped semiconductor device.

21. The pillar-shaped semiconductor device according to claim 17, further comprising:

a second oxide insulating layer horizontally connecting to the oxide insulating layer, and having second recessed portions;

a second semiconductor pillar that is formed on an upper one of the second recessed portions of the second oxide insulating layer, with a second conductor base part disposed between the second semiconductor pillar and the upper one of the second recessed portions, the second conductor base part being constituted by a single layer or a plurality of layers and formed of at least semiconductor, alloy, and metal, the second semiconductor pillar having, in plan view, a smaller width than the second oxide insulating layer and the second conductor base part;

a third impurity region in contact with a lower portion of the second semiconductor pillar;

a fourth impurity region being in contact with the second semiconductor pillar and positioned higher than the third impurity region;

a second gate insulating layer surrounding a portion of the second semiconductor pillar, the portion being positioned, in a vertical direction, between the third impurity region and the fourth impurity region; and a second gate conductor layer surrounding the second gate insulating layer, wherein the second oxide insulating layer and the second conductor base part constitute a second semiconductor-pillar base part on which the second semiconductor pillar stands.

\* \* \* \* \*